United States Patent
Yamagata et al.

(10) Patent No.: US 6,310,815 B1
(45) Date of Patent: *Oct. 30, 2001

(54) MULTI-BANK SEMICONDUCTOR MEMORY DEVICE SUITABLE FOR INTEGRATION WITH LOGIC

(75) Inventors: Tadato Yamagata; Akira Yamazaki; Shigeki Tomishima; Yoshio Yukinari; Makoto Hatakenaka; Atsushi Miyanishi, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/131,346

(22) Filed: Aug. 7, 1998

(30) Foreign Application Priority Data

Oct. 31, 1997 (JP) .................................................. 9-300734
Apr. 8, 1998 (JP) ................................................ 10-095778

(51) Int. Cl.$^7$ .................................................. G11C 8/00
(52) U.S. Cl. ........................ 365/230.03; 365/51; 365/63
(58) Field of Search ............................ 365/230.3, 51, 365/52, 63, 201

(56) References Cited

U.S. PATENT DOCUMENTS

| | | |
|---|---|---|
| 5,208,782 | 5/1993 | Sakuta et al. |
| 5,604,710 * | 2/1997 | Tomishima et al. ............ 365/230.03 |
| 5,627,792 * | 5/1997 | Tsujimoto ........................ 365/230.03 |
| 5,844,849 * | 12/1998 | Furutani ............................... 365/194 |
| 5,852,584 * | 12/1998 | Arai ................................ 365/230.03 |
| 5,883,814 * | 3/1999 | Luk et al. ............................. 364/491 |
| 5,892,730 * | 4/1999 | Sato et al. ................... 365/230.03 X |
| 5,923,580 * | 7/1999 | Takahashi .............................. 365/51 |

FOREIGN PATENT DOCUMENTS

| | | |
|---|---|---|
| 3-214669 | 9/1991 | (JP) . |
| 06068671 A | 3/1994 | (JP) . |
| 7-141856 | 6/1995 | (JP) . |
| 09161476 A | 6/1997 | (JP) . |

OTHER PUBLICATIONS

"Ultra Large Scale Integration Memory", K. Itoh, Published by Baifukan, Advanced Electronics I–9, Nov. 1994, pp. 18–21, 118, 119, 124–141, 158–161, 166–173, 182–185 (with English translation).

Notice of Ground of Rejection dated Oct. 31, 2000 with English translation.

* cited by examiner

*Primary Examiner*—Huan Hoang
(74) *Attorney, Agent, or Firm*—McDermott, Will & Emery

(57) ABSTRACT

Subbanks are arranged in four regions of a DRAM macro having a rectangular shape, bank control circuits are arranged in a prescribed region between these subbanks, and internal read/write data buses are arranged in a region different from the region where the bank control circuits are arranged. Since there is no crossing of the bank control circuits and the internal read/write data buses, the bank control circuits can be efficiently arranged to reduce the layout area. Accordingly, a semiconductor integrated circuit device including multi-bank memories which operates stably at high speed can be provided without increase of an area occupied by a chip.

23 Claims, 30 Drawing Sheets

MULTI-BANK SEMICONDUCTOR MEMORY DEVICE SUITABLE FOR INTEGRATION WITH LOGIC

BACKGROUND OF THE INVENTION

1. Field of the Invention

The present invention relates to a semiconductor integrated circuit device, and more particularly relates to a semiconductor memory device fit to mixture with logical processing circuit units such as MPU (Microprocessor), CPU (Central Processing Unit), ASIC (Application Specific Integrated Circuit) and the like, as well as a logic contained semiconductor memory device or a memory contained logical processing circuit unit in which a logical processing circuit unit and a semiconductor memory device are mixed.

2. Description of the Background Art

FIG. 39 schematically shows an entire arrangement of a processor containing DRAM (Dynamic Random Access Memory) in which a conventional DRAM and a processor are formed on the same chip. Referring to FIG. 39, the conventional processor containing DRAM is integrated on a semiconductor chip 900. The microprocessor containing DRAM includes DRAM arrays 902a, 902b, 902c and 902d respectively arranged in four regions #A, #B, #C and #D on semiconductor chip 900. Each of DRAM arrays 902a–902d includes dynamic memory cells arranged in rows and columns.

Corresponding to respective DRAM arrays 902a–902d, row decoders 903a, 903b, 903c and 903d each for selecting a row in a corresponding DRAM array, column decoders 904a, 904b, 904c and 904d each for selecting a column in a corresponding memory array, and preamplifier.write driver blocks 905a, 905b, 905c and 905d each for writing/reading of data into/from a corresponding DRAM array are provided. Preamplifier.write driver blocks 905a–905d are respectively coupled with internal read/write data buses 907a, 907b, 907c and 907d each having a width of 32 bits to 256 bits.

In a region #E between regions #A and #B and regions #C and #D, a processor (CPU) 920 which supplies and receives necessary data to and from DRAM arrays 902a–902d and executes various processings as well as a DRAM control circuit 910 which controls an access to DRAM arrays 902a–902d according to a command from processor 920 are provided.

DRAM control circuit 910 generates and sends via an internal bus 912a a control signal for controlling activation/inactivation of row decoders 903a and 903b, column decoders 904a and 904b and preamplifier.write driver blocks 905a and 905b, and an address signal for selecting a row and a column. Control circuit 910 also supplies a control signal and an address signal via an internal bus 912b to row decoders 903c and 903d, column decoders 904c and 904d, and preamplifer.write driver blocks 905c and 905d. Internal bus 912b is arranged to extend from DRAM control circuit 910 to regions #C and #D across processor 920.

Processor 920 is coupled with internal read/write data buses 907a, 907b, 907c and 907d and inputs/outputs necessary data. Internal read/write data buses 907a and 907b is coupled with processor 920 across DRAM control circuit 910.

In this processor containing DRAM, DRAM arrays 902a–902d are simultaneously driven into an active state, and data are transferred between DRAM arrays 902a–902d and processor 920 via internal read/write data buses 907a–907d. Since internal read/write data buses 907a–907d each has a sufficiently large width of, for example, 32 bits to 256 bits, data of 128 bits to 1024 bits can be transferred in one transfer cycle and a band width for data transfer can be increased. If the DRAM and the processor are discretely provided, the operating speed of the DRAM cannot follow the operating speed of the processor and high speed data transfer becomes impossible accordingly, and the operating speed of the DRAM becomes a bottleneck against processing performance of the processor. The processor containing DRAM described above aims to solve such a problem.

Particularly by integrating processor 920 and DRAM arrays 902a–902d on the same semiconductor chip 900, the bit width of internal read/write data buses 907a–907d can be increased sufficiently without limitation by external pin terminals. Further, by integrating DRAM arrays 902a–902d and processor 920 on semiconductor chip 900, interconnection line capacitance and resistance of internal read/write data buses 907a–907d can be reduced relative to those of interconnection lines on a circuit board. As a result, data can be transferred at high speed.

The processor containing DRAM shown in FIG. 39 has a single bank configuration in which DRAM arrays 902a–902d are all simultaneously activated/inactivated. Considering localization of data to which the processor makes access, a multi-bank configuration containing a plurality of banks is preferable for a high speed operation. In this case, during an access to one bank, another bank is driven from an inactive state to an active state in order to prepare for an access by the processor. Following completion of the access to the one bank, an access is made to this another bank. In the single bank configuration, RAS precharge time is necessary for activating DRAM arrays 902a–902d after precharging of the DRAM array in order to obtain necessary data again. In the multi-bank configuration, such RAS precharge time is not required and a high speed access is implemented. However, a processor containing the multi-bank DRAM has not been proposed.

The bus width of internal read/write data buses 907a–907d should be further increased in order to modify DRAM arrays 902a–902d of FIG. 39 into the multi-bank configuration. In a two-bank configuration, for example, one bank is constituted of two memory arrays. In this case, data can be only transferred simultaneously between processor 920 and two DRAM arrays. In order to implement a data transfer band width which is equal to that of the single bank configuration, the width of internal read/write data buses should be doubled. Since the doubled width of the buses increases the area occupied by interconnection lines, an efficient layout of internal circuits is required for avoiding increase of the chip area. However, such an efficient layout for preventing increase of the chip area in the multi-bank DRAM has not been proposed.

In addition, in the processor containing DRAM shown in FIG. 39, the length of internal bus 912a and that of internal bus 912b differ from each other, resulting in different signal propagation delays. The difference of the length of internal buses 912a and 912b is canceled by the difference of the length of internal read/write data buses 907a and 907b and that of buses 907c and 907d so as to obtain the same access time. However, difference of delay time in internal read/write data buses 907a–907d and difference of delay time in internal buses 912a and 912b cannot be made precisely equal to each other due to difference of parasitic capacitance of the interconnection lines or the like. Therefore, some margin is required for data access. Further, since timings of starting/stopping of internal access of the banks and timings of activating/inactivating the arrays are different, collision of data could occur when the banks are accessed in the interleaved manner.

In this case, if DRAM arrays 902*a* and 902*b* constitute one bank and DRAM arrays 902*c* and 902*d* constitute the other bank in FIG. 39, access times of those banks are different from each other and the access time is determined according to the worst case, so that a high speed access cannot be implemented. If DRAM arrays 902*a* and 902*c* constitute one bank, data access time of DRAM array 902*a* is different from that of DRAM array 902*c*. In this case, the access time is also determined according to the worst case, so that a high speed access cannot be implemented.

In the case of such a processor containing DRAM or a circuit unit in which logic and DRAM are mixed, the processor or unit is often designed on a cell base (because automatic design is used). The processor or unit is hierarchically designed utilizing the DRAM as a macro (functional block). However, a multi-bank DRAM macro having an efficient layout which is fit to mixture with a processor or logic, enables a high speed access and does not increase the occupied area has not been prepared yet.

SUMMARY OF THE INVENTION

One object of the present invention is to provide a semiconductor integrated circuit device including a multi-bank memory having a layout fit to mixture with a logical processing circuit unit.

Another object of the present invention is to provide a semiconductor integrated circuit device having a multi-bank memory which can implement a high speed access without increasing a chip area.

Still another object of the present invention is to provide a multi-bank DRAM fit to mixture with a logical processing circuit unit.

A semiconductor integrated circuit device according to the invention includes a plurality of banks arranged in a rectangular region and to which data access is made alternatively, a bank controller provided in a prescribed region among regions where the plurality of banks are arranged, for controlling at least the data access to the plurality of banks, and an internal access data transfer bus arranged in a region different from a region where the bank controller is formed in the rectangular region, and coupled with each bank for supplying and receiving data.

By placing the bank controller and the internal access data transfer bus in different regions in the rectangular region, there does not exit a region where the bank controller and the internal access data transfer bus are overlapped viewed in a planar layout, so that even if the bus width increases the bank controller can be arranged without being affected by the increased bus width. Since the bank controller can be arranged without consideration of a crossing to the internal access data transfer bus and the memory, a layout of high density and reduction of an occupied area of a chip are achieved. By placing the bank controller among the plurality of banks, distances between respective banks and the bank controller can be made equal to each other. The difference of access timing due to delay in interconnection lines can be eliminated, resulting in high speed access.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
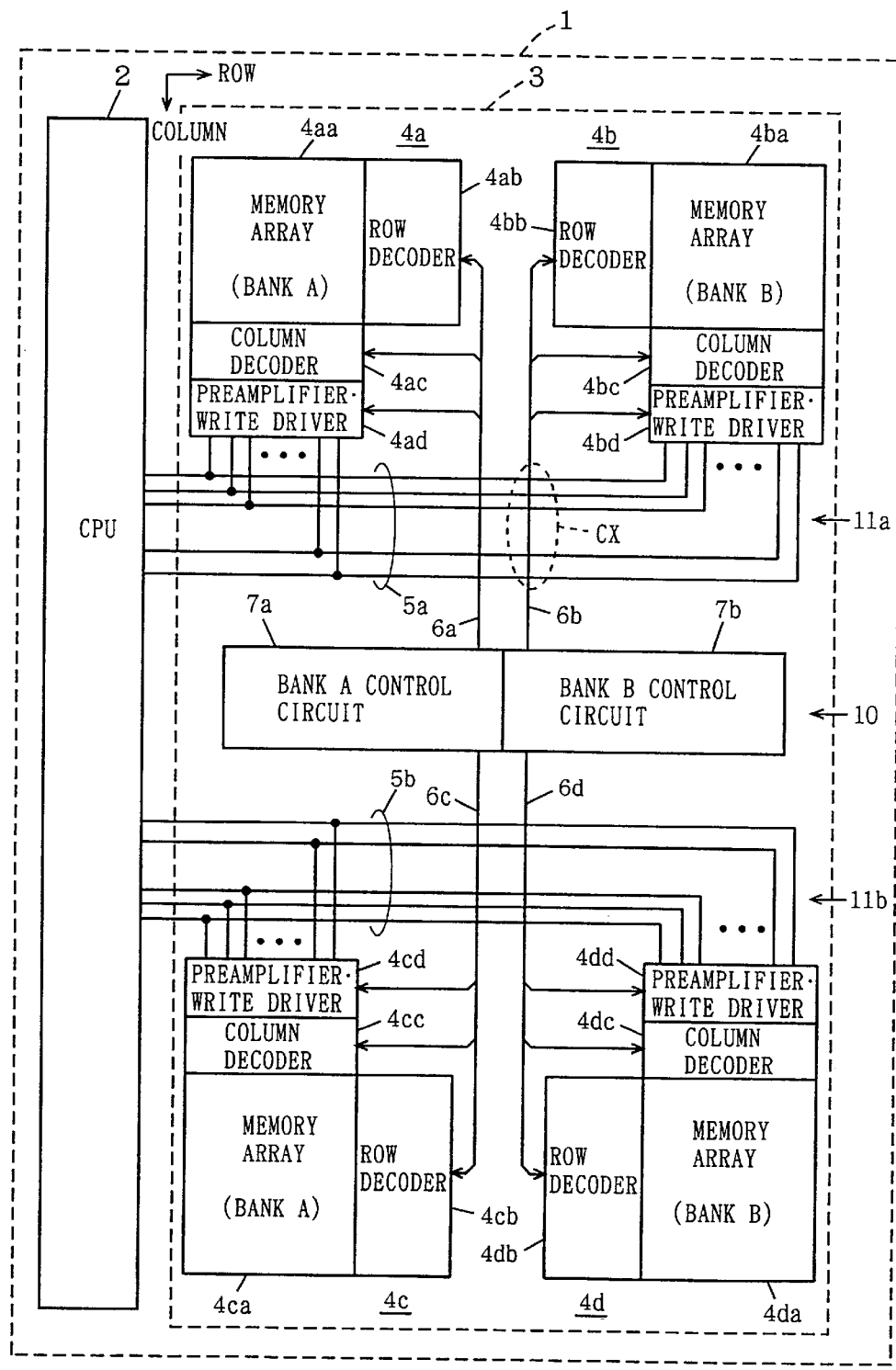
FIG. 1 schematically shows an entire configuration of a semiconductor integrated circuit device according to a first embodiment of the present invention.

FIG. 1 schematically shows an entire configuration of a semiconductor integrated circuit device according to the first embodiment of the invention. In FIG. 1, a semiconductor integrated circuit device 1 includes a processor (CPU) 2 and a DRAM macro (functional block) 3 which functions as a main memory for processor 2 that are formed to be integrated on a semiconductor chip. Although semiconductor integrated circuit device 1 is shown including processor 2, the processor may be a logical circuit such as a DSP (Digital Signal Processor) which executes a dedicated processing. In order to represent characteristic features of the present invention clearly, semiconductor integrated circuit device 1 is shown including only processor 2 and DRAM macro 3, the semiconductor circuit device may include another macro or cell. However, the semiconductor integrated circuit device is hereinafter described as a processor (or logic) containing DRAM or a DRAM containing processor.

DRAM macro 3 has a rectangular shape and includes subbanks 4a, 4b, 4c and 4d arranged respectively in four regions. Subbanks 4a and 4c constitute a bank A and sub banks 4b and 4d constitute a bank B. These subbanks 4a–4d have the same configuration. Specifically, subbank 4a includes a memory array 4aa having a plurality of dynamic memory cells arranged in rows and columns, a row decoder 4ab for driving a row in memory array 4aa into a selected state, a column decoder 4ac for selecting a column in memory array 4aa, and a preamplifier.write driver block 4ad which reads/writes data from/into a memory cell selected by row decoder 4ab and column decoder 4ac.

Similarly, subbank 4b includes a memory array 4ba, a row decoder 4bb, a column decoder 4bc and a preamplifier.write driver block 4bd. Subbank 4c includes a memory array 4ca, a row decoder 4cb, a column decoder 4cc and a preamplifier.write driver block 4cd. Subbank 4d includes a memory array 4da, a row decoder 4db, a column decoder 4dc and a preamplifier.write driver block 4dd.

The configuration of each of subbanks 4a–4d is identical to that of a normal DRAM. Preamplifier.write driver blocks 4ad and 4bd of subbanks 4a and 4b are arranged facing to each other with respect to a central region in the column direction of DRAM macro 3. Similarly, preamplifier.write driver blocks 4cd and 4dd of subbanks 4c and 4d are arranged facing to each other with respect to the central region in the column direction of DRAM macro 3. Subbanks 4a and 4c have layouts that are in mirror symmetry relative to the central region in the column direction of DRAM macro 3, and subbanks 4b and 4d have layouts that are in mirror symmetry relative to the central region in the column direction of DRAM macro 3. Further, subbanks 4a and 4b have layouts that are in mirror symmetry relative to a central region in the row direction of DRAM macro 3, and subbanks 4c and 4d have layouts that are in mirror symmetry relative to the central region in the row direction of DRAM macro 3. After completion of the layout of one subbank, the subbank with the completed layout is folded back, and layouts of remaining subbanks are implemented, resulting in easier layout.

The central region in the column direction of DRAM macro 3 is divided into three regions 10, 11a and 11b. In region 10, a bank A control circuit 7a which controls selection/non-selection (including data access) of subbank 4a via an internal bus 6a and controls selection/non-selection of subbank 4c via an internal bus 6c, as well as a bank B control circuit 7b which controls selection/non-selection of subbank 4b via an internal bus 6b and controls selection/non-selection of subbank 4d via an internal bus 6d are arranged. Bank A control circuit 7a is arranged in a region substantially intermediate between subbanks 4a and 4c, and internal buses 6a and 6c have a substantially identical length. Similarly, bank B control circuit 7b is arranged in a substantially intermediate between subbanks 4b and 4d, and internal buses 6b and 6d have the same length. Bank A control circuit 7a and bank B control circuit 7b are arranged in alignment with each other in the row direction in region 10. Subbanks 4a and 4b are arranged in alignment with each other along the row direction, and subbanks 4c and 4d are arranged in alignment with each other along the row direction. Accordingly, the length of internal buses 6a–6d are substantially equal, so that the timing of selection/non-selection of subbanks 4a–4d upon selection of bank A can be made the same as that of selection of bank B. It is not necessary to consider a margin for the difference of the timing, and high speed access is possible.

In region 11a, an internal read/write data bus (internal access data transfer bus) 5a is arranged extending in the row direction and is commonly coupled with preamplifier.write driver blocks 4ad and 4bd of subbanks 4a and 4b. In region 11b, an internal read/write data bus (internal access data transfer bus) 5b which extends in the row direction and is coupled with preamplifier.write driver blocks 4cd and 4dd of subbanks 4c and 4d is provided.

The internal read/write data buses 5a and 5b are placed in parallel with bank A control circuit 7a and bank B control circuit 7b. Therefore, there is not a region where bank A control circuit 7a and bank B control circuit 7b cross internal read/write data buses 5a and 5b, and the bank A control circuit 7a and bank B control circuit 7b do not need to include an empty region for arranging internal read/write data buses 5a and 5b. An arrangement of high density is thus achieved and increase of an area of DRAM macro 3 or increase of chip area can be avoided.

Internal read/write data buses 5a and 5b transfer data of both bank A and bank B. In order to implement a bank width similar to that of the single bank configuration, the bit width of each of internal read/write data buses 5a and 5b is determined to be 64 bits to 512 bits, for example, which is twice the bit width in the single bank configuration. Although the number of bus lines of internal read/write data buses 5a and 5b increases, there is no limitation on layout compared with the limitation on layout generated when the crossing of bank A control circuit 7a and bank B control circuit 7b and internal read/write data buses 5a and 5b should be considered. Therefore, more efficient layout of bank A control circuit 7a and bank B control circuit 7b is possible and increase of the area due to increase of the bus lines of internal read/write data buses can be sufficiently compensated for.

Internal read/write data buses 5a and 5b are electrically coupled with processor 2. In this case, processor 2 is arranged facing to and external to DRAM macro 3 and supplies and receives data to and from internal read/write data buses 5a and 5b located in regions 11a and 11b. Processor 2 has thus no limitation on layout thereof due to a crossing to internal read/write data buses. Only provision of a data input/output port in the vicinity of regions 11a and 11b of DRAM macro 3 is required. Accordingly, an efficient layout of processor 2 is possible without considering a crossing to arrangement of internal read/write data buses, and a processor of high density can be implemented. Accordingly, semiconductor integrated circuit device 1 which is highly integrated with high density is implemented.

Internal buses 6a–6d that transmit a control signal and an address signal are arranged extending in the column direction, while internal read/write data buses 5a and 5b are arranged extending in the row direction. Therefore, there are crossings of internal buses 6a–6d and internal read/write data buses 5a and 5b. In FIG. 1, a crossing of internal bus 6b and internal read/write data bus 5a is representatively shown by a block CX indicated with a broken line.

Figure 2A:
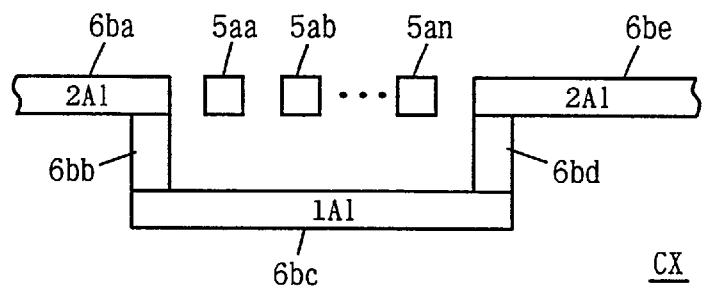
FIGS. 2A and 2B schematically show arrangements of interconnection lines at a crossing of an address signal and control signal bus and a read/write data bus shown in FIG. 1.

FIG. 2A schematically shows a configuration of an arrangement of bus lines at crossing CX shown in FIG. 1. FIG. 2A shows a cross sectional structure of one bus line included in internal bus 6b. Internal read/write data bus 5a includes bus lines 5aa, 5ab, . . . , 5an constituted of, for example, a second level aluminum interconnection line (2A1). The bus line of internal bus 6b includes an interconnection line 6bc formed of, for example, a first level aluminum interconnection line (1A1) formed at a layer under internal read/write data bus lines 5aa–5an, as well as interconnection lines 6ba and 6be formed in the same layer as internal read/write data bus lines 5aa–5an. Interconnection lines 6ba and 6be are connected electrically to interconnection line 6be located in the lower layer via contacts 6bb and 6bd respectively. Accordingly, even if internal read/write data bus 5a and internal bus 6b are crossed at crossing CX, the internal read/write data bus and the internal bus 6b can be arranged by using different interconnection layers.

Figure 2B:
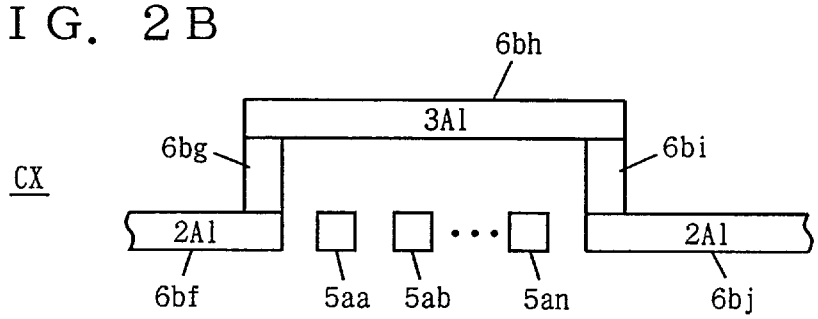

FIG. 2B shows a structure of crossing CX. In FIG. 2B, an interconnection line 6bh formed of, for example, a third level aluminum interconnection layer (3A1) is provided above the layer of internal read/write data bus lines 5aa–5an, and interconnection lines 6bf and 6bj are formed in the same layer as internal read/write data bus lines 5aa–5an. Interconnection lines 6bf and 6bj are connected to interconnection line 6bh respectively via contacts 6bg and 6bi. Interconnection lines 6bf, 6bg, 6bh, 6bi and 6bj constitute one internal bus line.

If the third level aluminum interconnection line is employed, the resistance value thereof is lower than that of the second level aluminum interconnection line. If the aluminum interconnection line is used, an aluminum interconnection line located in an upper layer is subjected to less heat cycles after formation of the upper layer interconnection line for formation of another interconnection. Further, the number of insulating layers and interconnection layers formed in a layer thereabove is small, and stress applied from these layers is small. Therefore, the purity of the upper layer aluminum interconnection line can be made higher than that of the lower layer aluminum interconnection line (Resistance against stress and heat becomes lower as the purity of aluminum increases.). In this case, compared with the case in which the internal bus line is formed using only the second level aluminum interconnection layer, signals (control signal and address signal) can be transmit at a high speed since interconnection line 6bh of low resistance is used.

The structure of crossing CX is also applied to a crossing of internal read/write data bus 5a and internal bus 6a as well as crossings of internal read/write data bus 5b and internal buses 6c and 6d.

In the structures of crossings shown in FIGS. 2A and 2B, interconnection lines of different layers are used for internal buses 6a–6d. However, internal buses 6a–6d may be formed of the same interconnection layer, and bus lines of internal read/write data buses 5a and 5b may be connected to another interconnection layer at the crossing.

Figure 3:
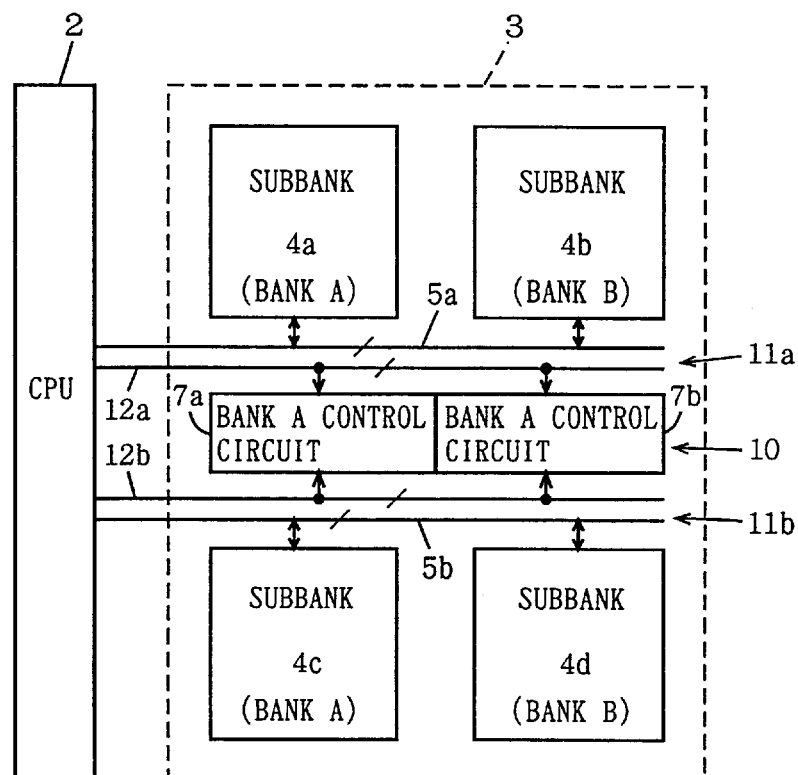
FIG. 3 shows an arrangement of a control bus of the semiconductor integrated circuit device according to the first embodiment of the invention.

FIG. 3 shows an arrangement of control buses that transmit a control signal and an address signal to processor 2, bank A control circuit 7a and bank B control circuit 7b. In FIG. 3, subbanks 4a–4d, and read/write data buses 5a and 5b included in regions 11a and 11b are schematically shown for simplification of the figure. Referring to FIG. 3, a control bus 12a which transmits a control signal and an address signal from processor 2 is placed in parallel with internal read/write data bus 5a in region 11a, and electrically coupled with bank A control circuit 7a and bank B control circuit 7b. In region 11b, a control bus 12b which transmits a control signal and an address signal from processor 2 is placed in parallel with internal read/write data bus 5b, and electrically coupled with bank A control circuit 7a and bank B control circuit 7b.

Control buses 12a and 12b transfer a signal for designating a bank, a signal for designating an operation mode and the like.

In the multi-bank configuration formed of banks A and B including subbanks 4a–4d, there is no crossing of control buses 12a and 12b and bank A control circuit 7a and bank B control circuit 7b. Control buses 12a and 12b do not cross processor 2. Since control buses 12a and 12b are located in regions 11a and 11b where internal read/write data buses 5a and 5b are arranged, the interconnection layout of control buses 12a and 12b does not adversely affect bank A control circuit 7a and bank B control circuit 7b as well as processor 2. As a result, a semiconductor integrated circuit device of high density can be implemented to reduce the chip area, as is implemented by arrangement of internal read/write data buses 5a and 5b.

In the arrangement shown in FIG. 3, regions 11a and 11b respectively have control buses 12a and 12b arranged therein. However, the control buses may be arranged in only one of regions 11a and 11b.

According to the first embodiment of the invention, a region where a processor is arranged is separated from a region where a DRAM array and a control circuit are arranged, and different banks are allocated to memory arrays located on the same side relative to the DRAM control circuit (bank control circuit). Therefore, an internal read/write data bus interconnection line arranged commonly for the banks is not required to pass through a processor section and a DRAM control circuit section (bank control circuit section). There is no limitation of layout due to crossing of interconnection lines for the processor and control circuit sections, resulting in an efficient layout and prevention of increase of an occupied area of a circuit. The advantage above is also obtained as to a control bus which transfers a control signal and an address signal to the bank control circuit.

Since the bank control circuit is arranged in central region 10 of DRAM macro 3 and banks are allocated such that subbanks facing to each other relative to the central region belong to the same bank, the lengths of interconnection lines from the bank control circuit to respective subbanks are made identical to each other to accomplish the same selection/non-selection timing in each subbank, resulting in high speed access.

Since internal read/write data buses are arranged on both sides of the bank control circuit, the same distances between subbanks belonging to the same bank and the internal read/write data bus, as well as the same delay time in reading/writing of data are accomplished. Accordingly, there is no need to consider a skew resulting from delay in interconnection lines for the timing at which data is defined, resulting in high speed access.

Second Embodiment

Figure 4:
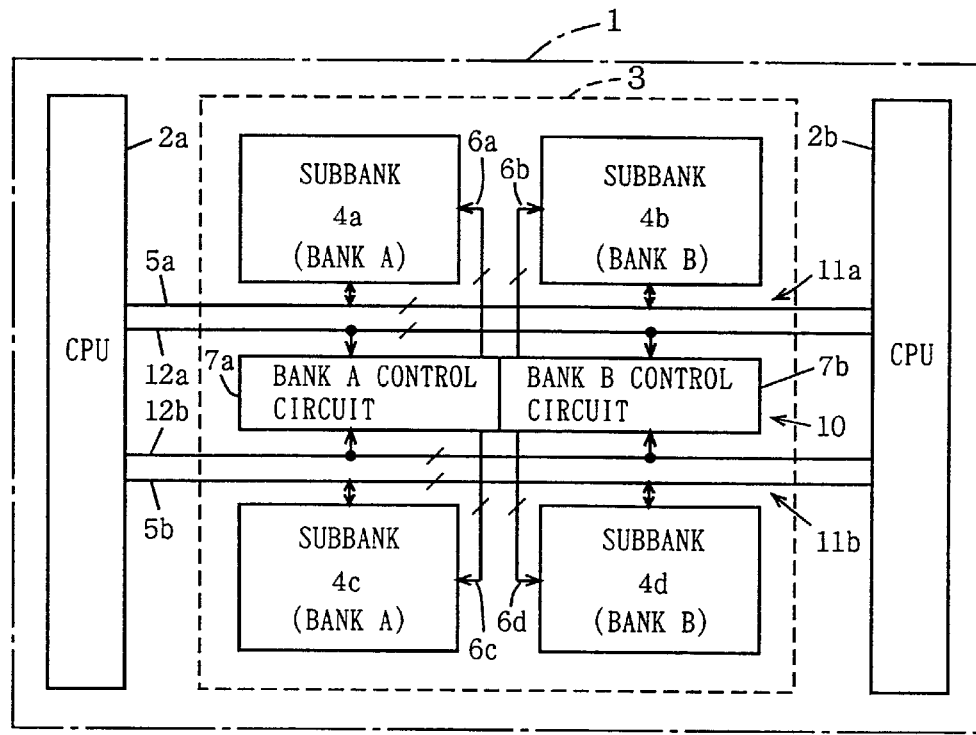
FIG. 4 schematically shows an entire configuration of a semiconductor integrated circuit device according to a second embodiment of the invention.

FIG. 4 schematically shows an entire structure of a semiconductor integrated circuit device according to the second embodiment of the invention. Referring to FIG. 4, semiconductor integrated circuit device 1 includes DRAM macro 3, and processors (CPUs) 2a and 2b arranged facing to each other on both sides of DRAM macro 3 in the row direction.

DRAM macro 3 includes, as in the first embodiment, subbanks 4a and 4c that are arranged facing to each other with respect to region 10 and constitute bank A, subbanks 4b and 4d that are arranged facing to each other with respect to region 10 and constitute bank B, bank A control circuit 7a which is arranged between subbanks 4a and 4c in region 10 and controls selection/non-selection (including activation/inactivation and data access) of subbanks 4a and 4c via internal buses 6a and 6c, and bank B control circuit 7b which is arranged between subbanks 4b and 4d in region 10 and controls selection/non-selection of subbanks 4b and 4d via internal buses 6b and 6d.

In region 11a between subbanks 4a and 4b arranged in alignment with each other in the row direction and region 10, internal read/write data bus 5a arranged extending in the row direction and coupled with subbanks 4a and 4b, as well as control bus 12a arranged extending in the row direction and coupled with bank A control circuit 7a and bank B control circuit 7b are provided. In region 11b between subbanks 4c and 4d arranged in alignment with each other in the row direction and region 10, internal read/write data bus 5b arranged extending in the row direction and coupled with subbanks 4c and 4d, as well as control bus 12b arranged extending in the row direction and coupled with bank A control circuit 7a and bank B control circuit 7b are provided. Only one of control buses 12a and 12b may be provided.

Internal read/write data buses 5a and 5b as well as control buses 12a and 12b are coupled with processors 2a and 2b.

Since internal read/write data buses 5a and 5b as well as control buses 12a and 12b are arranged in regions 11a and 11b, in addition to the advantage obtained by the first embodiment, an advantage that processors 2a and 2b can be easily placed on both sides of DRAM macro 3 without affecting adversely the internal layout of DRAM macro 3 can be obtained. Accordingly, semiconductor integrated circuit device 1 implements a multi-processor system employing DRAM macro 3 as a main memory. A semiconductor integrated circuit device having a superior function and an excellent performance can thus be easily implemented.

Regarding processors 2a and 2b, one processor may be a main processor and the other processor may be a coprocessor. One of the processors 2a and 2b may be a processor and the other may be a logical circuit such as a DSP (Digital Signal Processor) which executes a dedicated logical processing. Particularly in the field of ASIC, by employing DRAM macro 3 as shown in FIG. 4 as a memory section, an optimal arrangement of an external logical circuit section is possible without being affected by the layout of DRAM macro 3. As a result, an ASIC where the chip area is efficiently utilized can be easily implemented.

According to the second embodiment of the invention, as described above, logical circuit units such as processors are arranged on both sides of DRAM macro 3 and are coupled with internal read/write data buses as well as control data buses, a semiconductor integrated circuit device having high function and high performance can be easily implemented. Especially, if DRAM macro 3 is registered as a library, a semiconductor integrated circuit device which efficiently utilizes the area can be easily implemented by using the DRAM macro 3 as the library when the semiconductor integrated circuit device is designed on a cell base.

Third Embodiment

Figure 5:
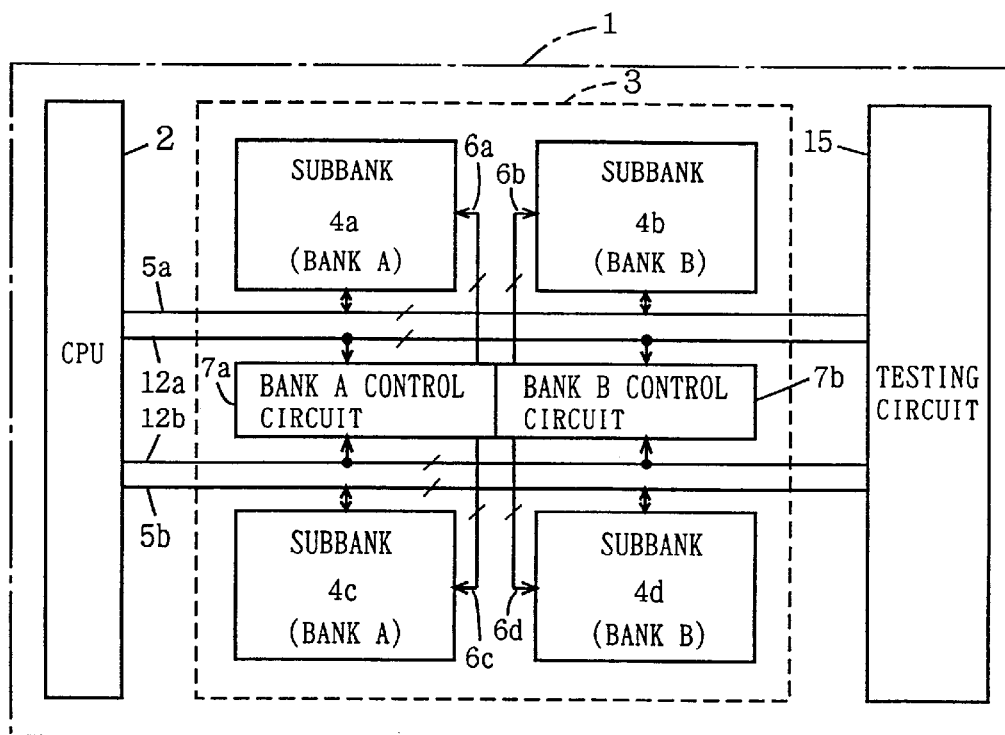
FIG. 5 schematically shows an entire configuration of a semiconductor integrated circuit device according to a third embodiment of the invention.

FIG. 5 schematically shows an entire structure of a semiconductor integrated circuit device according to the third embodiment of the invention. A difference between the semiconductor integrated circuit device of FIG. 5 and that of the second embodiment shown in FIG. 4 is as described below. Specifically, on both sides of DRAM macro in the row direction, processor 2 and a testing circuit 15 for testing at least the function of DRAM macro 3 are arranged opposing to each other. Other configuration is similar to that of the semiconductor integrated circuit device shown in FIG. 4, corresponding portions have the same reference characters and detailed description thereof is omitted.

In the configuration of the semiconductor integrated circuit device shown in FIG. 5, internal read/write data buses 5a and 5b as well as control buses 12a and 12b are coupled with processor 2 and testing circuit 15. A function test for DRAM macro 3 which is not directly connected to an external pin terminal of semiconductor integrated circuit device 1 can be easily carried out by providing testing circuit 15 for conducting the function test for DRAM macro 3 in semiconductor integrated circuit device 1.

If testing circuit 15 is not provided, the function test for DRAM macro 3 has to be carried out via processor 2. In this case, a program for conducting the function test for DRAM macro 3 has to be stored in processor 2, or an instruction for conducting the function test for DRAM macro 3 has to be externally issued to processor 2 to cause processor 2 to output a control signal for conducting the function test, and a result of the test has to be read via processor 2. In the function test for DRAM macro 3 thus carried out via processor 2, a test for the operation timing margin of DRAM macro 3 cannot be correctly carried out (since delay time of processor 2 is added). Further, the capacity of the program limits the number of test patterns generated, the test cannot be carried out satisfactorily, and reliability cannot be fully assured.

Since testing circuit 15 is provided and DRAM macro 3 can be externally tested via a dedicated testing unit directly in this configuration, a function test necessary for DRAM macro 3 can be easily and correctly carried out.

Since the testing circuit 15 is provided, a program for testing DRAM macro 3 only is not required to be changed and a test for DRAM macro 3 incorporated in semiconductor integrated circuit device 1 can be carried out (since a direct access can be externally made to DRAM macro 3). Suppose that testing circuit 15 is not provided, a result of a test is stored in processor 2 or a result of a test is determined by processor 2, and the result of the test is output from processor 2. In this case, a logical circuit for conducting a test for DRAM macro 3 is inserted into a path in which an operational processing by processor 2 itself is carried out, so that a signal propagation delay of processor 2 is generated. Provision of testing circuit 15 avoids provision of extra circuits in processor 2, resulting in high speed operation of processor 2.

Figure 6:
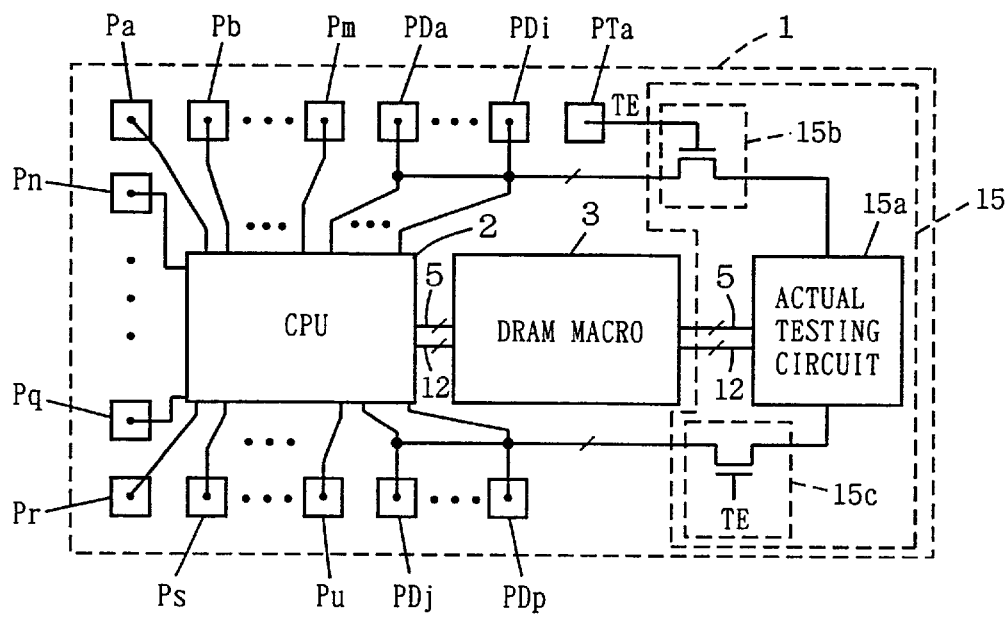
FIG. 6 schematically shows a configuration of a testing circuit shown in FIG. 5.

FIG. 6 schematically shows a configuration of testing circuit 15 in FIG. 5. The arrangement of pads is emphasized in FIG. 6. Referring to FIG. 6, pads Pa–Pm, Pn–Pq, Pr, Ps–Pu, and pads PDa–PDi and PDj–PDp are arranged surrounding processor 2 along the periphery of semiconductor integrated circuit device 1. Pads Pa–Pm and PDa–PDi are arranged in alignment with each other at one side (upper side) of semiconductor integrated circuit device 1, pads Pr–Pu and PDj–PDp are arranged in alignment with each other at an opposing side of semiconductor integrated circuit device 1, and pads Pa and Pn–Pr are arranged in alignment with each other at the left side of semiconductor integrated circuit device 1. A pad PTa for generating test activation signal TE is placed adjacent to pad PDi.

In FIG. 6, semiconductor integrated circuit device 1 is shown having pads Pa–Pu and PDa–PDp and PTa are arranged in regions of three sides of processor 2 for simplification of the figure. However, these pads are located along the four sides of semiconductor integrated circuit device 1. These pads Pa–Pu, PDa–PDp and PTa are coupled with external pin terminals (not shown). Pads Pa–Pu and PDa–PDp are coupled with processor 2, and supply and receive signals (including data) to and from processor 2.

Testing circuit 15 includes an actual testing circuit 15a for conducting a test actually, a select/connect circuit 15b responsive to activation of test activation signal TE supplied from pad PTa to electrically connect pads PDa–PDi to actual testing circuit 15a, and a select/connect circuit 15c responsive to activation of test activation signal TE from pad PTa to electrically connect pads PDj–PDp to actual testing circuit 15a. Select/connect circuits 15b and 15c electrically connect actual testing circuit 15a to external pin terminals via pads PDa–PDi and PDj–PDp. Testing of DRAM macro 3 is possible via actual testing circuit 15a even after packaging of semiconductor integrated circuit device 1. Actual testing circuit 15a is coupled with DRAM macro 3 via internal read/write data bus 5 (5a and 5b) and control bus 12 (12a and 12b). Via actual testing circuit 15a, writing/reading of test data is carried out for subbanks contained in DRAM macro 3.

Figure 7:
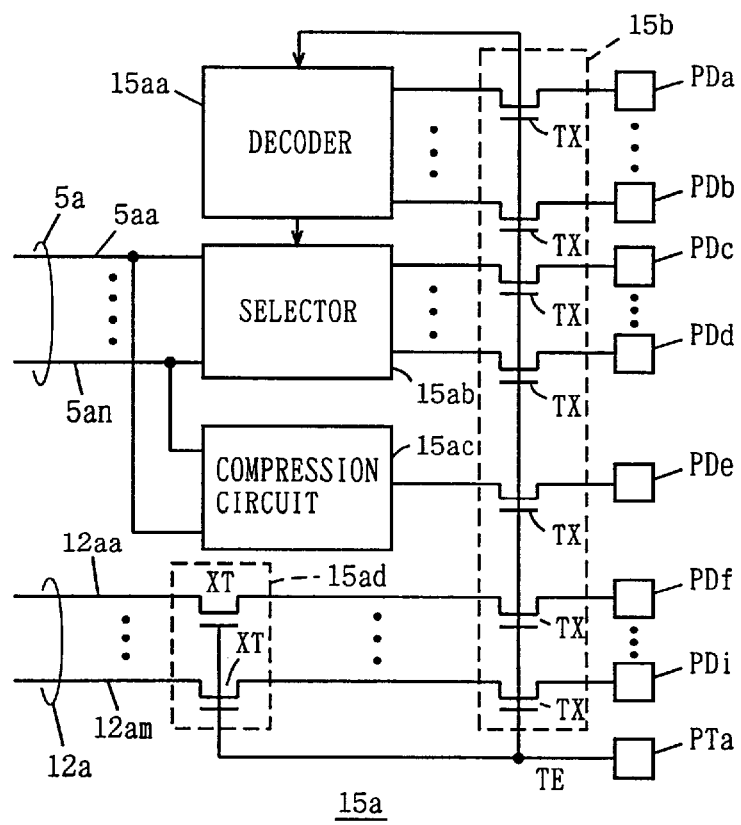
FIG. 7 shows a structure of the testing circuit shown in FIG. 6 in more detail.

FIG. 7 specifically shows a configuration of testing circuit 15 of FIG. 6. In FIG. 7, a configuration of a portion of the testing circuit for internal read/write data bus 5a and control bus 12a provided for subbanks 4a and 4b included in DRAM macro 3 is shown. A configuration similar to that shown in FIG. 7 is provided for internal read/write data bus 5b and control bus 12b provided for subbanks 1c and 1d shown in FIG. 5. If only one of control buses 12a and 12b is provided, the actual testing circuit is provided for the one control bus.

Referring to FIG. 7, select/connect circuit 15b includes transfer gates TX provided for respective pads PDa–PDi and rendered conductive upon activation of test activation signal TE supplied from pad PTa. Transfer gates TX are provided in the vicinity of pads PDa–PDi as near as possible. In the normal operation, reduction of interconnection line capacitance of pads PDa–PDi as well as reduction of capacitance of a signal input/output portion of processor 2 are achieved, and high speed operation of processor 2 in the normal operation is assured.

Actual testing circuit 15a includes: a decoder 15aa which receives signals supplied to pads PDa–PDb via transfer gates TX of select/connect circuit 15b and decodes the received signals; a selector 15ab coupled with internal read/write data bus 5a, selects a set of bus lines 5aa–5an of the internal read/write data bus according to a signal output from decoder 15aa, and electrically couples the selected internal read/write data bus lines to pads PDc–PDd via transfer gates of select/connect circuit 15b; a compression circuit 15ac which compresses data signals on bus lines 5aa–5an of internal read/write data bus 5a into one bit data and transmits the compressed data to pad PDe via a corresponding transfer gate TX; and a select gate circuit 15ad responsive to activation of test activation signal TE supplied from pad PTa to connect bus lines 12aa–12am of control bus 12a to corresponding transfer gates TX of select/connect circuit 15b. Select gate circuit 15ad is provided for preventing increase of interconnection line capacitance of bus lines 12aa–12am of control bus 12a in the normal operation, and includes transfer gates XT provided corresponding to respective bus lines 12aa–12am.

In the test operation, processor 2 (see FIG. 6) is in a non-operation state, and set in an output high impedance state. This is accomplished by supplying a control signal indicating testing of DRAM macro 3 to processor 2, or supplying test activation signal TE to processor 2.

Control bus 12a transmits an address signal and a control signal. The address signal includes a bank designation signal designating a bank, a row address signal designating a row, and a column address signal designating a column. The control signal includes a signal designating writing/reading mode of data, and a signal which provides a timing at which row and column address signals are taken in. If a memory management unit such as a DRAM controller which manages access to DRAM array is contained in the processor, a control signal which is the same as a control signal for a monolithic DRAM device is supplied to DRAM macro 3. Accordingly, a function test for DRAM macro 3 can be carried out following a sequence identical to that for testing of a discrete DRAM device. If a control signal is supplied to pads PDf–PDi and writing/reading of test data is carried out via pads PDc–PDd, testing for DRAM macro 3 can be externally executed correctly after packaging since these pads PDa–PDi are connected to external terminals.

Figure 8:
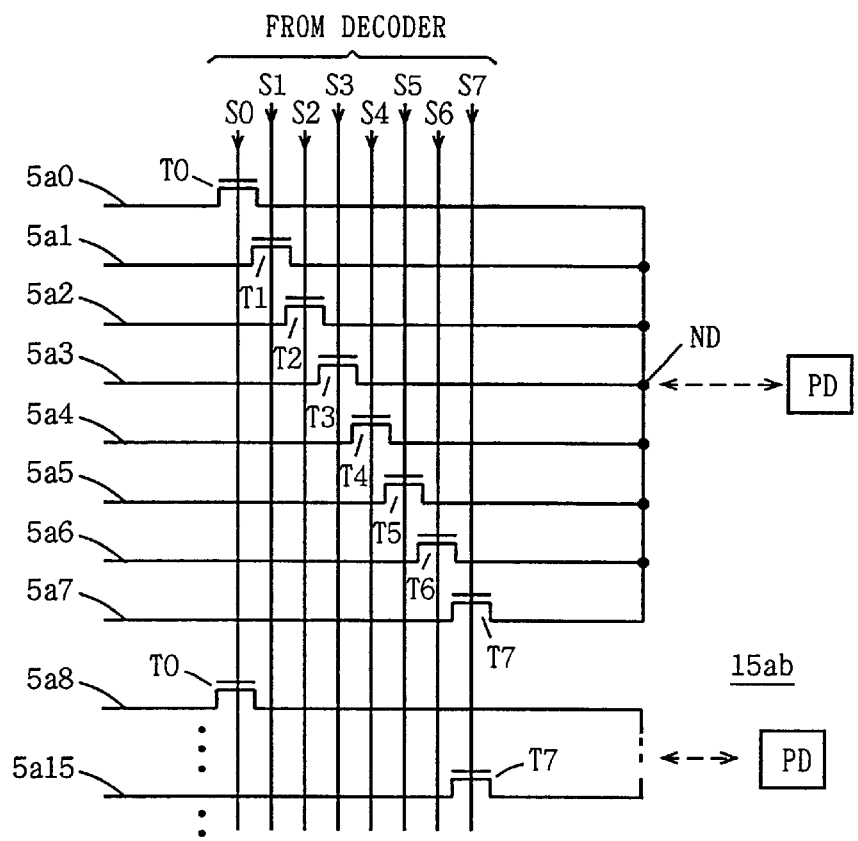
FIG. 8 schematically shows a configuration of a selector shown in FIG. 7.

FIG. 8 shows one example of a configuration of selector 15ab of FIG. 7. A configuration of a unit selector circuit provided for one pad PD is illustrated in FIG. 8. A set of eight internal read/write data bus lines 5a0–5a7 and a set of bus lines 5a8–5a15 are provided for the one pad PD. The unit selector circuit includes transfer gates T0–T7 provided respectively corresponding to eight internal read/write data bus lines 5a0–5a7 and selectively rendered conductive in response to decode signals S0–S7 supplied from decoder 15aa shown in FIG. 7. Transfer gates T0–T7 are commonly coupled to a node ND. Node ND is electrically coupled to a corresponding pad PD in the test operation mode.

The decoder decodes the signals supplied from corresponding pads PDa–PDb as an address signal, and drives one of decode signals S0–S7 into a selected state (active state). Accordingly, regarding internal read/write data bus line 5a, one of the eight bus lines in the respective sets of eight bus lines 5a0–5a7 and 5a8–5a15 is electrically coupled to a corresponding pad (in test operation mode).

Internal read/write data bus 5a has a width of 64 bits to 512 bits. Since selector 15ab is provided, even if the total bus width of internal read/write data buses 5a and 5b is, for example, 1 K bits, 128 pads (pin terminals) are just required when test data is input/output. Even if the bit width of the internal read/write data bus is large, the DRAM macro can be surely tested using external pin terminals. Approximately 200 pin terminals are usually provided in this semiconductor integrated circuit device as in the normal CPU.

Figure 9:
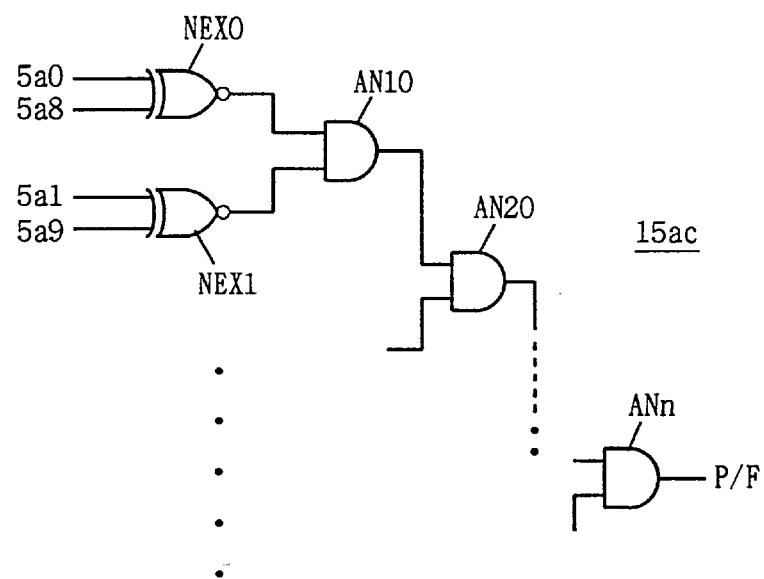
FIG. 9 schematically shows a configuration of a compression circuit shown in FIG. 7.

FIG. 9 shows one example of a configuration of compression circuit 15ac shown in FIG. 7. Referring to FIG. 9, compression circuit 15ac includes a two-input coincidence detection circuit NEX provided for bus lines on which the same test data is written (bus lines selected by the same selection signal of selection signals S0–S7) of internal read/write data bus lines 5aa–5an. In FIG. 9, a coincidence detection circuit NEX0 receiving signals on bus lines 5a0 and 5a8, and a coincidence detection circuit NEX1 receiving signals on bus lines 5a1 and 5a9 are representatively shown.

Compression circuit 15ac further includes an AND circuit AN1 receiving signals output from adjacent two coincidence detection circuits NEXi and NEXi+1. In FIG. 9, an AND circuit AN10 receiving signals output from coincidence detection circuits NEX0 and NEX1 is shown representatively. Compression circuit 15ac further includes an AND circuit AN20 receiving signals output from adjacent AND circuits AN1i and AN1i+1. In FIG. 9, an AND circuit AN20 receiving signal output from AND circuit AN10 at one input is representatively shown. AND gates are successively provided depending on the number of bus lines of internal read/write data bus 5a, and signal P/F indicating whether the logics of the signals on all bus lines 5a0–5an coincide with each other or not is output from AND circuit ANn at the last stage.

Coincidence detection circuit NEX0 outputs a signal at an H level if the logics of the signals on corresponding bus lines are identical to each other. The coincidence detection circuit receives data read from memory cells to which data of the same logic is written. If the logics of signals on read/write data bus lines 5a0–5an are the same, signal P/F output from AND circuit ANn is at the H level. If the logics of signals of a pair of bus lines are different, a signal output from a corresponding coincidence detection circuit NEX is at an L level, a signal output from a corresponding AND circuit AN1j is at the L level, and output signal P/F from AND circuit ANn at the last stage is at the L level. Whether the logics of data read from memory cells to which the data is written are identical or not is determined to detect a pass/fail of a memory cell. In this way, memory cells corresponding in number to internal read/write data buses can be simultaneously tested, and time for the testing can be reduced.

In the configuration of compression circuit 15ac, if the bit width of internal read/write data bus 5a is 1024 bits, the number of gates decreases by half, as 512 gates for the coincidence detection circuit, 256 gates for the AND circuit AN1, 128 gates for the AND circuit AN2, . . . As a result, gate delay of nine stages occurs. However, since high speed access is not required in test operation, there is no problem even if the number of stages of the gates increases. Further, the testing circuit is provided on the outside of the DRAM macro and can occupy an area of a length which is approximately the same as the length of the DRAM macro in the column direction. As a result, the compression circuit can be arranged with a sufficient margin.

As heretofore described, according to the third embodiment of the invention, a processor (logical processing circuit unit) is placed on one side of the DRAM macro and a testing circuit for executing a function test for the DRAM macro is provided on the other side in the row direction of the DRAM macro. The testing circuit has a function of coupling the internal read/write data bus and the control bus of the DRAM macro to external pin terminals of the semiconductor integrated circuit device, so that the function test for the DRAM macro can be easily conducted even after packaging. The DRAM macro has a configuration identical to that of a normal DRAM (a standard DRAM (if a bank control signal is supplied from a processor separately to bank A and bank B) or a synchronous DRAM), so that a test can be executed following a sequence identical to the test sequence of the normal DRAM, and a test for the DRAM macro can be carried out using a conventional testing unit.

Further, since the processor is separated from the DRAM macro when the DRAM macro is tested (the processor is set in the output high impedance state or the non-operation state upon activation of test activation signal TE), the processor is not required to manage testing for the DRAM macro and load of the processor is reduced.

Fourth Embodiment

Figure 10:
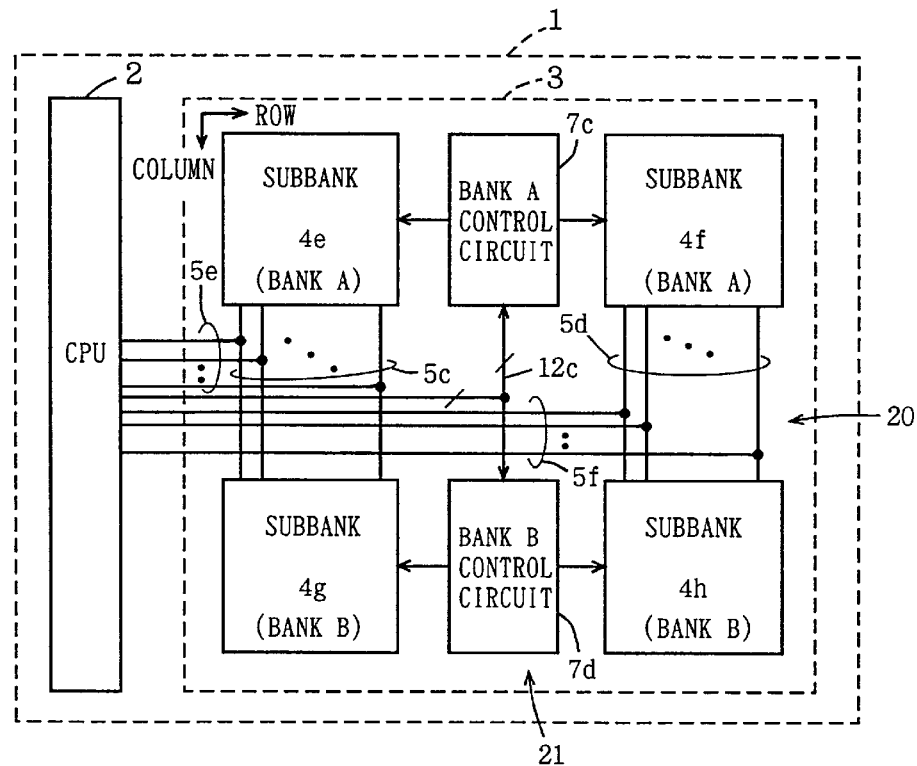
FIG. 10 schematically shows an entire configuration of a semiconductor integrated circuit device according to a fourth embodiment of the invention.

FIG. 10 schematically shows an entire configuration of a semiconductor integrated circuit device according to the fourth embodiment. With reference to FIG. 10, semiconductor integrated circuit device 1 includes processor 2, and DRAM macro 3 serving as a main memory for processor 2. DRAM macro 3 includes four subbanks 4e–4h. Each of subbanks 4e–4h includes a memory cell array, a row decoder, a column decoder and a preamplifier.write driver block as in the configuration shown in FIG. 1. Subbanks arranged in alignment with each other in the row direction in DRAM macro 3 constitute the same bank. Specifically, subbanks 4e and 4f constitute bank A, and subbanks 4g and 4h constitute bank B.

Subbanks arranged in alignment with each other in the column direction belong to different banks and an internal read/write data bus is provided commonly for them. Specifically, an internal read/write data bus 5c is commonly coupled to subbanks 4e and 4g, an internal read/write data bus 5d is commonly coupled to subbanks 4f and 4h. Internal read/write data buses 5c and 5d are respectively coupled to data buses 5e and 5f in a central region 20 in the column direction. Data buses 5e and 5f extend in the row direction in region 20 and are coupled to processor 2.

In a central region 21 in the row direction of DRAM macro 3, a bank A control circuit 7c is provided between subbanks 4e and 4f, and a bank B control circuit 7d is provided between subbanks 4g and 4h. Bank A control circuit 7c and bank B control circuit 7d receive an address signal and a control signal from processor 2 via a control bus 12c provided in region 20.

Bank A control circuit 7c and bank B control circuit 7d are placed in a region different from region 20 where data buses are located. Therefore, there is no need to consider a region where data buses are placed when bank A control circuit 7c and bank B control circuit 7d are to be arranged, resulting in implementation of an efficient layout and reduction of an occupied area of the circuit. Processor 2 is merely required to have an interface section for input/output of data and output of a control signal (including an address signal) placed in its central portion in the column direction, and its internal circuits can be appropriately distributed to implement an efficient layout.

Further, bank A control circuit 7c is located between subbanks 4e and 4f and bank B control circuit 7d is located between subbanks 4g and 4h. Accordingly, propagation delay of the control signal and the address signal is the same and difference of operation timings in subbanks 4e–4h can be avoided. Therefore, there is no need to consider a margin for the difference of operation timing, and high speed operation is achieved.

Fifth Embodiment

Figure 11:
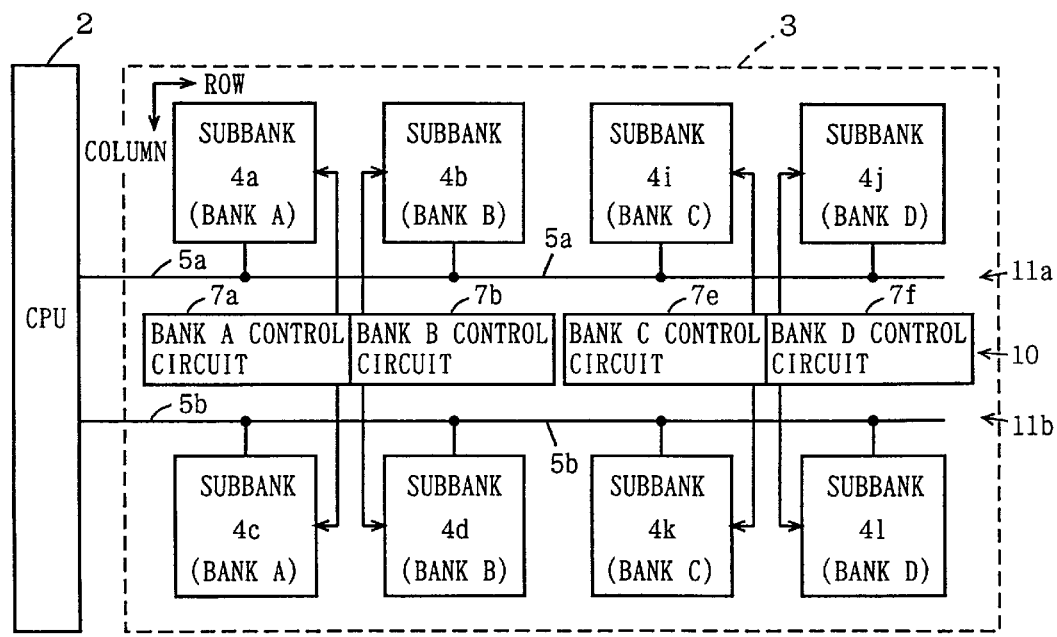
FIG. 11 schematically shows an entire configuration of a semiconductor integrated circuit device according to a fifth embodiment of the invention.

FIG. 11 schematically shows an entire configuration of a semiconductor integrated circuit device according to the fifth embodiment. The semiconductor integrated circuit device shown in FIG. 11 includes processor 2 and DRAM macro 3. Eight subbanks 4a–4d and 4i–4l are provided in DRAM macro 3. Subbanks 4a and 4c constitute bank A, subbanks 4b and 4d constitute bank B. Subbanks 4i and 4k constitute bank C, and subbanks 4j and 4l constitute bank D. Subbanks opposite to each other with respect to central region 10 in the column direction of DRAM macro 3 belong to the same bank. A bank control circuit is placed to be sandwiched between those subbanks belonging to the same bank. Specifically, bank A control circuit 7a is arranged between subbanks 4a and 4c, bank B control circuit 7b is placed between subbanks 4b and 4d, bank C control circuit 7e is placed between subbanks 4i and 4k, and bank D control circuit 7f is placed between subbanks 4j and 4l. Internal read/write data bus 5a extending in the row direction in region 11a is connected commonly to subbanks 4a, 4b, 4i and 4j. Similarly, internal read/write data bus 5b extending in the row direction in region 11b is connected commonly to subbanks 4c, 4d, 4k and 4l.

According to the arrangement shown in FIG. 11, the configuration of subbanks 4a–4d, bank A control circuit 7a and bank B control circuit 7b is identical to that of DRAM macro 3 shown in FIG. 1. By repeatedly duplicating the configuration identical to this two-bank configuration in the row direction, DRAM macro 3 of four-bank configuration is implemented as shown in FIG. 11. The bank can be easily extended by arranging internal read/write data buses 5a and 5b of DRAM macro 3 to extend in the row direction such that the data buses do not cross the bank control circuits. A multi-bank DRAM macro having a small occupied area is thus implemented.

First Modification

Figure 12:
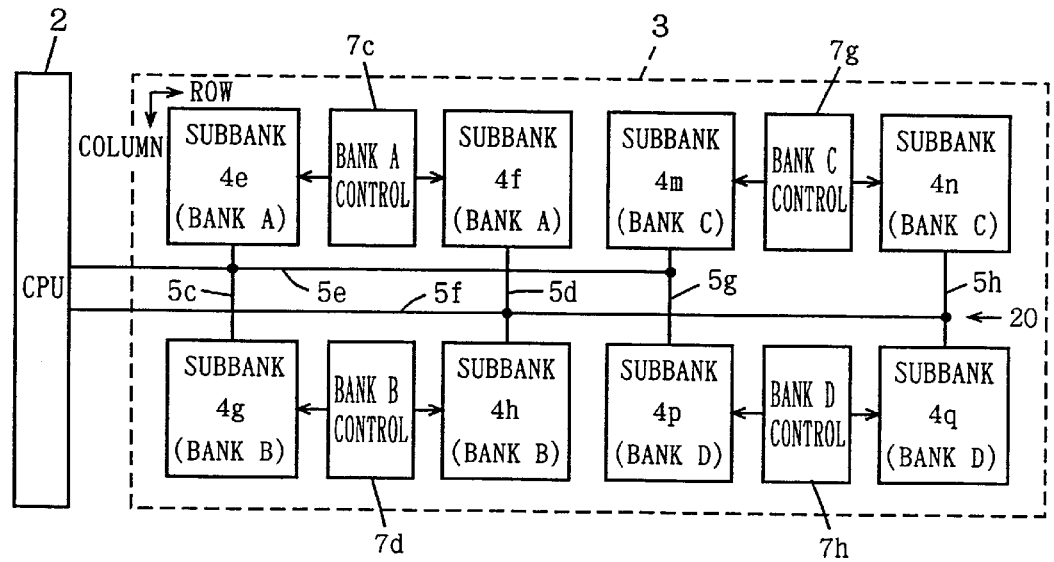
FIG. 12 schematically shows a configuration of a modification of the semiconductor integrated circuit device according to the fifth embodiment of the invention.

FIG. 12 schematically shows a configuration of the first modification of the semiconductor integrated circuit device according to the fifth embodiment. DRAM macro 3 shown in FIG. 12 includes eight subbanks 4e–4h, 4m, 4n, 4p and 4q. Those subbanks opposite to each other with respect to central region 20 in the column direction of DRAM macro 3 belong to different banks. Subbanks 4e and 4f constitute bank A, subbanks 4g and 4h constitute bank B, subbanks 4m and 4n constitute bank C, and subbanks 4p and 4q constitute bank D.

Between subbanks 4e and 4f, bank A control circuit 7c is located and bank B control circuit 7d is located between subbanks 4g and 4h. Bank C control circuit 7g is arranged between subbanks 4m and 4n, and bank D control circuit 7h is arranged between subbanks 4p an 4q. These bank control circuits control the operations of corresponding banks.

Subbanks opposite to each other about region 20 are connected to each other by the same internal read/write data bus. Specifically, subbanks 4e and 4g are coupled by internal read/write data bus 5c, subbanks 4f and 4h share internal read/write data bus 5d, subbanks 4m and 4p share internal read/write data bus 5g, and subbanks 4n and 4q share internal read/write data bus 5h. Internal read/write data buses 5c and 5g are coupled by internal data bus 5e extending in the row direction in region 20, and internal read/write data buses 5d and 5h are intercoupled by data bus 5f extending in the row direction in region 20. Data buses 5e and 5f are coupled to processor 2.

In region 20, a control bus which transmits an address signal and a control signal is provided commonly for control circuits 7c, 7d, 7g and 7h which control selection/non-selection of a bank. In FIG. 12, the control bus is not shown for simplification of the figure. The control bus is arranged extending in the row direction in region 20.

In DRAM macro 3 shown in FIG. 12, the configuration of subbanks 4e–4h, bank A control circuit 7c and bank B control circuit 7d is identical to that shown in FIG. 10. The layout of subbanks 4m, 4n, 4p and 4q, bank C control circuit 7g and bank D control circuit 7h is the same as the layout of subbanks 4e–4h, bank A control circuit 7c and bank B control circuit 7d. Accordingly, the four-bank configuration is implemented by repeatedly duplicating the layout of the two-bank configuration in the row direction.

The bank can be easily extended by arranging the internal data bus and the control bus to extend in the row direction such that the buses do not cross the bank control circuit in DRAM macro 3 and the processor.

If DRAM macro 3 shown in FIG. 1 or 10 is registered as a library, the DRAM macro as the library can be utilized to easily extend the bank (A DRAM macro as a base unit is repeatedly arranged in the row direction).

Sixth Embodiment

Figure 13:
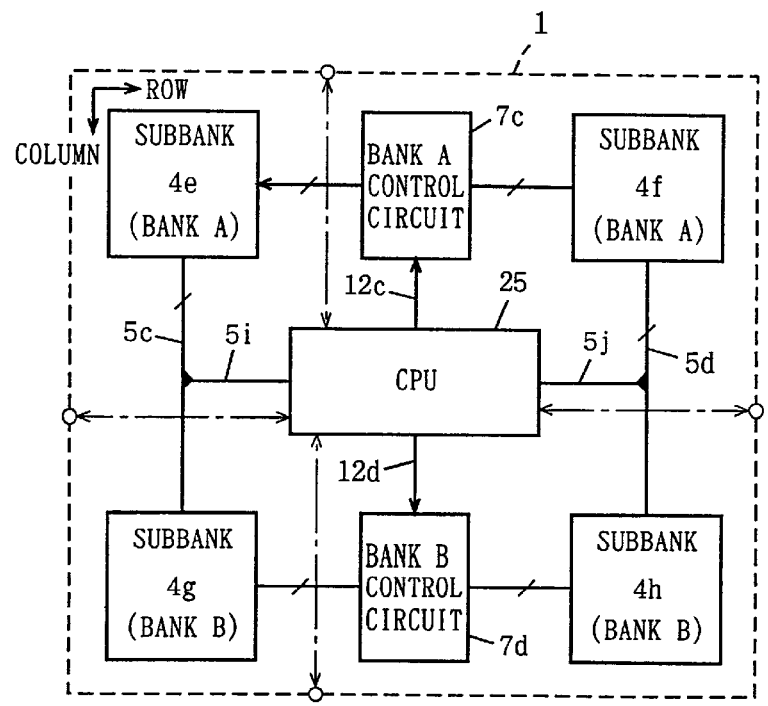
FIG. 13 schematically shows an entire configuration of a semiconductor integrated circuit device according to a sixth embodiment of the invention.

FIG. 13 schematically shows an entire configuration of a semiconductor integrated circuit device according to the sixth embodiment. Referring to FIG. 13, semiconductor integrated circuit device 1 includes a processor (CPU) 25 arranged in a central portion of a chip where semiconductor integrated circuit device 1 is formed, subbanks 4e–4h arranged corresponding to regions at the four corners of processor 25 respectively, bank A control circuit 7c arranged between subbanks 4e and 4f, and bank B control circuit 7d arranged between subbanks 4g and 4h. Subbanks 4e and 4f constitute bank A, and subbanks 4g and 4h constitute bank B.

Subbanks 4e and 4g are coupled to each other by internal read/write data bus 5c arranged in a region on the outside of processor 25, and internal read/write data bus 5c is coupled to processor 25 by internal data bus 5i. Subbanks 4f and 4h share internal read/write data bus 5d. Internal read/write data bus 5d is coupled to processor 25 via internal data bus 5j. Processor 25 supplies a control signal and an address signal to bank A control circuit 7c and bank B control circuit 7d via control buses 12c and 12d.

In the arrangement shown in FIG. 13, internal read/write data buses 5c and 5d do not cross bank A control circuit 7c and bank B control circuit 7d.

Since processor 25 is coupled to internal read/write data buses 5c and 5d via internal data buses 5i and 5j, bank A control circuit 7c, bank B control circuit 7d and processor 25 can be arranged without considering these data buses so that a DRAM containing processor in which increase of the area is suppressed is implemented. Processor 25 could supply and receive data and a control signal to and from an external unit external to integrated circuit device 1. Communication of data and the control signal between the external unit and the processor 25 is carried out using an interconnection line placed in an appropriate empty region as shown by the alternate long and short dash line in FIG. 13.

First Modification

Figure 14:
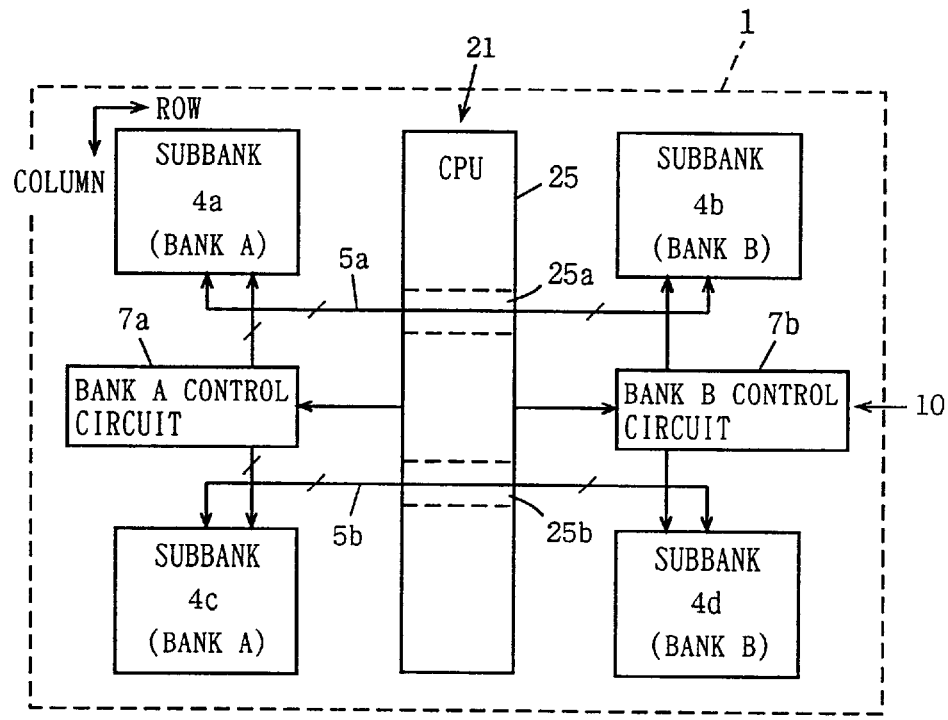
FIG. 14 schematically shows an entire configuration of a first modification of the semiconductor integrated circuit device according to the sixth embodiment.

FIG. 14 schematically shows a configuration of the first modification of the sixth embodiment. Semiconductor integrated circuit device 1 shown in FIG. 14 includes a processor 25 arranged in a region which extend in the column direction in central region 21 in the row direction. Subbanks 4a and 4b are arranged to be opposite to each other relative to processor 25, and subbanks 4c and 4d are arranged to be opposite to each other relative to processor 25 on the lower side of processor 25. In central region 10 in the column direction of semiconductor integrated circuit device 1, bank A control circuit 7a is provided between subbanks 4a and 4c, and bank B control circuit 7b is provided between subbanks 4b and 4d. Subbanks 4a and 4c constitute bank A and subbanks 4b and 4d constitute bank B.

Subbanks 4a and 4b share internal read/write data bus 5a and subbanks 4c and 4d share internal read/write data bus 5b. Internal read/write data buses 5a and 5b are arranged extending through processor 25. Processor 25 is provided with empty regions 25a and 25b for allowing internal read/write data buses 5a and 5b to pass therethrough. Although empty regions 25a and 25b have no interconnection line in the same layer as that of internal read/write data buses 5a and 5b, a transistor may be formed in these regions.

Although processor 25 should be provided with empty regions 25a and 25b, processor 25 can be arranged over the entire portion of region 21 extending in the column direction of semiconductor integrated circuit device 1 and internal components of processor 25 can be appropriately distributed. Since bank A control circuit 7a and bank B control circuit 7b are provided in region 10, there is no need to consider a crossing of internal read/write data buses 5a and 5b and these control circuits, and an efficient layout is possible to enable the components to be arranged with high density, and an area occupied by those can be reduced.

According to the arrangement shown in FIG. 14, a logic-mixed DRAM is implemented without increasing an occupied area by the circuits.

Second Modification

Figure 15:
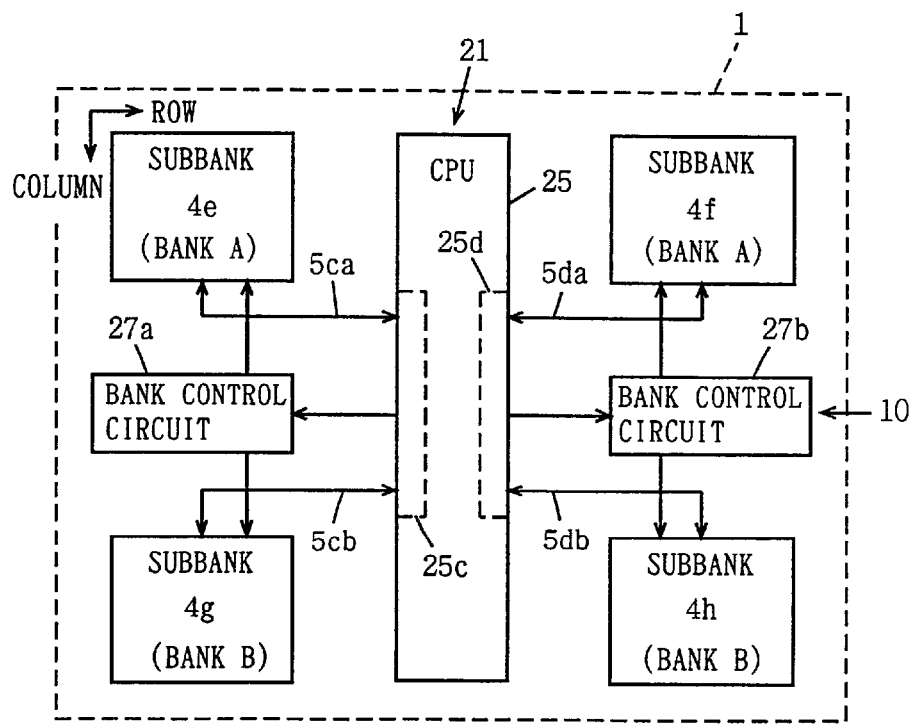
FIG. 15 schematically shows a configuration of a second modification of the semiconductor integrated circuit device according to the sixth embodiment.

FIG. 15 schematically shows a configuration of the second modification of the sixth embodiment. Referring to FIG. 15, semiconductor integrated circuit device 1 includes, as in the configuration shown in FIG. 14, processor 25 arranged to extend in the column direction in central region 21 with respect to the row direction, and subbanks 4e, 4f, 4g and 4h respectively arranged in four regions divided by processor 25 and region 10. Subbanks 4e and 4f opposite to each other relative to processor 25 constitute bank A and subbanks 4g and 4h opposite to each other relative to processor 25 constitute bank B. In region 10, bank control circuit 27a is placed between subbanks 4e and 4g and bank control circuit 27b is placed between subbanks 4f and 4h. Bank control circuits 27a and 27b respectively control access operation to banks A and B according to an address signal and a control signal supplied from processor 25.

Subbank 4e is coupled to processor 25 via internal read/write data bus 5ca, subbank 4f is coupled to processor 25 via internal read/write data bus 5da, and subbanks 4g and 4h are coupled to processor 25 respectively via internal read/write data buses 5cb and 5db. Since internal read/write data buses 5ca and 5cb alternatively supply and receive valid data, those are connected to each other in an interconnection region 25c in processor 25. Since internal read/write data buses 5da and 5db transfer data of banks A and B respectively, they are coupled to each other in an interconnection region 25d of processor 25. Since internal read/write data buses 5ca and 5da simultaneously transfer valid data, internal read/write data buses 5ca and 5da are not required to be connected to each other and not required to cross processor 25. Further, since internal read/write data buses 5cb and 5db transfer data of bank B and simultaneously transfer valid data, there is no need to arrange internal read/write data buses 5cb and 5db crossing over processor 25 for interconnection thereof.

Processor 25 is arranged in region 21 extending in the column direction of semiconductor integrated circuit device 1. By providing interface sections in interconnection regions 25c and 25d, other circuit portions (e.g. register, arithmetic logic operation circuit, and the like) can be appropriately distributed so that an influence of these interconnection regions 25c and 25d on the layout of processor 25 can be sufficiently suppressed. Bank control circuits 27a and 27b each should drive both of bank A and bank B and the area occupied by the control circuits increases compared with the configuration in which banks A and B are each driven by the dedicated control circuits. However, there exists no crossing of the control circuits and internal read/write data buses 5ca, 5cb, 5da and 5db, the layout can be optimized without considering the crossing and increase of the occupied area of the circuits can be limited to the minimum.

It is noted that in the configuration shown in FIG. 15, interconnection regions 25c and 25d may be provided outside processor 25.

According to the sixth embodiment of the invention as described above, since the processor is provided in a region between subbanks and the bank control circuit is arranged such that it does not cross the internal read/write data bus, increase of the area can be limited to the minimum.

Seventh Embodiment

Figure 16:
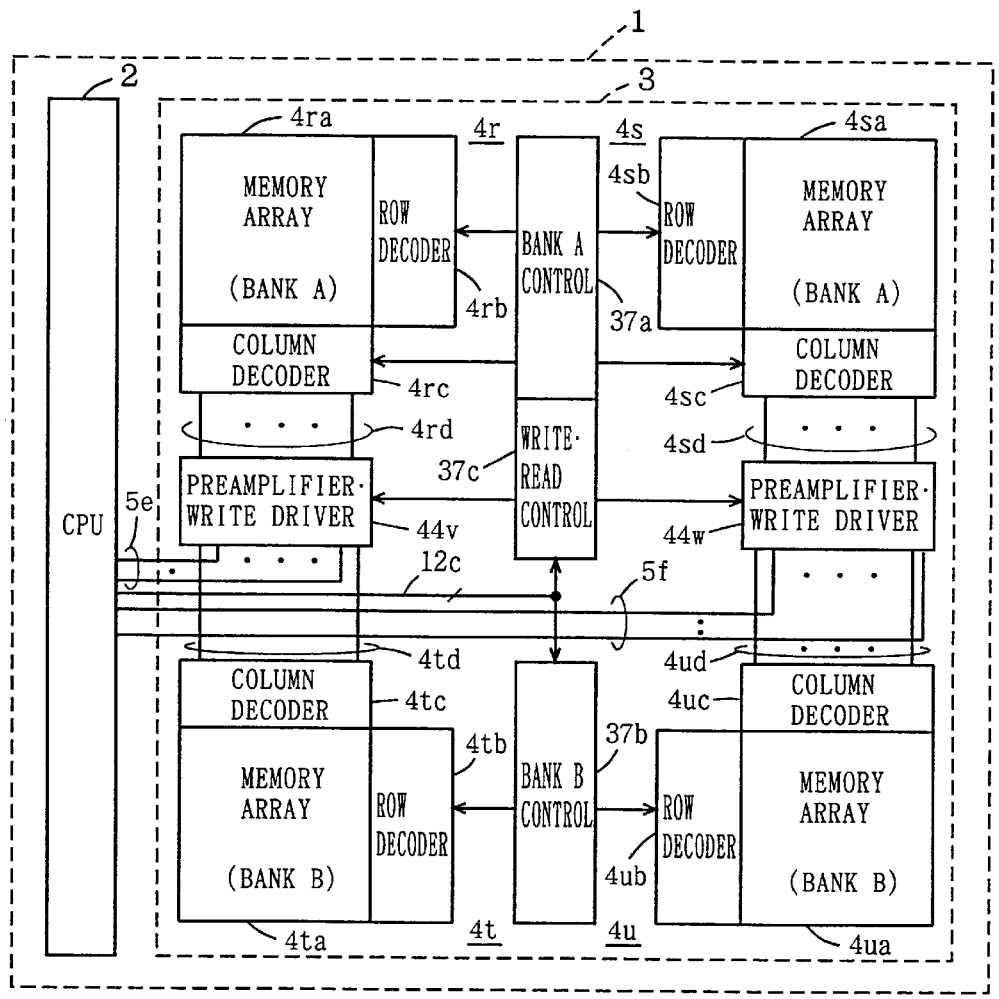
FIG. 16 schematically shows an entire configuration of a semiconductor integrated circuit device according to a seventh embodiment.

FIG. 16 schematically shows an entire configuration of a semiconductor integrated circuit device according to the seventh embodiment. Semiconductor integrated circuit device 1 shown in FIG. 16 includes processor (CPU) 2 and DRAM macro 3. DRAM macro 3 contains four subbanks 4r, 4s, 4t and 4u. Subbank 4r includes a memory array 4ra having a plurality of dynamic memory cells arranged in rows and columns, a row decoder 4rb for selecting a row in memory array 4ra, and a column decoder 4rc for selecting a column in memory array 4ra. Subbank 4s arranged in alignment with subbank 4r in the row direction includes a memory array 4sa, a row decoder 4sb and a column decoder 4sc. Subbank 4u arranged in alignment with subbank 4s in the column direction includes a memory array 4ua, a row decoder 4ub, and a column decoder 4uc. Subbank 4td arranged in alignment with subbank 4u in the row direction includes a memory array 4ta, a row decoder 4tb and a column decoder 4tc.

A preamplifier.write driver block 44v for writing and reading internal data into and from subbanks 4r and 4t is provided commonly for them, and a preamplifier.write driver block 44w is provided commonly for subbanks 4s and 4u.

Subbanks 4r and 4s constitute bank A and subbanks 4t and 4u constitute bank B. Preamplifier.write driver blocks 44v and 44w are selectively coupled to a selected bank when data is written/read. Preamplifiere.write driver block 44v is coupled to a selected memory cell of memory array 4ra of subbank 4r via an internal IO bus 4rd, and coupled to a selected memory cell of memory array 4ta of subbank 4t via an internal IO bus 4td. Preamplifier.write driver block 44w is coupled to a selected memory cell of memory array 4sa of subbank 4s via an internal IO bus 4sd, and coupled to a selected memory cell in memory array 4ua of subbank 4u via an internal IO bus 4ud. Preamplifiere.write driver block 44v is coupled to processor 2 via internal data bus 5e extending in the row direction, and preamplifier.write driver block 44w is coupled to processor 2 via internal data bus 5f extending in the row direction.

A bank A control circuit 37a is arranged in a region between subbanks 4r and 4s, a write.read control circuit 37c is arranged between preamplifier.write driver blocks 44v and 44w, and a bank B control circuit 37b is arranged between subbanks 4t and 4u. An address signal and a control signal from processor 2 is supplied to control circuits 37a–37b via control bus 12c. Control circuits 37a–37c do not cross internal read/write data buses 5e and 5f. Accordingly, layout of control circuits 37a–37c with an efficient use of the area is possible. Further, since banks A and B share preamplifier.write driver blocks 44v and 44w, an occupied area of the circuits can be dramatically reduced. Particularly, internal IO buses 4rd, 4sd, 4td and 4ud have large bit width of 64 to 512 bits, and therefore the number of preamplifier circuits and write drive circuits included in preamplifier.write driver blocks 44v and 44w can be significantly reduced and an occupied area of the circuits can be significantly decreased.

Configuration of Preamplifier.Write Driver Block

Figure 17:
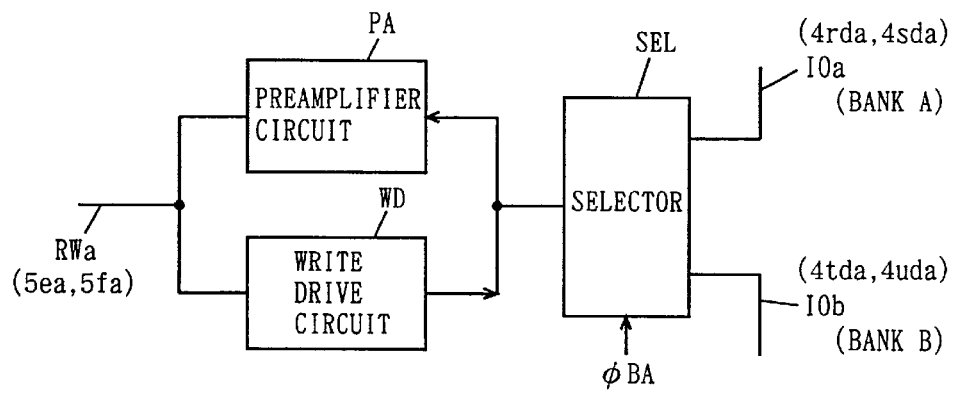
FIG. 17 schematically shows a configuration of a preamplifier.write driver block shown in FIG. 16.

FIG. 17 schematically shows a configuration of a one bit circuit portion, included in preamplifier.write driver blocks 44v and 44w shown in FIG. 16, for an internal read/write data bus line RWa (5ea or 5fa). In FIG. 17, the one bit circuit of preamplifier.write driver blocks 44v and 44w includes a preamplifier circuit PA which is coupled to internal read/write data bus line RWa, amplifies an internal data signal supplied upon activation thereof and outputs the amplified signal, a write drive circuit WD which is coupled to internal read/write data bus line RWa, amplifies data on bus line RWa upon activation thereof and outputs the data, and a selector SEL which selectively connects preamplifier circuit PA and write drive circuit WD to an internal IO bus line IOa (4rda or 4sda) of bank A and an internal IO bus line IOb (4tda or 4uda) of bank B according to a selection signal φBA.

Selection signal XBA is generated according to a bank address signal when data is written/read. When bank A is selected, selector SEL couples preamplifier circuit PA and write drive circuit WD to internal IO bus line IOa. When bank B is designated, selector SEL couples preamplifier circuit PA and write drive circuit WD to internal IO bus line IOb. Selector SEL may be constituted of, for example, a CMOS transmission gate and separates an internal IO bus line of a bank which is not selected from preamplifier circuit PA and write drive circuit WD. Accordingly, even if preamplifier circuit PA and write drive circuit WD are shared between two banks A and B, data can be written or read into or from a selected bank accurately.

First Modification

Figure 18:
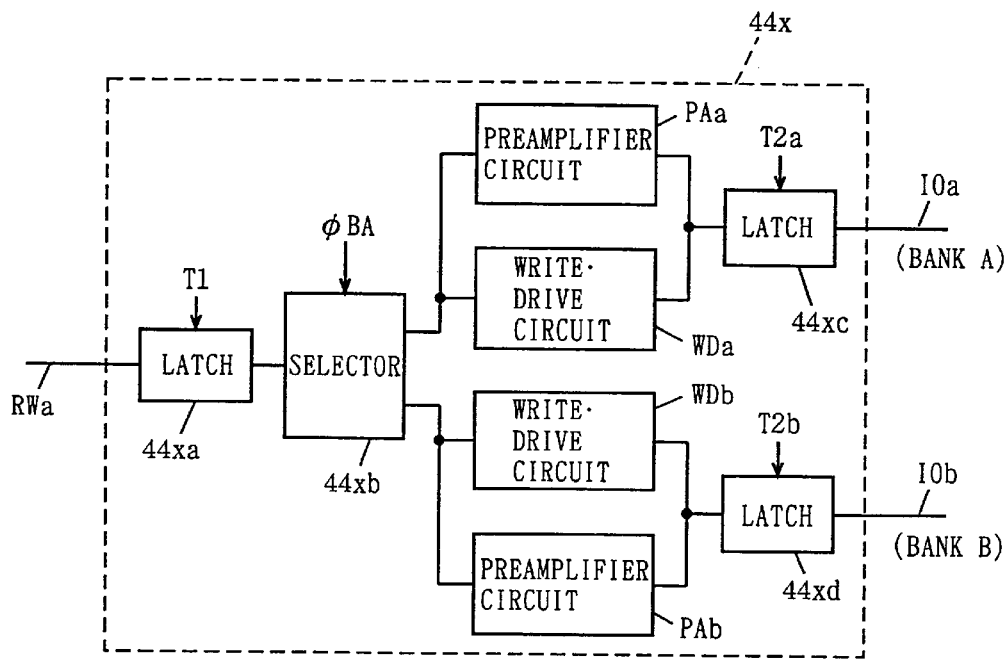
FIG. 18 schematically shows a configuration of a first modification of the preamplifier.write driver block shown in FIG. 16.

FIG. 18 illustrates a configuration of the first modification of the preamplifier.write driver block of the seventh embodiment of the invention. FIG. 18 shows one (44x) of preamplifier.write driver blocks 44v and 44w shown in FIG. 16. A configuration of a portion for transfer of one bit data in preamplifier.write driver block 44x is representatively shown.

Referring to FIG. 18, preamplifier.write driver block 44x includes a preamplifier circuit PAa for amplifying data read from bank A (corresponding subbank), a write.drive circuit WDa generating internal write data to be written into a selected memory cell for bank A, a preamplifier circuit PAb provided for bank B (corresponding subbank) for amplifying data of a selected memory cell of bank B upon activation thereof, and a write.drive circuit WDb generating data to be written into a selected memory cell of bank B.

Preamplifiere.write driver block 44x further includes a bidirectional latch 44xa latching a supplied data responsive to clock signal T1, a selector 44xb selecting one of a set of preamplifier circuit PAa and write.drive circuit WDa and a set of preamplifier circuit PAb and write.drive circuit WDb and couples the selected one to latch 44xa according to bank designation signal φBA, a bidirectional latch 44xc coupled to preamplifier circuit PAa and write.drive circuit WDa for latching a supplied data responsive to clock signal T2a, and a bidirectional latch 44xd coupled to preamplifier circuit PAb and write.drive circuit WDb which is set in a latching state responsive to clock signal T2b. Latch 44xc is connected to internal IO bus line IOa of bank A (corresponding subbank), and latch 44xd is connected to internal IO bus line IOb of bank B (corresponding subbank).

Clock signals T1, T2a and T2b define an internal data transfer cycle. Suppose that a synchronous DRAM is provided as a DRAM implemented by the DRAM macro, which operates in synchronization with a clock signal (e.g. a system clock signal which defines an operation speed of the processor). In the synchronous DRAM, incorporation of a control signal as well as input/output of data are carried out in synchronization with the clock signal. Timing margin for the control signal may be considered relative to the clock signal only, and skew between control signals needs not to be considered and an internal operation can be started at a faster timing. Since writing/reading of data is executed synchronously with the clock signal, writing/reading of data as well as transfer of data at a high speed are possible.

In some synchronous DRAM, a path through which internal data is transferred is constituted of a plurality of pipeline stages and data is transferred in a pipelined manner through the internal data transfer path to increase transfer rate of data effectively. In this case, the pipeline stages are implemented with latches 44xa, 44xc and 44xd shown in FIG. 18.

Clock signal T2a is driven into an active state when bank A is designated, and clock signal T2b is activated when bank B is selected. When data is read, data latched by the sense amplifier is selected by the column decoder and transmitted to a corresponding internal IO bus line. When data is latched by latch 44xc or 44xd, preamplifier circuit PAa or PAb is activated and the data is transferred to latch 44xa via selector 44xb. When latch 44xa transfers the latched read data onto internal read/write data bus line RWa, preamplifier PAa or PAb again amplifies data supplied from latch 44xc or 44xd. Accordingly, in one clock cycle, data are present respectively on internal IO bus line IOa or IOb, preamplifier circuit PAa or PAb, and internal read/write data bus line RWa. Transfer rate of data is increased by transferring data successively every clock cycle.

Selector 44xb which selects bank A or bank B responsive to bank designation signal φBA allows the banks A and B to share latch 44xa in preamplifier.write driver block 44x. Therefore, it is not necessary to provide latch 44xa to each of banks A and B in the pipeline configuration, and reduction of the number of components as well as reduction of an occupied area of the circuits are possible. Internal read/write data bus lines 5e and 5f shown in FIG. 16 are shared by banks A and B. Therefore, an additional latch may be provided in this portion and the number of pipeline stages may be increased.

In the configuration shown in FIG. 18, latches 44xa, 44xc and 44xd are described as bidirectional latches. However, these latches 44xa, 44xc and 44xd may be respectively provided for writing of data and reading of data separately. Latches 44xa, 44xc and 44xd may include transfer gates and inverter latches, and an equivalently unidirectional latch may be implemented by making the timings of conduction/non-conduction of the transfer gates of an input/output portion of the inverter latch different in writing of data and in reading of data.

Second Modification

Figure 19:
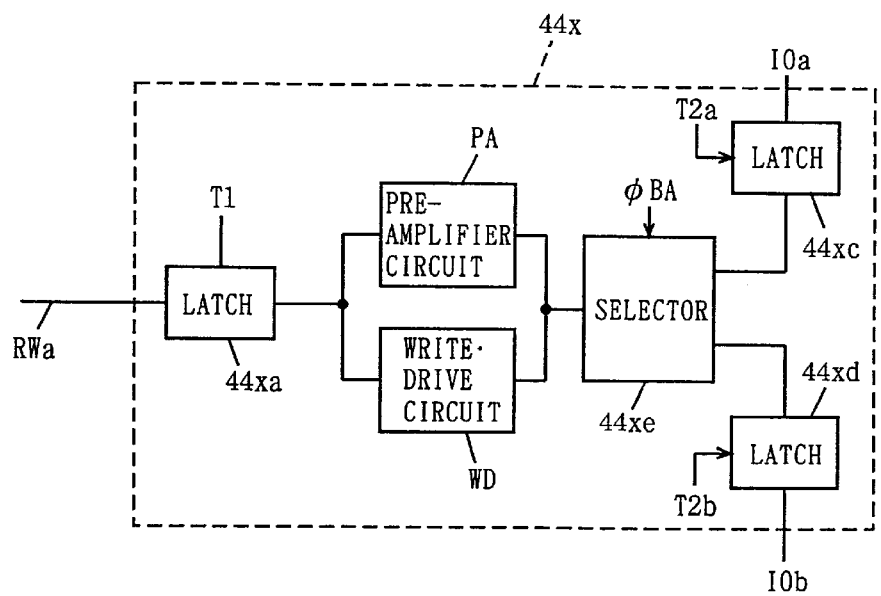
FIG. 19 schematically shows a configuration of a second modification of the preamplifier.write driver block shown in FIG. 16.

FIG. 19 illustrates a configuration of the second modification of the preamplifier.write driver block of the seventh embodiment. A configuration of a portion provided for one bank out of the preamplifier.write driver blocks shown in FIG. 16 is illustrated in FIG. 19. In FIG. 19, preamplifier-.write driver block 44x includes a preamplifier circuit PA and a write drive circuit WD provided commonly to banks A and B (corresponding subbanks), latch 44xa provided between preamplifier circuit PA and write drive circuit WD, and internal read/write data bus line RWa and responsive to clock signal T1 to attain a latching state, latch 44xc connected to internal IO bus line IOa and responsive to clock signal T2a to attain the latching state, and latch 44xd connected to internal data bus line IOb and responsive to clock signal T2b to attain the latching state, and a selector 44xe responsive to bank designation signal φBA to connect one of latches 44xc and 44xd to preamplifier circuit PA and write drive circuit WD. Configurations of latches 44xa, 44xc and 44xd are identical to those shown in FIG. 18.

According to the configuration of preamplifier.write driver block 44x of FIG. 19, preamplifier circuit PA, write.drive circuit WD and latch 44xa are shared by banks A and B. Therefore, the configuration shown in FIG. 19 accomplishes further reduction of an occupied area by the circuits compared with the configuration of FIG. 18. The operation of preamplifier.write driver block 44x of FIG. 19 is the same as the circuit operation shown in FIG. 18. The only difference is that preamplifier circuit PA and write.drive circuit WD are in the active state when data is read and written, whichever bank of bank A and bank B is selected.

Third Modification

Figure 20:
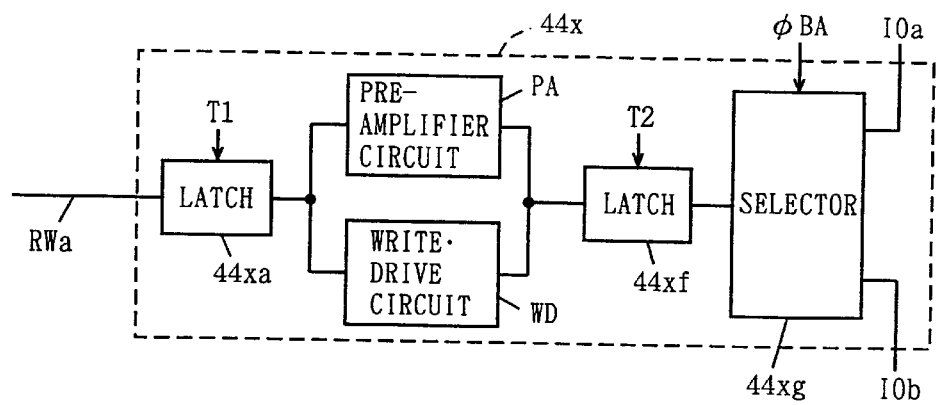
FIG. 20 schematically shows a configuration of a third modification of the preamplifier.write driver block shown in FIG. 16.

FIG. 20 schematically shows a configuration of the third modification of the seventh embodiment. In FIG. 20, one preamplifier.write driver block 44x is representatively illustrated. In the configuration of FIG. 20, a circuit portion for transferring one bit data is shown. In FIG. 20, preamplifier.write driver block 44x includes latch 44xa connected between preamplifier circuit PA and write.drive circuit WD, and internal read/write data bus line RWa and responsive to clock signal T1 to attain the latching state, latch 44xf connected to preamplifier circuit PA and write.drive circuit WD and responsive to clock signal T2 to attain the latching state, and selector 44xg which connects latch 44xf to one of internal IO bus lines IOa and IOb according to bank designation signal φBA.

According to the configuration of preamplifier.write driver block 44x shown in FIG. 20, latches 44xa and 44xf, preamplifier circuit PA and write.drive circuit WD are shared by banks A and B. As a result, the circuit configuration of FIG. 20 accomplishes further reduction of an occupied area by the circuits compared with the preamplifier.write driver block of FIG. 19.

Depending on the location of the critical path in the pipeline stage regarding data transfer rate, one of the preamplifier.write driver blocks shown in FIGS. 18 to 20 is appropriately selected. If a data transfer path from the memory array to the preamplifier is the critical path, the preamplifier circuit and write.drive circuit are provided as close as possible to the sense amplifier to shorten the length of internal data bus line IO as shown in FIG. 18. In this case, the configuration illustrated in FIG. 18 is employed. On the other hand, if the data transfer path from the preamplifier and the write.drive circuit to the data input/output section is the critical path, the configuration of FIG. 20 is employed to shorten the length of the internal read/write data bus RWa as much as possible.

It is noted that in the configurations of FIGS. 19 and 20, latches 44xa, 44xc, 44xd, and 44xf may be separately provided for reading of data and for writing of data.

According to the seventh embodiment of the invention, those subbanks facing to each other in the column direction are allocated to different banks and share the preamplifier-.write driver block, so that an occupied area by the circuits can be dramatically decreased. Since the bank control circuit is provided between subbanks of the same bank arranged in alignment with each other in the row direction, the internal read/write data bus line and the control circuit never cross to achieve an efficient layout of the bank control circuit.

Eighth Embodiment

Figure 21:
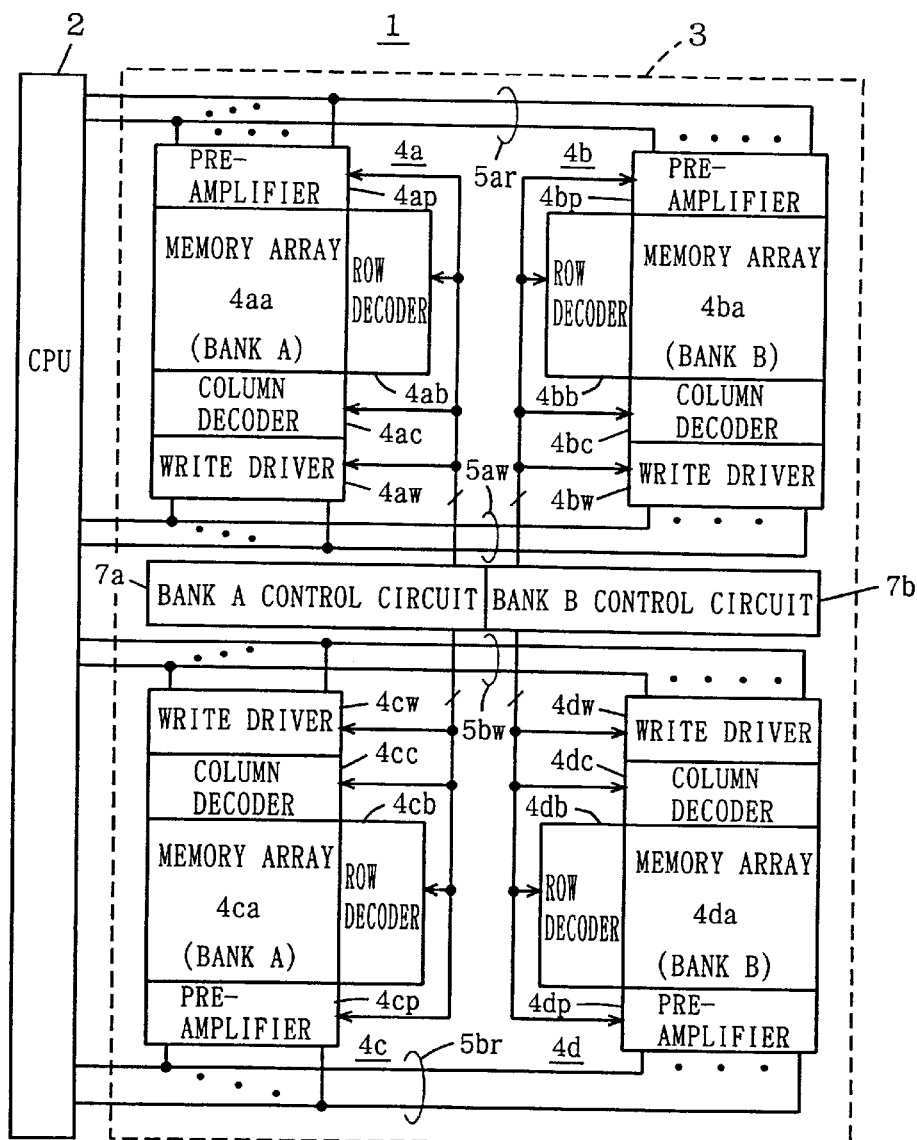
FIG. 21 schematically shows an entire configuration of a semiconductor integrated circuit device according to an eighth embodiment of the invention.

FIG. 21 shows schematically an entire configuration of a semiconductor integrated circuit device according to the eighth embodiment. Semiconductor integrated circuit device 1 shown in FIG. 21 includes processor (CPU) 2 and DRAM macro 3. DRAM macro 3 includes four subbanks 4a, 4b, 4c and 4d. Subbanks 4a and 4c constitute bank A and subbanks 4b and 4d constitute bank B. In the eighth embodiment, in each of subbanks 4a14 4d, a write driver for writing internal data into a selected memory cell and a preamplifier for reading data from a selected memory cell are separately provided. Specifically, a write driver 4aw is arranged adjacent to a column decoder 4ac placed at one end of a memory array 4aa in subbank 4a, and preamplifier 4ap is arranged opposite to column decoder 4ac and write driver 4aw at the other end of memory array 4aa in subbank 4a. Similarly in subbank 4b, a column decoder 4bc and a write driver 4bw are arranged at one end of memory array 4ba, and a preamplifier 4bp is arranged opposite to column decoder 4bc and write driver 4bw at the other end of memory array 4ba.

In subbank 4c, a column decoder 4cc and a write driver 4cw are placed at one end of memory array 4ca, and a preamplifier 4cp is arranged at the other end of memory array 4ca. In subbank 4d, a column decoder 4dc and a write driver 4dw are arranged opposite to preamplifier 4dp relative to a memory array 4d.

In a central region with respect to the column direction of DRAM macro 3, bank A control circuit 7a and bank B control circuit 7b are arranged. An internal write data bus 5aw is arranged in a region between control circuits 7a and 7b and subbanks 4a and 4b, and is extended in the row direction to be coupled commonly to write drivers 4aw and 4bw, and an internal read data bus 5ar is arranged at the periphery of DRAM macro 3 in the row direction to be commonly coupled to preamplifiers 4ap and 4bp.

For subbanks 4c and 4d, an internal write data bus 5bw commonly coupled to write drivers 4cw and 4dw as well as an internal read data bus 5br commonly coupled to preamplifier 4cp and preamplifier 4dp are provided. These buses extend in the row direction and are coupled to processor 2 provided on the outside of DRAM macro 3. Processor 2 provides an address signal and a control signal to bank A control circuit 7a and bank b control circuit 7b via a control bus (not shown).

As shown in FIG. 21, since the write driver is located adjacent to the column decoder and the preamplifier is located opposite to the column decoder, when data is read from a selected memory cell, the time required for reading of data from a selected memory cell which is most distant from the column decoder can be made equal to the time required for reading data from a selected memory cell which in turn is closest to the column decoder, and high speed reading becomes possible. The high speed reading is now described below.

Figure 22:
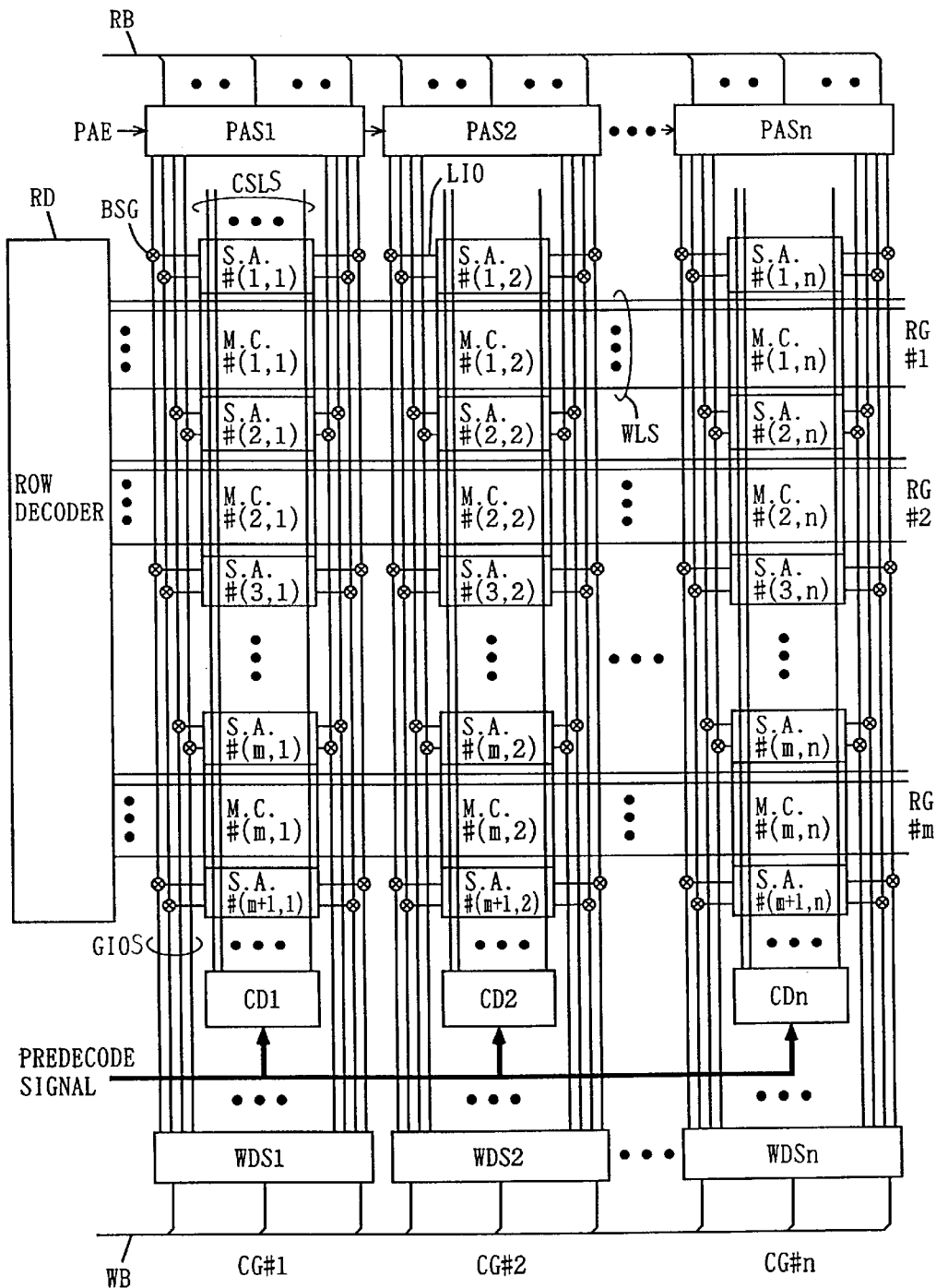
FIG. 22 specifically shows a configuration of one subbank of the semiconductor integrated circuit device shown in FIG. 21.

FIG. 22 schematically shows a configuration of one subbank. In FIG. 22, a memory array includes a plurality of subarray blocks MC#(1, 1)–MC#(m, n) arranged in rows and columns. Each of subarray blocks MC#(1,1)–MC#(m, n) includes dynamic memory cells arranged in rows and columns. Subarray blocks MC#(i, 1)–MC#(i, n) arranged in alignment with each other in the row direction constitute a row block RG#i, and memory subarray blocks MC#(1, j)–MC#(m, j) arranged in alignment with each other in the column direction constitute a column block CG#j. The memory array is divided into row blocks RG#1–RG#m in the column direction and divided into column blocks CG#1–CG#n in the row direction. A group of word lines WLS is commonly provided for memory subarray blocks MC#(i, 1)–MC#(i, n) included in row block RG#i, and a group of column selection lines CSLS is provided commonly for subarray blocks MC#(1, j)–MC#(m, j) of column group CG#j.

Corresponding to memory subarray blocks MC#(1, 1)–MC#(m,n), sense amplifier bands SA#(1, 1)–SA#(m+1, n) are arranged to be shared between adjacent memory subarray blocks. Each of sense amplifier bands SA#(1, 1)–SA#(m+1, n) includes a sense amplifier circuit provided corresponding to each column in a corresponding memory subarray block, and senses and amplifies memory cell data on a corresponding column upon activation thereof, and an IO gate which selects a column in a corresponding memory subarray block in accordance to column selection line CSL included in the group of column selection lines CSLS.

The memory array shown in FIG. 22 has a configuration of the shared sense amplifier in which only a subarray block including a selected memory cell is coupled to a corresponding sense amplifier band and sensing and amplification of data are carried out. A subarray block which constitutes a pair with a selected subarray block (the block sharing a sense amplifier) is separated from a corresponding sense amplifier band. Remaining memory subarray blocks that are not selected keep a precharge state and are connected to corresponding sense amplifier bands. Accordingly, upon array activation (when word line is selected), a non-selected subarray block which constitutes a pair with a selected memory block is separated from a corresponding sense amplifier band, and only a sense amplifier band provided corresponding to the selected subarray block is activated.

Row decoder RD selects one row group out of row blocks RG#1–RG#m, and drives one word line WL out of the group of word lines WLS included in the selected row group into a selected state.

Column decode circuits CD1–CDn are provided respectively corresponding to column groups CG#1–CG#1n. Column decode circuits CD1–CDn simultaneously each drive a prescribed number of column selection lines CSL of corresponding group of column selection lines CSLS into the selected state. In FIG. 22, 8-bit memory cells are simultaneously selected in one subarray block. One column selection line CSL may select eight columns in the subarray block, or one column selection line CSL may select two columns in a corresponding memory subarray block, and four column selection lines CSL may be simultaneously driven into the selected state.

When this column selecting operation is carried out, the column selecting operation is executed in each of column groups CG#1–CG#n.

Each of sense amplifier bands SA#(1,1)–SA#(m+1, n) is coupled to a local IO bus line pair LIO via a corresponding IO gate. Local IO bus line pairs LIO are provided corresponding to memory subarray blocks respectively. In FIG. 22, a configuration is shown as one example in which four IO bus line pairs LIO are connected to one sense amplifier band, and four-bit memory cell data is read from one sense amplifier band.

Global IO buses GIOS are provided corresponding to respective column groups CG#1–CG#n and extend in the column direction. In FIG. 22, global IO bus GIOS includes eight global IO line pairs GIO in each of column groups CG#1–CG#n. Global IO bus GIOS is coupled to each local IO bus line pair LIO of a corresponding column group via block selection gates BSG. Global IO buses GIOS are coupled to a group of write drive circuits WDS1–WDSn as well as a group of preamplifier circuits PAS1–PASn arranged opposite to each other on both sides of the memory array.

Each of write drive circuits WDS1–WDSn includes a write drive circuit which is provided corresponding to each global IO line pair of global IO bus GIOS and amplifies data supplied via internal write data bus WB upon activation thereof and transmits the amplified data onto a corresponding global IO line pair. Each of preamplifier circuits PAS1–PASn includes a preamplifier circuit which is provided corresponding to each global IO line pair of global IO bus GIOS and is activated upon activation of preamplifier activation signal PAE, to amplify potentials of signals on a corresponding global IO line pair for reading onto internal read data bus RB. Write drive circuits included in write drive circuits WDS1–WDSn are all simultaneously activated when data is written, and preamplifier circuits included in preamplifier circuits PAS1–PASn are all simultaneously activated when data is read. An operation is now briefly described.

Row decoder RD decodes a row address signal (or row predecode signal) (not shown), selects one row group of row groups RG#1–RG#m, and drives one word line WL of word line group WLS included in the selected row group into a selected state. Accordingly, local IO line pair LIO provided corresponding to a selected row block is connected to a corresponding global IO line pair, and data of a memory cell connected to the selected word line WL in the selected row group RG#i is read onto a corresponding column.

Sense amplifier bands SA#(i, 1)–SA#(i, n) and SA#(i+1, 1)–SA#(i+1, n) provided for the selected row group RG#i are coupled to corresponding subarray blocks MC#(i, 1)–MC#(i,n). Row group RG#(i+1) which shares a sense amplifier band with the selected row group RG#i and a subarray block included in row block RG#(i–1) are separated from a corresponding sense amplifier band. Remaining row groups that are not selected are maintained in a precharge state (non-activation state). Sense amplifier bands SA#(i, 1)–SA#(i, n) and SA#(i+1, 1)–SA#(i, n) are then activated, and data of a memory cell connected to the selected word line WL of selected row group RG#i is sensed, amplified, and latched. A column selecting operation for writing or reading data is next carried out.

When the column selecting operation is executed, column decode circuits CD1–CDn each decode a column address signal (predecode signal), and drive a prescribed number of column selection line(s) CSL of a corresponding column selection line group CSLS into a selected state. Responsively, IO gate included in the sense amplifier band is rendered conductive and couples a column in a corresponding memory subarray block to a local IO line pair LIO. Local IO line pair LIO provided for a selected row group RG#i is coupled to global IO line pair GIO of a corresponding global IO bus GIOS via block selection gate BSG. A selected memory cell column in each of column groups CG#1–CG#n is connected to a corresponding global IO bus GIOS. When data is written, write drive circuit group WDS1–WDSn is activated, and data is written into a selected memory cell via global IO bus GIOS. When data is read, preamplifier circuit group PAS1–PASn is activated, and memory cell data read onto global IO bus GIOS is amplified to be transferred onto internal read data bus RB. Accordingly, data of 32 bits to 256 bits is collectively written/read.

A reason for high speed reading achieved by arranging preamplifier circuit group PAS1–PASn opposite to column decoder circuits CD1–CDn is described below.

Figure 23:
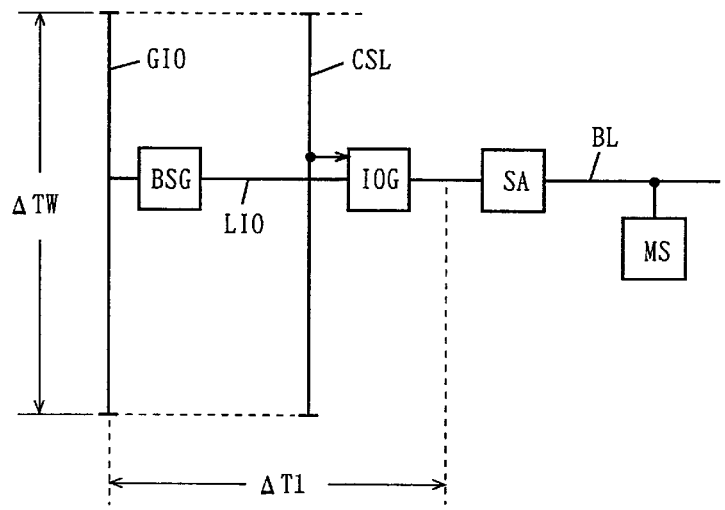
FIG. 23 shows propagation delay time of read memory cell data signal in the subbank structure shown in FIG. 22.

FIG. 23 shows delay time of interconnection line of each signal line in connection with reading of data. Global IO line pair GIO generates delay time ATW when a signal is propagated from one end to the other end thereof. Column selection line CSL also generates the same interconnection line delay ΔTW when a column selection signal from a column decode circuit is propagated from one end to the other end thereof. When data is read, data latched by sense amplifier SA is transferred to local IO line pair LIO via IO gate IOG which is rendered conductive in response to a column selection signal on column selection line CSL, and the data on local IO line pair is transferred to global IO line pair GIO via block selection gate BSG.

When a column is selected, sense amplifier SA has already amplified and latched data stored in memory cell MS, and potential of a signal on bit line BL (or /BL) is maintained at a potential level corresponding to that of stored data. Suppose that interconnection line delay of ΔT1 is generated at a path through which a signal is propagated via IO gate IOG, local IO line pair LIO and block selection gate BSG when a column is selected.

If the preamplifier and the column decoder are provided on the same side, interconnection line delay time of global IO line pair GIO needs not be considered when a sense amplifier band closest to the column decoder (sense amplifier columns SA#(m+1, 1)–SA#(m+1, n) of FIG. 22) is selected, and data of a memory cell is transmitted to the preamplifier with delay time ΔT1. If a sense amplifier band most distant from the column decoder (sense amplifier bands SA#(1, 1)–SA#(1, n) of FIG. 22) is selected, a column selection signal arrives after delay time ΔTW has passed and column selecting operation is carried out. After the column selecting operation, memory cell data reaches the preamplifier via global IO line pair GIO after interconnection line delay ΔTW has passed. In this case, a delay time of ΔT1+2·ΔTW is required from rising of a signal at an output section of the column decoder to arrival of memory cell data at the preamplifier.

In other words, there is a time difference of 2·ΔTW for memory cell data to reach the preamplifier between a case in which a sense amplifier band closest to the column decoder is selected and a case in which a sense amplifier band most distant from the column decoder is selected. The preamplifier should be activated when data on global IO line pair is in a definite state. In this case, timing of the activation is determined according to the worst case. Therefore, the preamplifier cannot be activated until time of 2·ΔTW+ΔT1 has passed after rising of a signal at the output section of the column decoder.

In order for the preamplifier to execute amplifying operation accurately, the preamplifier should be maintained in the active state for a certain period. Therefore, a signal on column selection signal line CSL should be maintained in the active state such that data on global IO line is in a defined state when the preamplifier is in the active state. In this case, time period of 2·ΔTW+ΔTp or more is required as an activation period for column selection signal line CSL. ΔTp indicates a minimum activation period necessary for the preamplifier.

Figure 24:
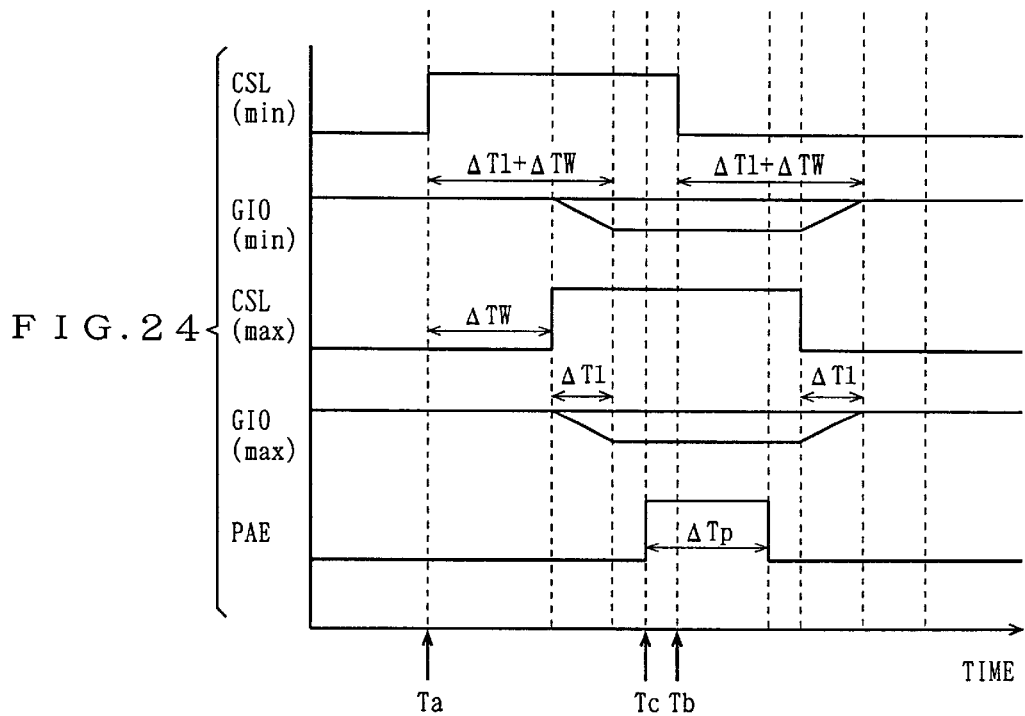
FIG. 24 is a timing chart representing data reading operation in the subbank structure shown in FIG. 22.

Referring to FIG. 24, reading operation carried out when a preamplifier is arranged opposite to a column decoder is described. In FIG. 24, GIO (min) indicates a waveform of an input portion of the preamplifier when a sense amplifier band closest to the column decoder is selected, and GIO (max) indicates a waveform of the preamplifier when a sense amplifier band most distant from the column decoder is selected. CSL (min) indicates a signal waveform for, when a sense amplifier band closest to the column decoder is selected, the selected sense amplifier band, and CSL (max) indicates a column selection signal which reaches, when a sense amplifier band most distant from the column decoder is selected, the selected sense amplifier band. PAE is a preamplifier activation signal.

At time Ta, an output from the column decoder is in a defined state and potential of a corresponding column selection signal for a selected column rises. If a sense amplifier band closest to the column decoder (sense amplifier columns SA#(m+1, 1)–SA#(m+1, n)) is selected, there is no interconnection line delay for the column selection signal and column selection signal CSL (min) for the closest sense amplifier band rises at time Ta. Data held by the selected sense amplifier band is transmitted to global IO line pair GIO via local IO line pair. When data of a memory cell is transmitted to global IO line pair, delay time ΔT1 is required. Next a sense amplifier band most distant from the preamplifier is selected, and memory cell data reaches the preamplifier after interconnection line delay time ΔTW. Accordingly, input signal GIO (min) for the preamplifier attains a definite state after time ΔT1+ΔTW has passed from time Ta.

When an output from the column decoder falls at time Tb, column selection signal CSL (min) for the closest sense amplifier band is responsively inactivated. Input GIO (min) of the preamplifier returns to a prescribed precharge potential level after time ΔT1+ΔTW has passed from time Tb.

If a signal of an output portion of the column decoder rises at time Ta and a sense amplifier band most distant from the column decoder is selected, column selection signal CSL (max) for the most distant sense amplifier band is activated after delay time ATW has passed. Next, memory cell data selected by column selection signal CSL (max) is transmitted onto global IO line pair GIO after delay time ΔT1 has passed. The sense amplifier band most distant from the column decoder is a sense amplifier band closest to the preamplifier and interconnection line delay of global IO line pair can be ignored. Therefore, memory cell data signal GIO (max) for the preamplifier attains a definite state after time ΔTW+ΔT1 has passed from time Ta.

For the input portion of the preamplifier, delay time when a sense amplifier band most distant from the column decoder is selected equals to delay time when a sense amplifier band closest to the column decoder is selected. In other words, for the preamplifier, read data is supplied at the same timing regardless of the position of the selected sense amplifier band. Preamplifier activation signal PAE is activated whenever an input signal of the preamplifier is in a definite state whichever sense amplifier band is selected. Accordingly, preamplifier activation signal PAE can be activated at time Tc shown in FIG. 24. The preamplifier should complete its amplifying operation before time Tb+ΔT+ΔTW at which global IO line pair returns to a prescribed precharge state if a column selection signal of the output portion of the column decoder is inactivated at time Tb. A relation of the times is expressed as follows.

$$Ta+\Delta T1+\Delta TW<Tc,$$

and $$Tc+\Delta TP<Tb+\Delta T1+\Delta TW$$

Therefore, a period in which the column selection line should be maintained in the active state, or Tb–Ta satisfies the following relation represented by the following expression.

$$Tb-Ta>\Delta TP$$

The activation period of the column selection line can be reduced to be approximately equal to the time period for which the preamplifier is activated, and the operation frequency can be increased. Particularly, if a clock synchronous type (synchronous) DRAM is employed, column selection signal lines are successively driven into a selected state in synchronization with a clock signal and the frequency of the clock signal can be increased. Accordingly, a synchronous DRAM operating at high speed can be obtained.

When data is written, a column selection signal from the column decoder and a write data from the write driver are transferred in the same direction. In this case, if the write driver is activated at a timing approximately equal to the activation timing of the column decoder, write data is transmitted at a timing which is identical to that for the column selection signal even if a sense amplifier band of any position in the memory cell array is selected. Therefore, the write driver may be activated for a minimum necessary period for writing data into a memory cell.

As shown in FIGS. 21 and 22, since the preamplifier is arranged opposite to the column decoder and the write driver is arranged adjacent to the column decoder, the column selection line may be driven into a selected state for a minimum period necessary for writing/reading of data when data is written and read, and high speed operation is implemented.

Ninth Embodiment

Figure 25A:
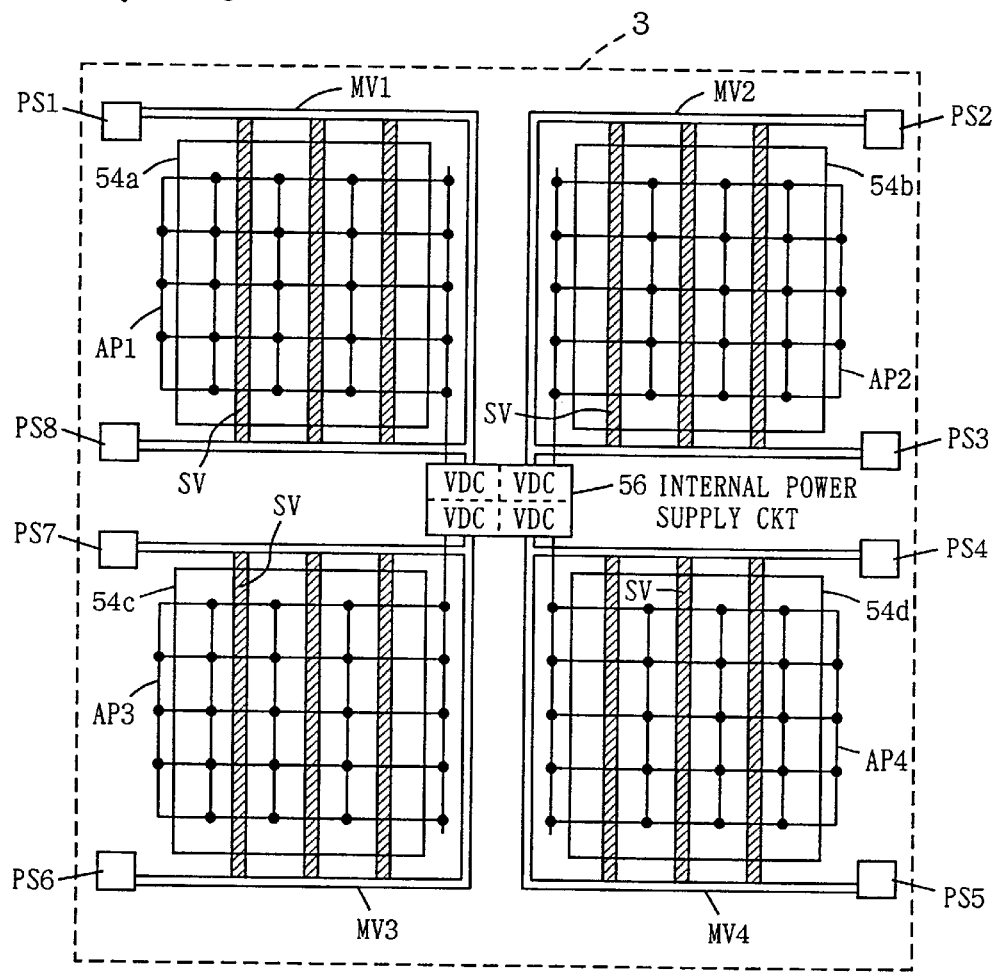
FIG. 25A schematically shows an entire configuration of a semiconductor integrated circuit device according to a ninth embodiment, and FIG. 25B schematically shows a configuration of a portion related to one subbank of FIG. 25A.

FIG. 25A schematically shows a configuration of a main portion of a semiconductor integrated circuit device according to the ninth embodiment. FIG. 25A shows an arrangement of power supply lines of DRAM macro 3. DRAM macro 3 in FIG. 25A includes memory arrays 54a, 54b, 54c and 54d arranged in four divided regions respectively. These memory arrays 54a–54d respectively constitute subbanks, however, banks may be allocated according to any of the embodiments described above.

Power supply pads PS1–PS8 are arranged adjacent to memory arrays 54a–54d along the periphery of a rectangular region such that two pads are provided for one memory array. Power supply pads PS1 and PS8 are provided adjacent to memory array 54a, power supply pads PS2 and PS3 are provided adjacent to memory array 54b, power supply pads PS4 and PS5 are provided adjacent to memory array 54d, and power supply pads PS6 and PS7 are provided adjacent to memory array 54c.

Power supply pads PS1 and PS8 are coupled to each other by a main power supply line MV1 formed in the lateral U shape along the periphery of memory array 54a. Power supply pads PS2 and PS3 are coupled to each other by a main power supply line MV2 arranged in the opposite lateral U shape along the periphery of memory array 54b. Power supply pads PS4 and PS5 are coupled to each other by a main power supply line MV4 arranged in the opposite lateral U shape to surround memory array 54d. Power supply pads PS6 and PS7 are coupled to each other by a main power supply line MV3 arranged in the lateral U shape on the outside of memory array 54c.

Each of main power supply lines MV1–MV4 has opposite portions coupled to each other by a sub power supply line SV extending over a corresponding one of memory arrays 54a–54d. Main power supply lines MV1–MV4 are coupled to an internal power supply circuit 56 and supply the power supply voltage to internal power supply circuit 56. Internal power supply circuit 56 includes internal voltage down converters provided corresponding to respective main power supply lines MV1–MV4, down-converts the power supply voltage supplied from the main power supply lines and supplies the voltage to array power supply lines AP1–AP4 as the power supply voltages for the arrays. This power supply voltage for the array is used as operation power supply voltage for the sense amplifiers.

Array power supply lines AP1–AP4 are arranged on the respective memory arrays 54a–54d in a meshed shape. Array power supply lines AP1–AP4 arranged in the row direction are formed of, for example, a second level aluminum interconnection layer. Main power supply lines MV1–MV4 and sub power supply line SV are formed of a third level aluminum interconnection layer at a higher level. Array power supply lines AP1–AP4 are used for generating an operation power supply voltage for the sense amplifiers provided for memory arrays 54a–54d and an intermediate voltage such as bit line precharge voltage. Voltage on main power supply lines MV1–MV4 and sub power supply line SV is used as operation power supply voltage for the array peripheral circuit and the bank control circuit.

Internal power supply circuit 56 is shown being collectively arranged at the central portion of DRAM macro 3. However, internal power supply circuits 56 are provided adjacent to memory arrays 54a–54d respectively, each includes an internal voltage down converter (VDC) which supplies the array power supply voltage from a corresponding main power supply line to a corresponding array power supply line, and the internal voltage down converter is provided adjacent to a corresponding memory array.

Figure 25B:
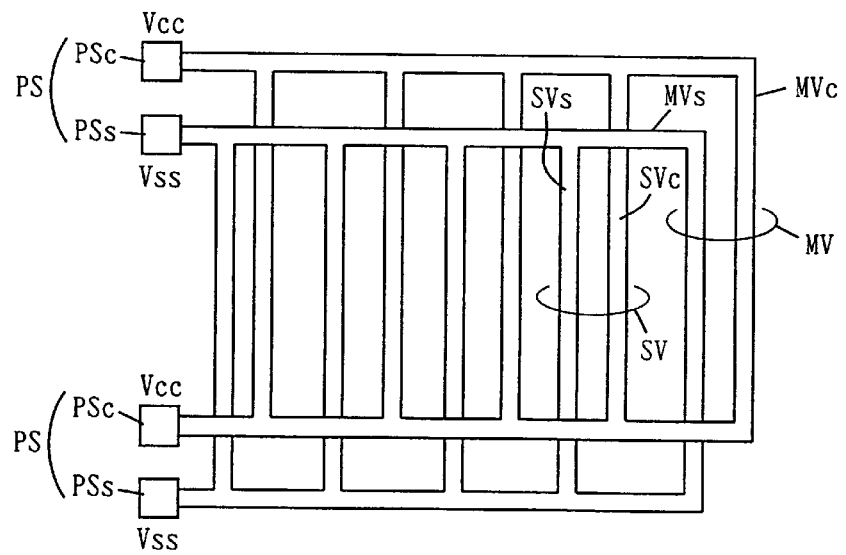

FIG. 25B shows an arrangement of main power supply line MV and sub power supply line SV. As shown in FIG. 25B, power supply pads PS (PS1–PS8) each include a power supply voltage pad PSc receiving power supply voltage Vcc and a ground voltage pad PSs supplying ground voltage Vss. Main power supply line MV includes a main power supply voltage transmission line MVc coupled to power supply voltage pad PSc, and a main ground voltage transmission line MVs which is coupled to ground voltage pad PSs and transmits ground voltage Vss. Sub power supply line SV accordingly includes a sub power supply voltage transmission line SVc coupled to main power supply voltage transmission line MVc, and a sub ground voltage transmission line SVs coupled to main ground voltage transmission line MVs. Main power supply voltage transmission line MVc and main ground voltage transmission line MVs have the lateral U shape and formed in the same interconnection layer. In order to prevent collision of interconnection lines at a crossing of main ground voltage transmission line MVs and main power supply voltage transmission line MVc, one of the voltage transmission lines is interconnected by another interconnection layer, for example, the second level aluminum interconnection layer. Similar arrangements are provided for a crossing of sub power supply voltage transmission line SVc and main ground voltage transmission line MVs and a crossing of sub ground voltage transmission line SVs and main power supply voltage transmission line Mvc.

Main power supply line MV and sub power supply line SV are coupled to power supply pads PS, have a sufficiently large interconnection line width, and have ability of supplying large amount of current.

Figure 26:
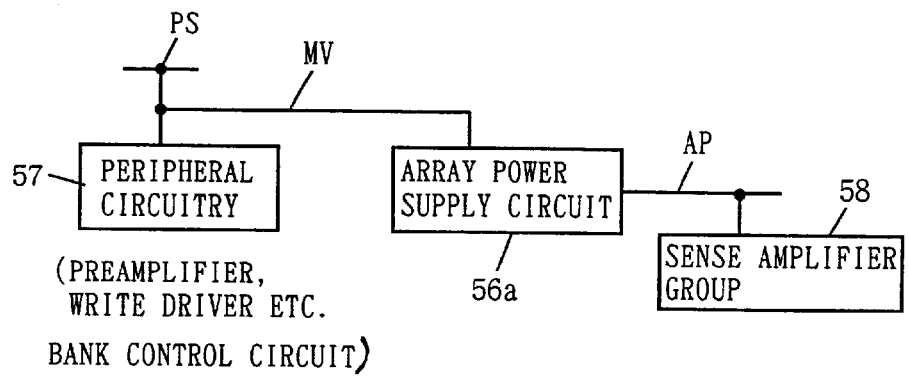
FIG. 26 schematically shows a configuration of the power supply of the semiconductor integrated circuit device of FIG. 25A.

FIG. 26 illustrates how the power supply is distributed in one subbank. In FIG. 26, main power supply line MV connected to power supply pad PS supplies operation power supply voltage to peripheral circuitry 57 including a preamplifier, a write driver, a column decoder and a bank control circuit, and is also connected an array power supply circuit (VDC) 56a included in internal power supply circuit 56. Array power supply circuit 56a down-converts a power supply voltage on main power supply voltage transmission line MVc included in main power supply line MV, generates the power supply voltage for array and transmits it onto array power supply line AP.

A group of sense amplifiers 58 operates using the power supply voltage on the array power supply line AP as its operation power supply voltage.

Peripheral circuitry 57 includes the preamplifier, the write driver and the like as described above. In the preamplifier and the write driver, a number of circuits operate simultaneously so that a large amount of current is consumed. If a bank included in the DRAM macro is the clock synchronous type DRAM operating synchronously with a clock signal, a large number of circuits operate simultaneously at a high speed (Writing or reading of data is carried out in each clock cycle). Similarly if column selecting operation is carried out in the column decoder, a large number of column selection lines should be driven simultaneously into a selected state as shown in the array arrangement of FIG. 22.

The width of main power supply line MV connected to power supply pad PS is increased for supplying current stably. Further, main power supply line MV is coupled by the sub power supply line to have its width equivalently increased to reduce an interconnection line resistance thereof. If any noises are generated on the sub power supply line, the noises are absorbed by the main power supply line and are prevented from transmitting to another sub power supply line. Transmission of the power supply noises is thus prevented to stabilize the power supply voltage. Accordingly, current is supplied stably even if the peripheral circuitry operates at high speed, generation of the power supply noises is suppressed, and the peripheral circuitry operating accurately at high speed is thus implemented.

Array power supply circuit 56a supplies operation power supply voltage to sense amplifier group 58 via array power supply line AP arranged in the mesh shape. The sense amplifiers group 58 senses and amplifies data of memory cells connected to one row simultaneously and consumes relatively large amount of current. The array power supply line AP arranged in the mesh shape has interconnection line resistance reduced, so that current is stably supplied in the sensing operation by array power supply line AP having its width made larger equivalently even when a large amount of current is consumed in the sense amplifier operation, and thus the sensing operation is stabilized.

As the peripheral circuitry, FIG. 26 shows a preamplifier and a write driver and a bank control circuit. However, all of the peripheral circuits such as the column decoder and the row decoder are included.

Figure 27:
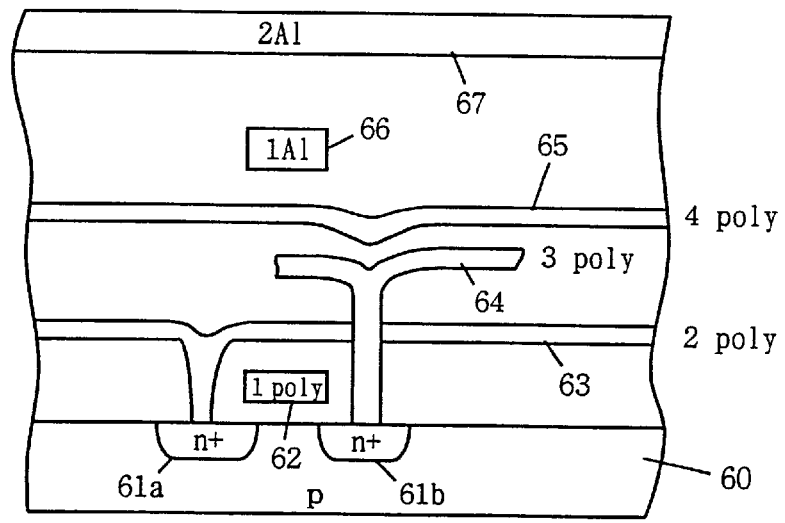
FIG. 27 schematically shows an arrangement of interconnection lines of a memory array section in the subbank of FIG. 25A.

FIG. 27 schematically shows an arrangement of interconnection lines in the memory array portion, and a cross sectional structure in the column direction is schematically illustrated therein. In FIG. 27, a memory cell includes high concentration N type impurity regions 61a and 61b formed at a surface of a semiconductor substrate region 60, and a gate electrode layer 62 formed of a first level polysilicon layer formed above a channel region between impurity regions 61a and 61b with a gate insulating film (not shown) underlaid. Impurity regions 61a and 61b and gate electrode layer 62 constitute a memory cell transistor (access transistor). Impurity region 61a is electrically connected to a conductive layer 63 which is a bit line formed of a second level polysilicon layer.

Impurity region 61b includes a plug layer extending beyond conductive layer 63, a conductive layer 64 formed of a third level polysilicon layer connected to the plug layer, and a conductive layer 65 formed of a fourth level polysilicon level layer formed above conductive layer 64 with capacitor insulating film underlaid. Conductive layer 64 is a storage node for storing information of the memory cell. Conductive layer 65 is the other electrode of the memory cell capacitor and is a cell plate electrode layer receiving a constant intermediate voltage.

A first level aluminum interconnection layer 66 is formed above conductive layer 65 formed of the fourth level polysilicon layer in parallel with gate electrode layer 62, and a second level aluminum interconnection layer 67 is formed above those layers. The first level aluminum interconnection layer 66 is electrically connected to gate electrode layer 62 in a word line shunt region and reduces electrical resistance of gate electrode layer 62.

As shown in FIG. 27, an interconnection layer located in the uppermost layer is the second level aluminum layer 67 in the memory array. Therefore, even if sub power supply line SV for reinforcing main power supply line MV is provided on the memory array, sub power supply line SV is the third level aluminum interconnection layer and can be arranged without affecting the interconnection in the memory array.

Figure 28:
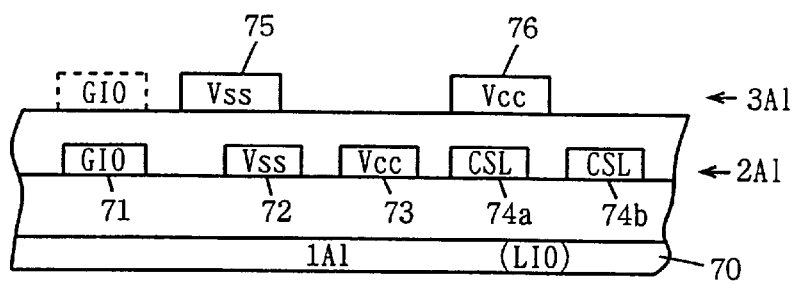
FIG. 28 schematically shows an arrangement of power supply lines in the ninth embodiment.

FIG. 28 schematically shows a cross sectional structure in the row direction in the memory array portion. In FIG. 28, a conductive layer 70 formed of the first level aluminum interconnection layer which constitutes, for example, a local IO line (LIO) extending in the row direction, as well as upper interconnection layers are shown. The second level aluminum interconnection layer formed above conductive layer 70 is provided. The second level aluminum interconnection layer includes a conductive layer 71 which forms a global IO line (GIO) placed in the word line shunt region, a conductive layer 72 which forms a ground voltage transmission line transmitting round voltage Vss, a conductive layer 73 which forms a power supply voltage transmission line transmitting array power supply voltage Vcc, and conductive layers 74a and 74b that form column selection lines (CSL). Conductive layers 72 and 73 constitute array power supply line AP and transmit array power supply voltages Vss and Vcc.

The third level aluminum interconnection layer is formed for arranging main power supply line MV and sub power supply line SV above the second level aluminum interconnection layer. The third level aluminum interconnection layer includes a conductive line 75 transmitting ground voltage Vss and a conductive line 76 transmitting power supply voltage Vcc.

A conductive layer which forms power supply lines for array transmitting ground voltage Vss and power supply voltage Vcc may be arranged between conductive layers 74a and 74b which form column selection lines (CSL) in the arrangement of interconnection lines shown in FIG. 28. Since one column selection line usually selects a plurality of memory cell columns simultaneously, the column selection line has a pitch wider than that of the memory cell column so that a power supply line can be appropriately arranged between column selection lines. Conductive layer 71 which forms global IO line (GIO) may be formed in the third level aluminum interconnection layer as shown by the broken line in FIG. 28. The third level aluminum interconnection layer has its purity higher than that of the second level aluminum interconnection layer and is superior in electrical characteristics, so that interconnection line delay of the global IO line can be reduced.

As shown in FIG. 28, the employment of conductive layers 75 and 76 of the third level aluminum interconnection layer allows the easy arrangement of the sub power supply line for reinforcing the power supply line or the main power supply line without adversely affecting components in the memory array, and the peripheral circuits can be stably operated at high speed.

Figure 29:
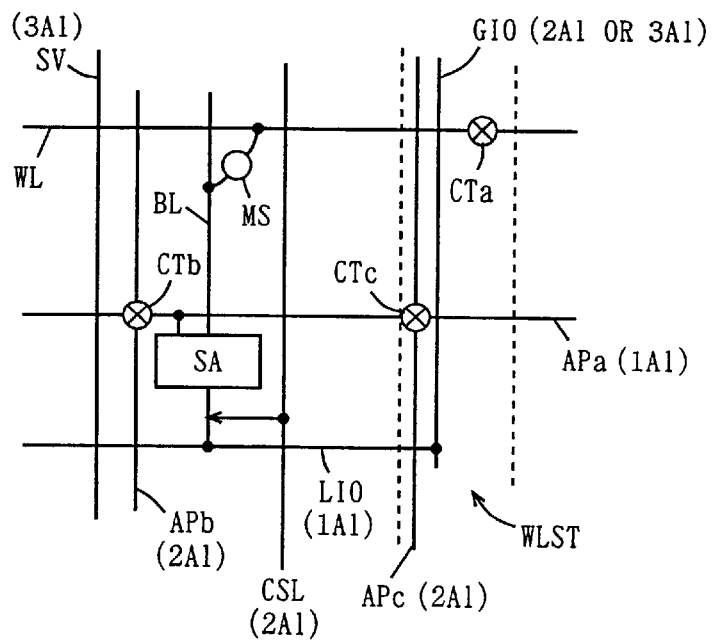
FIG. 29 schematically shows an arrangement of interconnection lines in the semiconductor integrated circuit device according to the ninth embodiment.

FIG. 29 schematically illustrates how power supply lines are connected in the ninth embodiment. In FIG. 29, for word line WL, the gate electrode layer in the first level polysilicon layer and the first level aluminum interconnection layer located above the polysilicon layer are electrically connected in a contact region CTa in the word line shunt region WLST (word line shunting (staking)). Since the word line shunt region WLST is located in a boundary region between subarray blocks, there is no memory cell therein. Global IO line pair GIO is placed in word line shunt region WLST. Global IO line pair GIO is constituted of the second level aluminum interconnection layer or the third level aluminum interconnection layer. Global IO line pair is electrically connected to local IO line pair LIO extending in the row direction via a block selection gate (not shown). Local IO line pair LIO is located in the first level aluminum interconnection layer (1A1).

A sense amplifier power supply line APa supplying power supply voltage to sense amplifier SA extends in the row direction, and is constituted of the first level aluminum interconnection layer.

Column selection line CSL constituted of the second level aluminum interconnection layer (2A1) is arranged in the column direction. A column selection signal on column selection line CSL connects sense amplifier circuit SA electrically to local IO line pair LIO via IO gate (not shown). Sense amplifier power supply line APb formed of the second level aluminum interconnection layer is arranged extending over the memory array in the column direction, and sense amplifier power supply line APc formed of the second level aluminum interconnection layer is arranged in word line shunt region WLST in the column direction. Sense amplifier power supply lines APb and APc formed of the second level aluminum interconnection layer are electrically connected to sense amplifier power supply line APa formed of the first level aluminum interconnection layer in contact regions CTb and CTc.

Sub power supply line SV formed of the third level aluminum interconnection layer is arranged over the memory array in the column direction. Sense amplifier circuit SA is connected to bit line BL and memory cell MS is arranged corresponding to a crossing of bit line BL and word line WL.

Since sense amplifier power supply line APa extending in the row direction is formed of the first level aluminum interconnection layer, collision between sense amplifier power supply line APa and column selection line CSL formed of the second level aluminum interconnection layer can be prevented. Further, collision between sense amplifier power supply line APa and global IO line pair GIO can be prevented even when global IO line pair GIO is formed of the second level aluminum interconnection layer. The first level aluminum interconnection layer has a resistivity a little higher than that of the second level aluminum interconnection layer, however, the resistance value of sense amplifier power supply line APa formed of the first level aluminum interconnection layer is reduced by electrically connecting sense amplifier power supply lines APc and APb formed of the second level aluminum interconnection layer at certain intervals.

Further, by electrically connecting sense amplifier power supply lines APb and APc formed of the second level aluminum interconnection layer to sense amplifier power supply line APa at a prescribed interval, reduction of the resistance value of the sense amplifier power supply line APa as well as increase of an ability of supplying current are accomplished. Variation of power supply voltage of sense amplifier power supply line APa is thus suppressed to implement a stable sensing operation. Sub power supply line SV is formed of the third level aluminum interconnection layer located in a higher layer, so that power supply voltage for the peripheral circuits can be supplied without adversely affecting arrangement of power supply lines in the memory array.

Modification

Figure 30:
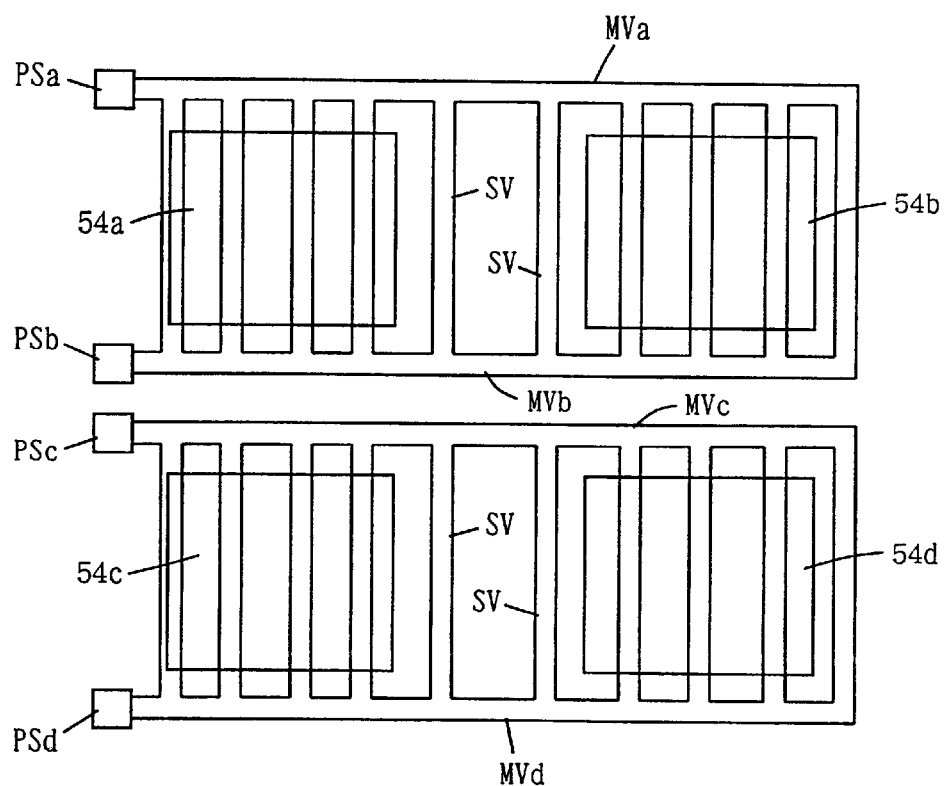
FIG. 30 schematically shows a modification of the semiconductor integrated circuit device of the ninth embodiment.

FIG. 30 schematically shows a modification of the semiconductor integrated circuit device of the ninth embodiment. FIG. 30 only shows an arrangement of main and sub power supply lines. Four memory arrays 54a–54d are placed in FIG. 30. Banks are arbitrarily allocated to memory arrays 54a–54d. Power supply pads PSa, PSb, PSc and PSd are arranged adjacent to memory arrays 54a and 54c in alignment with each other. Power supply pad PSa is coupled to main power supply line MVa arranged extending in one direction over memory arrays 54a and 54b, and power supply pad PSb is connected to main power supply line MVb placed opposite to main power supply line MVa relative to memory arrays 54a and 54b. Main power supply lines MVa and MVb are connected to each other by sub power supply line SV arranged extending over memory arrays 54a and 54b.

Power supply pad PSc is electrically connected to main power supply line MVc arranged extending over memory arrays 54c and 54d, and power supply pad PSd is electrically connected to main power supply line MVd arranged opposite to main power supply line MVc relative to memory arrays 54c and 54d. Main power supply lines MVc and MVd are coupled to each other by sub power supply line SV arranged extending over memory arrays 54c and 54d at prescribed intervals.

As shown in FIG. 30, power supply pads PSa–PSd are arranged on only one side of memory arrays 54a–54d, main power supply lines MVa–MVd for supplying power supply voltage from those power supply pads to peripheral circuits and control circuits are provided, and main power supply lines MVa–MVd are reinforced by sub power supply lines SV. If the power supply arrangement of the ladder shape as shown in FIG. 30 is used, an effect similar to that of the configuration in which two power supply pads are provided for each memory array can be obtained. As main power supply lines MVa–MVd and sub power supply line SV, as described regarding the embodiment above, an interconnection layer higher than any interconnection layer formed at the memory array is used (if global IO line is constituted of the second level aluminum interconnection layer).

In the configuration of FIG. 30, an array power supply circuit for generating the supply voltage for array such as a sense amplifier power supply voltage is placed adjacent to each respective memory array, and the array power supply voltage is generated for a corresponding memory array. In this case, power supply voltage is supplied from an appropriate main power supply line to the array power supply circuit.

According to the ninth embodiment as described above, power supply lines coupled to power supply pads are configured in the ladder shape by the main power supply lines and the sub power supply lines arranged extending over the memory array, and the power supply lines are utilized as a source for supplying an operation power supply voltage for peripheral circuits such as the preamplifier, the write driver and the bank control circuit. Accordingly, power supply voltage can be stably supplied even under high speed operation, and reading and writing of, for example, 1024 bits data can be executed at high speed without generating power supply noises when data is input/output.

Tenth Embodiment

Figure 31:
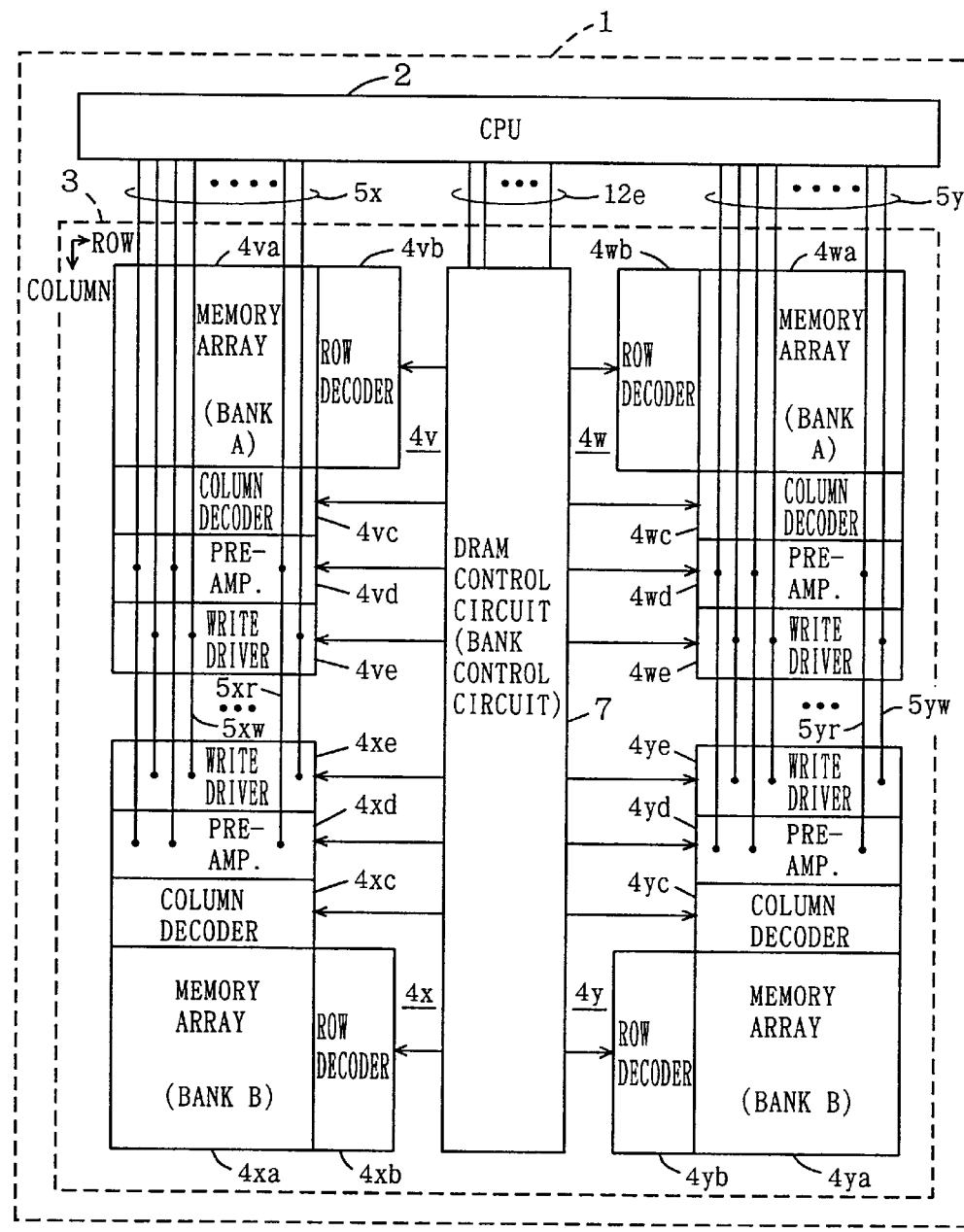
FIG. 31 schematically shows an entire configuration of a semiconductor integrated circuit device according to a tenth embodiment of the invention.

FIG. 31 shows an entire configuration of a semiconductor integrated circuit device according to the tenth embodiment schematically. Semiconductor integrated circuit device 1 of FIG. 31 includes processor 2 and DRAM macro 3. DRAM macro 3 includes subbanks 4v, 4w, 4x and 4y arranged in four regions respectively. Subbank 4v includes a memory array 4va, a row decoder 4vb, a column decoder 4vc, a preamplifier 4vd arranged adjacent to column decoder 4vc, and a write driver 4ve placed opposite to column decoder 4vc relative to preamplifier 4vd.

Subbank 4w includes a memory array 4wa, a row decoder 4wb, a column decoder 4wc, a preamplifier 4wd and a write driver 4we. Subbank 4x includes a memory array 4xa, a row decoder 4xb, a column decoder 4xc, a preamplifier 4xd and a write driver 4xe, and subbank 4y includes a memory array 4ya, a row decoder 4yb, a column decoder 4yc, a preamplifier 4yd and a write driver 4ye. Subbanks 4v–4y have the same configuration in which the preamplifier is placed adjacent to the column decoder, and the write driver is arranged opposite to the column decoder relative to the preamplifier. Subbanks 4v and 4w aligned in the row direction constitute bank A, and subbanks 4x and 4y constitute bank B.

A DRAM control circuit (bank control circuit) 7 extending in the column direction is arranged in a central region with respect to the row direction of DRAM macro 3. DRAM control circuit 7 includes a bank A control circuit and a bank B control circuit.

DRAM control circuit 7 is coupled to processor 2 via a control bus 12e extending in the column direction, and receives necessary control signal and address signal.

An internal read/write data bus 5x extending in the column direction is arranged commonly to subbanks 4v and 4x, and an internal read/write data bus 5y extending in the column direction is arranged commonly to subbanks 4w and 4y. Internal read/write data buses 5x and 5y are arranged extending over respective subbanks 4v and 4w, and formed of, for example, the third level aluminum interconnection layer higher than the interconnection layers in the memory array.

Internal read/write data bus 5x includes a read data bus line 5xr commonly coupled to preamplifier 4vd of subbank 4v and preamplifier 4xd of subbank 4x, and an internal write data bus line 5xw commonly coupled to write driver 4ve of subbank 4v and write driver 4xe of subbank 4x. Internal read/write data bus 5y includes an internal read data bus line 5yr commonly coupled to preamplifier 4wd of subbank 4w and preamplifier 4yd of subbank 4y, and an internal write data bus line 5yw commonly connected to write driver 4we of subbank 4w and write driver 4ye of subbank 4y. These read data buses and write data buses are separately provided to reduce the load of the data bus for transferring data at high speed.

Figure 32:
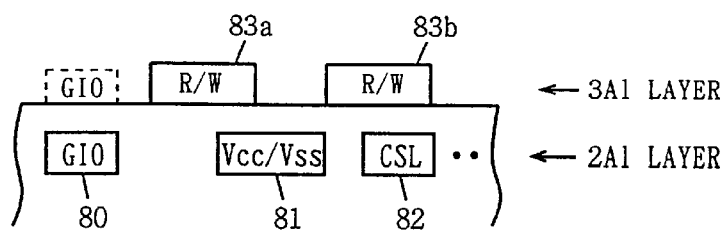
FIG. 32 schematically shows an arrangement of interconnection lines of a memory array unit of the semiconductor integrated circuit device shown in FIG. 31.

FIG. 32 schematically shows an arrangement of the interconnection lines in the memory array portion. In FIG. 32, the uppermost interconnection layer in the memory array is the second level aluminum interconnection layer. The second level aluminum interconnection layer includes a conductive layer 80 forming global IO line (GIO), a conductive layer 81 forming array power supply line (Vcc/Vss), and a conductive layer 82 forming column selection line (CSL) which transmits a column selection signal from the column decoder.

Conductive layers 83a and 83b constituting bus lines (R/W) of internal read/write data buses 5x and 5y are arranged in a layer higher than the second level aluminum interconnection layer. The third level aluminum interconnection layer is an interconnection layer higher than the uppermost interconnection layer in the memory array. Accordingly, the internal read/write data buses can be arranged extending over the memory array, the column decoder, the preamplifier and the write driver without affecting the layout of the subbank (Transistors constituting the column decoder, the preamplifier and the write driver are formed of an interconnection layer lower than the second level aluminum interconnection layer).

As shown in FIG. 31, since the read/write data bus is arranged utilizing an interconnection layer higher than the uppermost interconnection layer of the memory array, such as the third level aluminum interconnection layer, the internal read/write data buses can be arranged over the subbank. Therefore, a region for arranging the internal read/write data buses is unnecessary viewed in a planar layout to dramatically reduce an area occupied by the DRAM macro.

In the arrangement of the array shown in FIG. 32, global IO line pair may be placed in the third level aluminum interconnection layer as shown by the block surrounded by the broken line in FIG. 32.

The processor includes data input buffer and data output buffer provided separately. By providing read data bus lines 5xr and 5yr and write data bus lines 5xw and 5yw separately for internal read/write data buses 5x and 5y, the data buses can be easily arranged according to the arrangement of the input buffer and the output buffer of the processor. In this case, although the number of necessary bus lines is doubled compared with the case in which the read data bus line and the write data bus line are made common, the number of memory cells in one row is sufficiently larger than the number of memory cells (columns) that are simultaneously selected and have data written/read in one memory array as clearly shown by the array arrangement of FIG. 22. Accordingly, even if the number of read/write data bus lines is large, those can be arranged over the memory array with a sufficient margin.

The write driver and the preamplifier are arranged facing to a central region in the column direction of DRAM macro 3 as shown in FIG. 31. Subbanks aligned in the row direction are included in the same bank. Since writing/reading of data is started from a region adjacent to the central region in the column direction of DRAM macro 3 in both of the access to bank A and access to bank B, and since the read/write data buses are formed of the third level aluminum interconnection layer having a superior electric characteristics, delay on interconnection lines can be substantially ignored. As a result, access times in both of the bank A access and the bank B access are made equal and a DRAM operating at high speed can be obtained.

By providing the read data bus and the write data bus separately, load of each data bus line decreases and high speed access is accomplished. The internal read/write data bus may be constituted of read/write data bus lines which transmits both of write data and read data. The positions of the preamplifier and the write driver may be exchanged in each of subbanks 4v–4y. Further, the preamplifier may be arranged opposite to the column decoder relative to the memory array in each of subbanks 4v–4y (IO separation structure).

According to the tenth embodiment as described above, since the internal read/write data bus is configured utilizing an interconnection layer higher than the interconnection layers of the subbank, the area for interconnection of internal read/write data bus can be effectively eliminated. An area occupied by the DRAM macro is thus reduced and accordingly a chip occupation area of a semiconductor integrated circuit device is reduced. If an aluminum interconnection layer is employed as the uppermost interconnection layer, the uppermost aluminum interconnection layer has the highest aluminum purity and is most superior in electric characteristics. Accordingly, data can be transferred at high speed and a semiconductor integrated circuit device operating at high speed can be implemented.

Eleventh Embodiment

Figure 33:
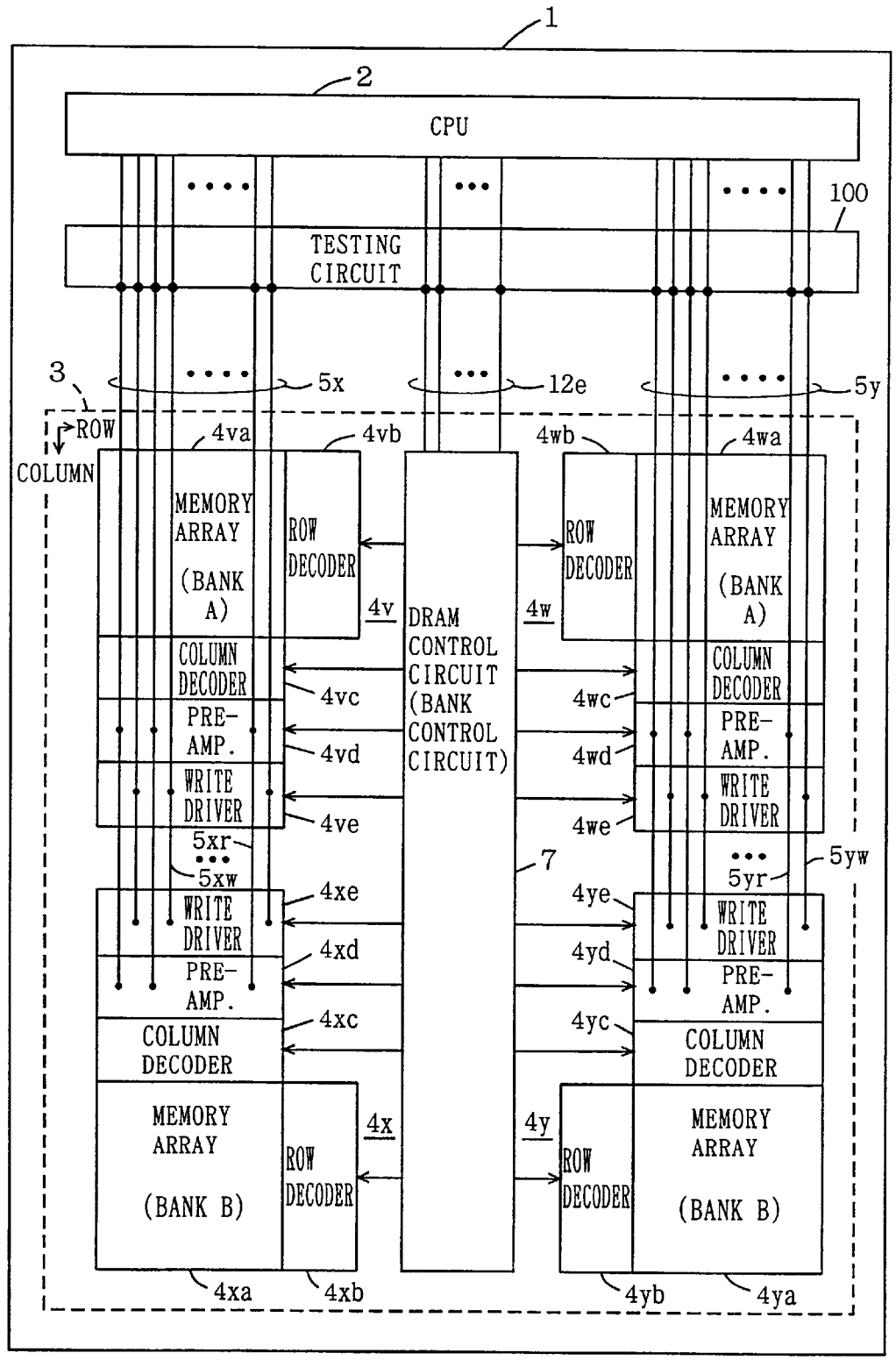
FIG. 33 schematically shows an entire configuration of a semiconductor integrated circuit device according to an eleventh embodiment of the invention.

FIG. 33 schematically shows an entire configuration of a semiconductor integrated circuit device of the eleventh embodiment. Semiconductor integrated circuit device 1 shown in FIG. 33 is different from the semiconductor integrated circuit device of FIG. 31 in the following point. Specifically, a testing circuit 100 is placed between processor 2 and DRAM macro 3. Testing circuit 100 is coupled to internal read/write data buses 5x and 5y as well as a control bus 12e connecting processor 2 and DRAM macro 3. Accordingly, internal read/write data buses 5x and 5y and control bus 12e are shared by testing circuit 100 and processor 2. The configuration of testing circuit 100 is approximately similar to that of testing circuit 15 shown in FIGS. 5–9. Semiconductor integrated circuit device 1 of FIG. 33 is identical to that of FIG. 31 except for that testing circuit 100 is provided, and corresponding components are indicated by the same reference characters.

Since testing circuit 100 is arranged between DRAM macro 3 and processor 2 as shown in FIG. 33, processor 2 and testing circuit 100 can share internal read/write data buses 5x and 5y as well as control bus 12e. Therefore, testing circuit 100 for conducting a function test for DRAM macro 3 can be easily incorporated without adversely affecting the layout of DRAM macro 3 and processor 2.

In testing circuit 100, the read data bus and the write data bus are separately provided such that internal read/write data bus 5x and 5y include read data bus lines 5xr and 5yr and write data bus lines 5xw and 5yw, and the bus selector in the testing circuit shown in FIG. 7 is provided for each of the write data bus and the read data bus.

Figure 34:
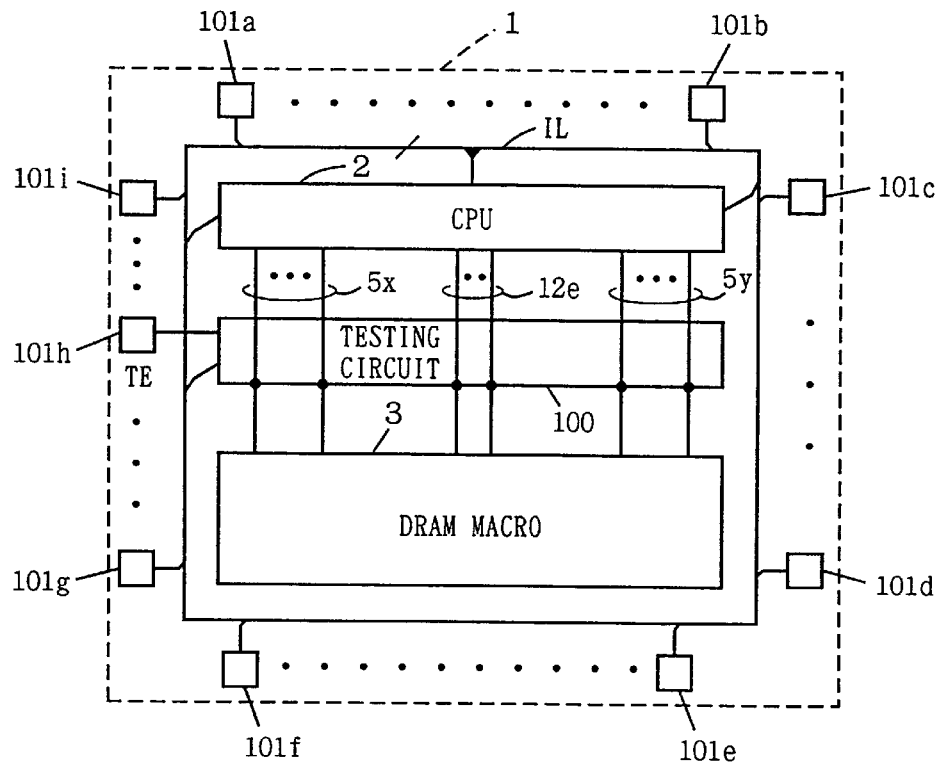
FIG. 34 schematically shows an arrangement of banks of the semiconductor integrated circuit device shown in FIG. 33.

FIG. 34 schematically shows an entire configuration of the semiconductor integrated circuit device according to the eleventh embodiment on a semiconductor chip. Semiconductor integrated circuit device 1 includes pads 101a–101i arranged along the periphery thereof. Pads 101a–101i are coupled to processor 2 by an internal bus interconnection line IL. Processor 2 provides and receives data and a control signal to and from an external unit via pads 101a–101i. A specific pad 101h among these pads 101a–101i is used as a pad for input of DRAM test activation signal TE. Testing circuit 100 is coupled to prescribed pads among pads 101a–101i, electrically couples internal read/write data buses 5x and 5y as well as control bus 12e to the prescribed pads upon activation of DRAM test activation signal TE supplied to pad 101h to enable external supplying and receiving of testing data and control signals.

Figure 35:
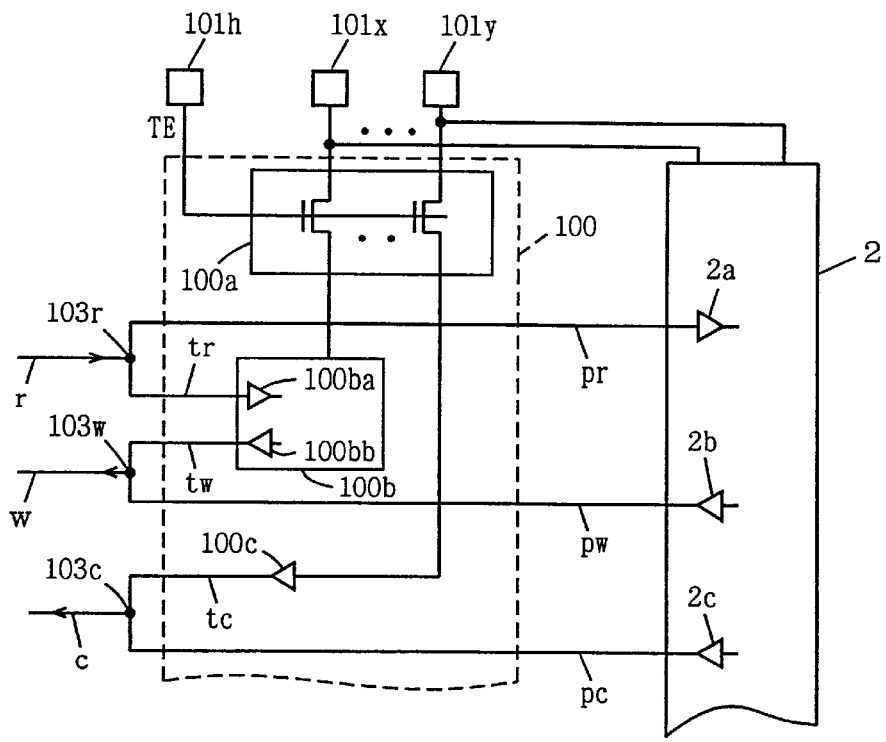
FIG. 35 schematically shows a configuration of the testing circuit section of the eleventh embodiment of the invention.

FIG. 35 schematically shows a configuration of the testing circuit shown in FIGS. 33 and 34. Testing circuit 100 includes a select/connect circuit 100a which couples internal nodes to pads 101x–101y according to activation of test activation signal TE supplied to pad 101h, and an actual testing circuit 100b which inputs and outputs testing data via pads connected by select/connect circuit 100a and conducts a prescribed test. In FIG. 35, as an internal component of select/connect circuit 100a, a transfer gate provided for each of the pads and rendered conductive in response to activation of test activation signal TE is representatively shown. FIG. 35 exemplarily shows that a control signal is supplied to pad 101y in the testing mode of DRAM macro.

Further, as data bus lines coupled to testing circuit 100, a read data bus line r, a write data bus line w and a control bus line c are representatively shown.

Read data bus line r is coupled to a processor read data bus line pr connected to processor 2 as well as a test read data bus line tr connected to actual testing circuit 100b at a node 103r. Write data bus line w is coupled to a processor write data bus line pw which transmits write data from processor 2 as well as a test write data bus line tw which transmits testing data from actual testing circuit 100b at a node 103w. Control bus line c is coupled to a processor control bus line pc which transmits a control signal from processor 2 as well as a test control bus line tc which transmits a test control signal from testing circuit 100 at a node 103c. Buffer circuits are provided for those bus lines respectively for waveform shaping.

Processor 2 includes an input buffer 2a which buffers a signal on processor read data bus line pr, and output buffers 2b and 2c for driving processor write data bus line pw and processor control bus line pc respectively. Actual testing circuit 100b includes an output buffer 100bb for transmitting testing data onto the test write data bus line tw, and a buffer 100ba for buffering testing data supplied from the DRAM macro or transmitting data of the test result to pad 101x or the like.

Test control bus line tc is provided with a buffer 100c for buffering a control signal supplied from an external testing unit via pad 110y.

In the arrangement shown in FIG. 35, testing circuit 100 and the bus lines from processor 2 are coupled at nodes 103r, 103w and 103c. Read data bus line r is coupled to actual testing circuit 100b and processor 2 via bus lines tr and pr respectively. Therefore, collision of read data does not occur in testing circuit 100 and processor 2. If processor 2 is brought in a non-operation state by a control signal applied to a non-used pad in testing mode of the DRAM, an adverse effect of a signal necessary for testing circuit 100 in the testing mode exerted on processor 2 can be prevented, and contrarily, an adverse effect of processor 2 on test result of the DRAM macro can be prevented. In the normal operation mode, testing circuit 100 is in the non-operation state. If the selector is in a nonconductive state as shown in FIGS. 7 and 8, a reading portion of the testing data of testing circuit 100 is separated from processor 2 and the reading portion does not exert any negative influence.

In the normal operation mode and the testing mode for the DRAM macro, collision of writing data on write data bus line w and control bus line c is generated by buffers 100bb, 100c, 2b and 2c and an adverse influence may caused in both operation modes. Therefore, testing circuit 100 should be separated from the write data bus and the control bus in the normal operation mode and processor 2 should be separated from the write data bus and the control data bus in the testing mode for the DRAM macro.

In this case, when DRAM testing mode activation signal TE is activated, buffers 2b and 2c could be brought into output high impedance state in processor 2, and buffers 100bb and 100c could be brought into the output high impedance state when testing mode activation signal TE is inactivated. However, this approach is not preferable since the output buffer of processor 2 should be comprised of a tristate buffer for implementation of testing of the DRAM macro and therefore a signal irrelevant to processor's inherent operation mode should be internally used.

If the interconnection line capacitance of DRAM macro 3 and the capacitance of interconnection line passing over testing circuit 100 should be driven at high speed, driving power of output buffers 2b and 2c of processor 2 as well as output buffers 100bb and 100c of testing circuit 100 should be increased. In this case, tristate buffers for the testing circuit and for the processor might be provided at nodes 103r, 103w and 103c.

Figure 36:
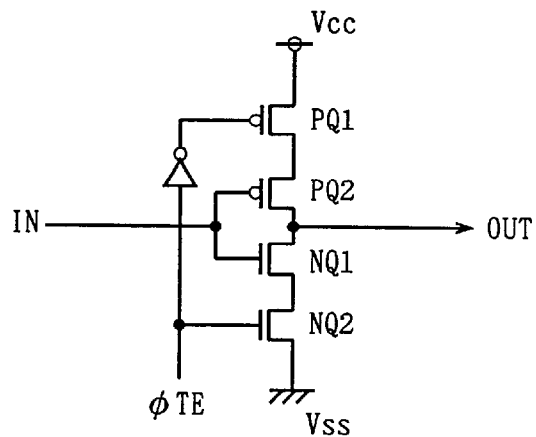
FIG. 36 schematically shows a first configuration for switching an output from the testing circuit and an output from the processor.

FIG. 36 shows a configuration of a conventional tristate inverter buffer. The tristate inverter buffer of FIG. 36 includes p channel MOS transistors PQ1 and PQ2 and n channel MOS transistors NQ1 and NQ2 connected in series between power supply node Vcc and ground node Vss. DRAM test activation signal TE is supplied to the gate of MOS transistor PQ1 via an inverter, and is also supplied to the gate of MOS transistor NQ2. Input signal IN is supplied to the gates of MOS transistors PQ2 and NQ1, and output signal OUT is output from a connection node between MOS transistors NQ1 and PQ2.

If such tristate inverter buffer is used, output signal OUT is charged or discharged via two MOS transistors connected in series to each other. Accordingly, channel resistance of the MOS transistors increases and high speed charging and discharging becomes impossible. Further, since four MOS transistors are connected in series, the area occupied by those increases. Since diffusion capacitance of two MOS transistors (junction capacitance between a substrate and an impurity region) is connected to a signal line in operation, interconnection line capacitance increases and high speed charging and discharging becomes impossible. If the state of input signal IN is fixed at an H level or an L level in non-activation state, one of MOS transistors PQ2 and NQ1 is in a conductive state. For example, if MOS transistor NQ1 is in an ON state, diffusion capacitances of the source and the drain of MOS transistor NQ1 and diffusion capacitance of the drain of the MOS transistor NQ2 are connected to an output node. Diffusion capacitance of the drain of MOS transistor PQ2 is further connected to the output node. Accordingly, if such a tristate inverter buffer is utilized, parasitic capacitance of the output node increases and high speed transmission of a signal becomes impossible. This is because the parasitic capacitances of both of the tristate inverter buffer in the active state and the tristate inverter buffer in the inactive state are connected to the write data bus line or the control bus line.

In order to transmit a signal at high speed to the DRAM macro without increase of an area occupied by a circuit, following configuration is employed.

Figure 37:
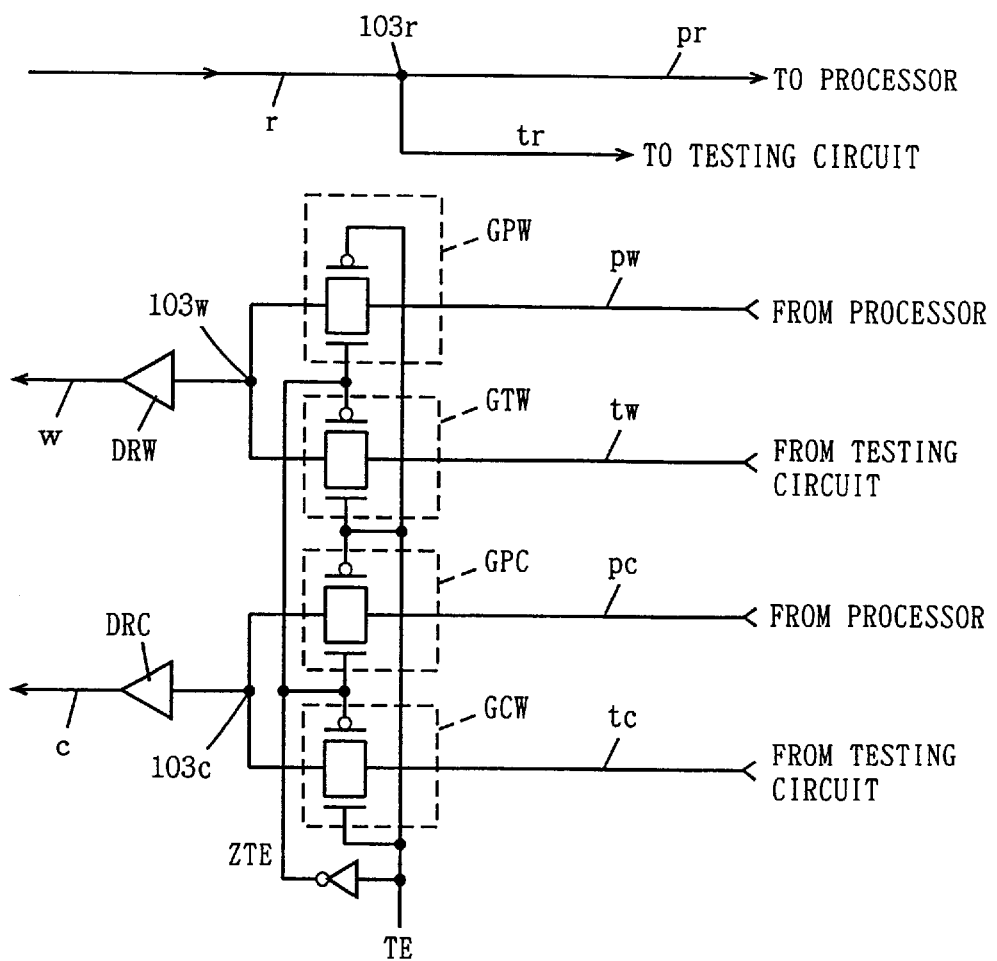
FIG. 37 schematically shows a configuration of a switching section of outputs from the testing circuit and from the processor of the semiconductor integrated circuit device according to the eleventh embodiment.

FIG. 37 shows a configuration of a modification of the eleventh embodiment. In FIG. 37, a selection gate GPW which is rendered non-conductive upon activation of DRAM test activation signal TE is arranged between node 103w and processor write data bus line pw, a selection gate GTW which is rendered conductive upon activation of DRAM test activation signal TE is arranged between node 103w and test write data bus line tw, a selection gate GPC which is rendered non-conductive upon activation of DRAM test activation signal TE is provided between node 103c and processor control bus line pc, and a selection gate GCW which is rendered conductive upon activation of DRAM test activation signal TE is provided between node 103c and test control bus line tc. These selection gates GPW, GTW, GPC and GCW are each constituted of a CMOS transmission gate.

Drivers DRW and DWC having a large driving capability are arranged at nodes 103w and 103c. Since selection gates GPW, GTW, GPC and GCW are each constituted of the CMOS transmission gate, they can transmit signals to be transferred with low impedance. Further, corresponding signal lines and source/drain regions can be arranged in parallel with each other so that these selection gates each can be arranged in a smaller area compared with the tristate inverter buffer. Further, the pitch of the gates (distance between adjacent gates) can be reduced sufficiently compared with the tristate inverter buffer. Parasitic capacitance associated with the output node (nodes 103w or 103c) of the CMOS transmission gate in nonconductive state is only the junction capacitance at one side of the CMOS transmission gate in the non-conductive state. Accordingly, the parasitic capacitance can be made sufficiently smaller compared with the case in which the tristate inverter buffer is utilized.

In addition, MOS transistors are connected in parallel with each other to effectively increase the gate width compared with the MOS transistors connected in series, resulting in high speed transmission of signals. By providing drivers DRW and DRC for write data bus line w and control bus line c, write data can be transmitted at high speed without increasing driving capabilities of output buffers of the processor and the testing circuit, even if interconnection line capacitance of the DRAM macro is large. Write data can be transmitted at high speed in the testing mode and the normal operation mode with a small occupied area.

Such a selection gate is not provided for read data bus line r. Alternatively, driving capability of the preamplifier of the DRAM macro can be made sufficiently large instead of providing the selection gate, or two stages of preamplifiers (configuration of preamplifier and main amplifier) are provided to drive interconnection line capacitance of DRAM macro and interconnection line capacitance of the read data bus line at high speed with a sufficiently large driving power. However, a selection gate with its conduction/non-conduction controlled responsive to DRAM test activation signal TE may be used for read data bus lines pr and tr.

Figure 38:
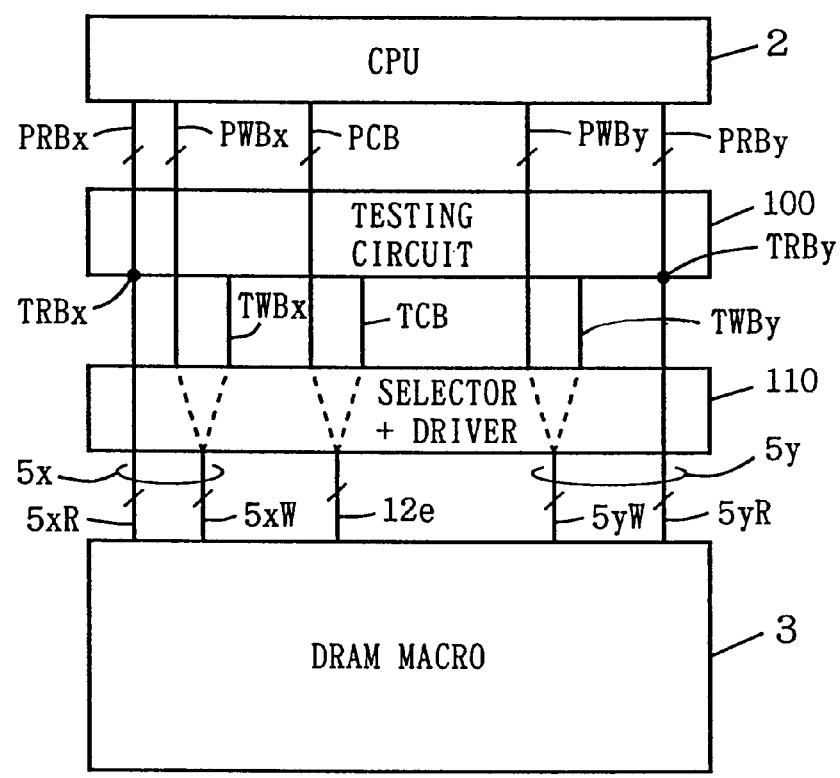
FIG. 38 schematically shows an entire configuration of a modification of the semiconductor integrated circuit device according to the eleventh embodiment.

FIG. 38 schematically shows an entire configuration of a modification of the eleventh embodiment. In FIG. 38, read data bus PRBx from processor 2 and test read data bus TRBx of testing circuit 100 are coupled to each other to become read data bus 5xr coupled to DRAM macro 3. Write data bus PWBX from processor 2 and test write data bus TWBx from testing circuit 100 are coupled to selector.driver 110 and one of them is selected to become write data bus 5xw via the driver. Control bus PCB from processor 2 and control bus TCB from testing circuit 100 are coupled to selector.driver 110. One of those is selected according to an operation mode to be coupled to control bus 12e via the driver. Write data bus PWBy from processor 2 and test write data bus TWBy from testing circuit 100 are both coupled to selector.driver 110. One of those is selected according to an operation mode to be coupled to write data bus 5yW via the driver. Read data bus PRBy from processor 2 is coupled to read data bus TRBy from testing circuit 100 to become read data bus 5yR skipping selector.driver 110.

As shown in FIG. 38, selector.driver 110 including a selector and a bus driver is used to select write data and control signal from one of testing circuit 100 and processor 2 for transmission to DRAM macro 3 via the driver. Accordingly, even if interconnection line capacitance within the DRAM macro and interconnection line capacitance on interconnection lines passing over testing circuit 100 are increased, write data buses 5xW and 5yW and control bus 12e can be driven at high speed by the driver and the DRAM macro can be driven at high speed in both of the normal operation mode and the DRAM testing mode.

According to the eleventh embodiment as described above, the testing circuit is arranged between the processor and the DRAM macro, and the read data bus, the write data bus, and the control bus to the DRAM macro are shared between the processor 2 and the testing circuit. As a result, the testing circuit for the DRAM macro can be easily arranged within the semiconductor integrated circuit device without affecting the layout of the processor and the DRAM macro. Further, the bus of one of the processor and the testing circuit is selected according to operation mode using the selector and the driver, and the write data bus and the control bus for the DRAM macro are driven via the driver. As a result, write data, the control signal and the address signal can be transmitted at high speed without increase of an area occupied by the circuit, to implement a semiconductor integrated circuit device operating at high speed.

Twelfth Embodiment

Figure 39:
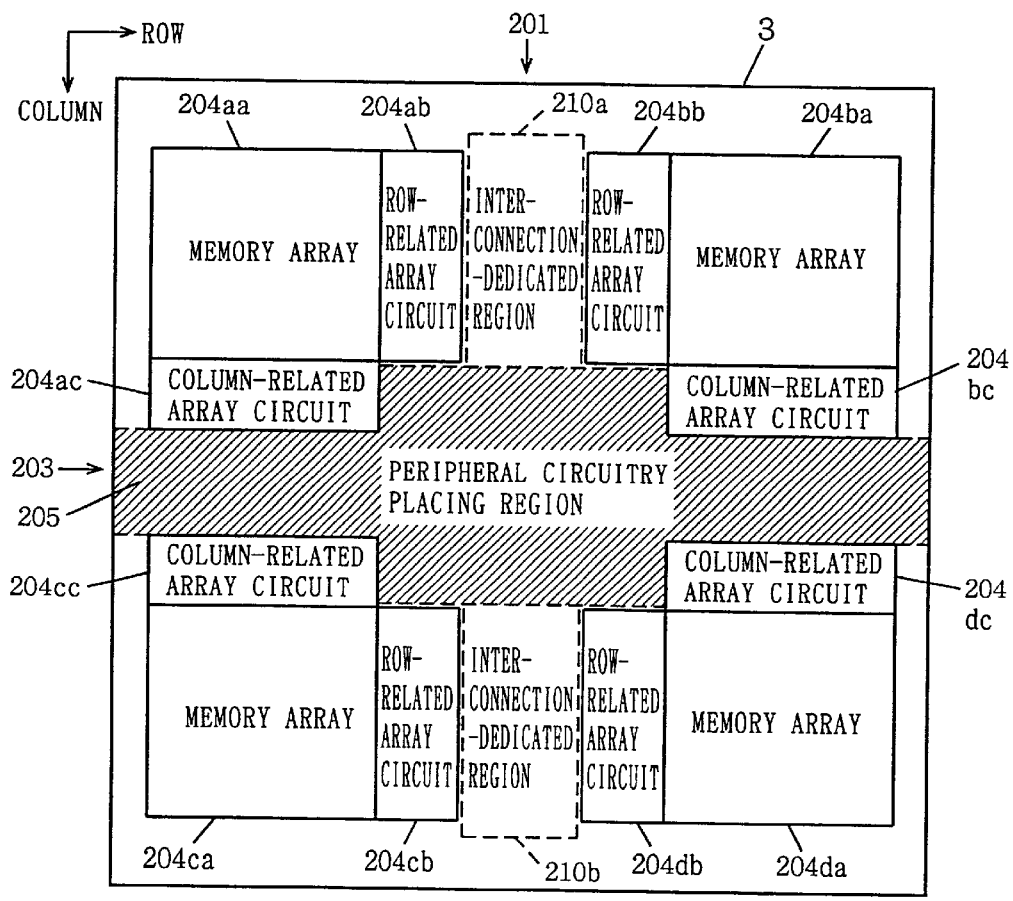
FIG. 39 schematically shows an entire configuration of a semiconductor integrated circuit device according to a twelfth embodiment of the invention.

FIG. 39 schematically shows an entire configuration of a semiconductor integrated circuit device according to the twelfth embodiment of the invention. Referring to FIG. 39, a semiconductor integrated circuit device (semiconductor memory device) 3 which is a DRAM macro is divided into four regions by a first central region 201 arranged extending in a column direction at a central region with respect to a row direction of a rectangular region of the device, and a second central region 203 arranged extending in the row direction in a central region with respect to the column direction of the rectangular region. Memory arrays 204aa, 204ba, 204ca and 204da are respectively arranged in the four regions. Each of memory arrays 204aa–204da includes a plurality of memory cells arranged in rows and columns.

Row-related array circuits 204ab–204db performing an operation related to row selection of a corresponding memory array upon activation thereof, and column-related array circuits 204ac–204dc performing an operation related to column selection (including data writing/reading) of a corresponding memory array upon activation thereof are provided to memory arrays 204aa–20da respectively. Row-related array circuits 204ab–204db are arranged facing to the first central region 201, and column-related array circuits 204ac–204dc are arranged facing to the second central regions 203.

An interconnection-dedicated region 210a is arranged between row-related array circuits 204ab and 204bb that are arranged opposite to each other with respect to the first central region 201, and an interconnection-dedicated region 210b is arranged in the first central region 201 between row-related array circuits 204cb and 204db. An interconnection line for transmitting a signal voltage as well as a decoupling capacitor for suppressing noises are arranged in these interconnection-dedicated regions 210a and 210b (the configuration is described later in detail). A logic circuit performing a prescribed processing on a signal is not provided in interconnection-dedicated regions 210a and 210b.

In the second central region 203, peripheral circuitry such as a control circuit for controlling operations of row-related array circuits 204ab–204db and column-related array circuits 204ac–204dc, and an internal voltage generation circuit generating internal voltage (reference voltage such as internal power supply voltage, internal negative voltage, internal high voltage and the like) is placed. Peripheral circuitry placing region 205 is arranged in an almost entire portion of the second central region 203. Further, a region between column-related array circuits 204ac and 204bc as well as a region between column-related array circuits 204cc and 204dc are used as peripheral circuitry placing region 205. No bonding pad for externally supplying/receiving a signal and voltage is placed in interconnection-dedicated regions 210a and 210b.

Figure 40:
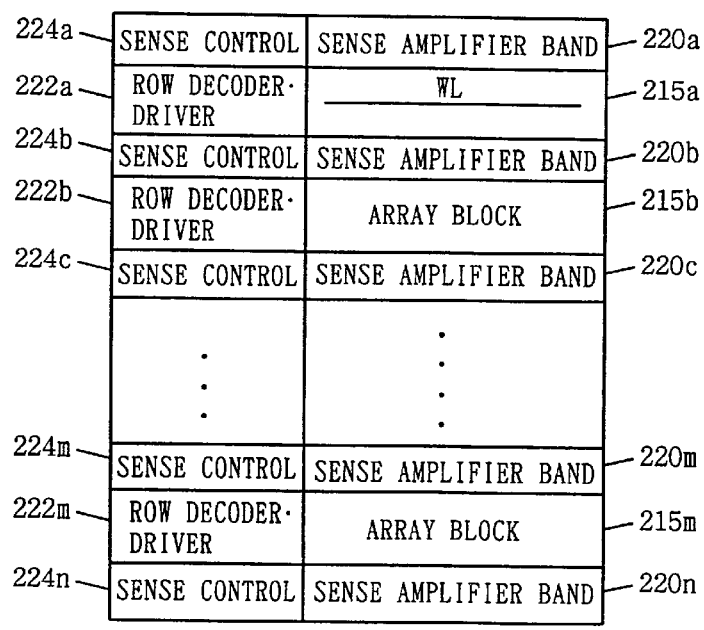
FIG. 40 schematically shows configurations of a memory array and a row-related array circuit illustrated in FIG. 39.

FIG. 40 schematically shows a configuration of the row-related array circuit shown in FIG. 39. Referring to FIG. 40, a configuration of a row-related array circuit provided corresponding to one memory array is schematically shown. Memory arrays (204aa–204da) are each divided into a plurality of array blocks 215a–215m in the column direction. Between these array blocks 215a–215m, sense amplifier bands 220b–220m including sense amplifiers placed corresponding to respective memory cell columns are provided. On the outside of array blocks 215a and 215m, sense amplifier bands 220a and 220n are further provided. Sense amplifier bands 220b–220m are each shared by adjacent array blocks.

Row decoders.drivers 222a–222m for decoding an address signal (not shown) and driving an addressed word line WL to a selected state are provided corresponding to array blocks 215a–215m respectively. Each of row decoders.drivers 222a–222m includes a decode circuit provided corresponding to each word line and decoding an address signal, and a word line drive circuit for driving a corresponding word line to a selected state according to an output signal from the decode circuit.

Sense control circuits 224a–224n are provided correspondingly to sense amplifier bands 220a–220n respectively. Sense control circuits 224a–224n each include a bit line isolation control circuit for controlling connection/isolation of each column of an adjacent array block and a sense amplifier of a corresponding sense amplifier band, as well as a sense amplifier activation control circuit for activating a sense amplifier included in a corresponding sense amplifier band.

As shown in FIG. 40, in each of row-related array circuits 204ab–204db, the same circuit is repeatedly arranged in the column direction correspondingly to an array block. A storage capacity of a memory array is increased by repeatedly placing sense amplifier band 220 and array block 215 as one unit in the column direction. Correspondingly, sense control circuit 224 and row decoder.driver 222 are repeatedly placed.

Figure 41:
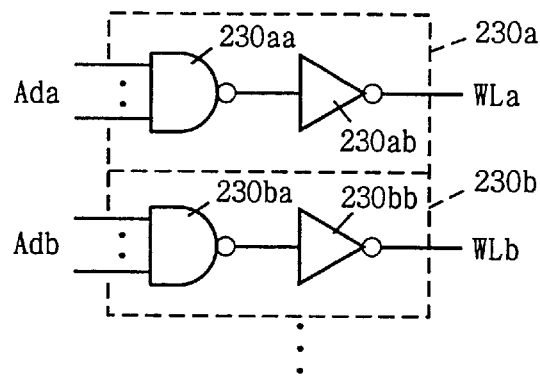
FIG. 41 shows one example of a configuration of a row decoder.driver shown in FIG. 40.

FIG. 41 illustrates one example of a configuration of row decoders.drivers 222a–222m. In FIG. 41, row decode/drive circuits 230a and 230b provided corresponding to two word lines WLa and WLb are representatively shown. In FIG. 41, row decode/drive circuit 230a includes an NAND circuit 230aa receiving an internal row address signal Ada and an inverter 230ab inverting a signal output from NAND circuit 230aa for transmission onto word line WLa. Row decode/drive circuit 230b includes an NAND circuit 230ba receiving a row address signal Adb and an inverter 230bb inverting a signal output from NAND circuit 230ba for transmission onto word line WLb. Row decode/drive circuits 230a and 230b are each constituted of the NAND circuit and the inverter. Circuits 230a and 230b merely differ from each other in the point of receiving different address signals. Therefore, the same circuit pattern is repeatedly arranged in the column direction in each of row decoders.drivers 222a–222m.

NAND circuits 230aa and 230ba each are an NAND type decode circuit, and inverters 230ab and 230bb each are an inverter type word line drive circuit. As for a configuration of the word line drive circuit, a configuration for driving a corresponding word line to a selected state according to a predecode signal or any other configuration may be employed. In any case, each row decode/drive circuit has the same circuit configuration and the same layout pattern.

Figure 42:
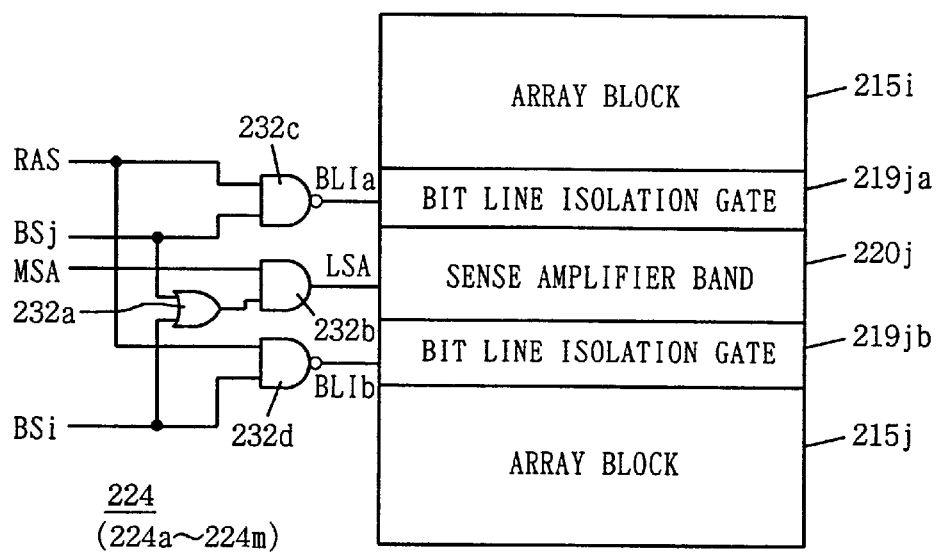
FIG. 42 shows one example of a configuration of a sense control circuit illustrated in FIG. 40.

FIG. 42 shows one example of a configuration of each of sense control circuits 224b–224m illustrated in FIG. 40. FIG. 42 representatively shows a configuration of a sense control circuit 224 for sense amplifier band 220j placed corresponding to array blocks 215i and 215j. Between sense amplifier band 220j and array block 215i, a bit line isolation gate 219ja for connection/isolation of a bit line pair of array block 215i and a sense amplifier included in sense amplifier band 220j is provided. A bit line isolation gate 219jb is arranged between sense amplifier band 220j and array block 215i. Bit line isolation gates 219ja and 219jb have the same circuit configuration.

Sense control circuit 224 (224b–224m) includes an OR circuit 232a receiving array block designation signals BSi and BSj, an AND circuit 232b receiving a signal output from OR circuit 232a and main sense amplifier activation signal MSA to output local sense amplifier activation signal LSA to sense amplifier band 220j, an NAND circuit 232c receiving internal row address strobe signal RAS and array block designation signal BSj to output bit line isolation instruction signal BLIa to bit line isolation gate 219ja, and an NAND circuit 232d receiving internal row address strobe signal RAS and array block designation signal BSi to output bit line isolation instruction signal BLIb to bit line isolation gate 219jb.

Array block designation signals BSi or BSj is driven to an H level of a selected state when array blocks 215i or 215j includes selected word lines. Internal row address strobe signal RAS attains the H level at the start of a memory cycle, and is at an L level in a standby state. Main sense amplifier activation signal MSA is driven into an activation state of the H level at a prescribed timing after the memory cycle starts.

According to the configuration of sense control circuit 224, in the standby state, internal row address strobe signal RAS is at the L level, bit line isolation instruction signals BLIa and BLIb output by NAND circuits 232c and 232d are at the H level, so that a sense amplifier included in sense amplifier band 220j is connected to a corresponding bit line pair in each of array blocks 215i and 215j.

When the memory cycle starts, internal row address strobe signal RAS rises to the H level. When array block 215i includes a selected word line, array block designation signal BSi is driven to the H level, bit line isolation instruction signal BLIb goes down to the L level, bit line isolation gate 219jb is set to a non-conductive state, and array block 215j is isolated from sense amplifier band 220j. On the other hand, array block designation signal BSj is at the L level, bit line isolation instruction signal BLa maintains the H level, bit line isolation gate 219ja maintains a conductive state, and array block 215i is connected to sense amplifier band 220j.

According to the configuration of sense control circuit 224, gate circuits having the same configuration are arranged for respective sense amplifier bands and bit line isolation gates. The only difference is a supplied array block designation signal. Accordingly, in row-related array circuits 204ab–204db shown in FIG. 39, components having the same circuit pattern (or circuits having the same configuration) are repeatedly arranged in the column direction. If the number of array blocks of the memory array in the configuration shown in FIG. 40 is increased, the sense amplifier band, the sense control circuit and the row decoder.driver are repeatedly arranged in the column direction. In this case, interconnection-dedicated regions 210a and 210b are arranged between row-related array circuits 204ab and 204bb, and between row-related array circuits 204cb and 204db. Only an interconnection line and a decoupling capacitor are placed in each of interconnection-dedicated regions 210a and 210b, and no control circuit for internal circuit control is arranged therein. Therefore, the storage capacity of the memory array can be easily increased just by extending the signal interconnection line in the column direction.

Figure 43:
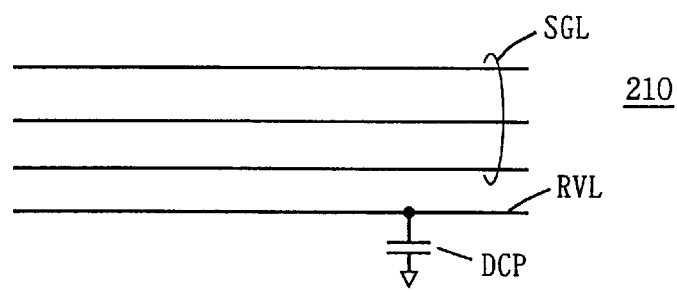
FIG. 43 schematically shows components arranged in an interconnection-dedicated region illustrated in FIG. 39.

FIG. 43 schematically shows a configuration of an interconnection-dedicated region. Referring to FIG. 43, a signal line group SGL formed of signal lines transmitting signals, and a reference voltage transmission line RVL transmitting prescribed voltage are arranged in interconnection region 210 (210a, 210b). A decoupling capacitor DCP for reducing noises is connected to reference voltage transmission line RVL. Signal line group SGL includes signal lines transmitting an address signal and a control signal. Reference voltage transmission line RVL includes transmission lines transmitting a power supply voltage, ground voltage, an internal high voltage higher than the supply voltage, an intermediate voltage between the supply voltage and the ground voltage, and a negative voltage. No circuit such as a logic circuit carrying out a prescribed processing is provided in interconnection-dedicated region 210. A buffer circuit for buffering a signal may be provided correspondingly to a signal line of signal line group SGL in interconnection-dedicated region 210. Such a buffer circuit just performs waveform shaping of a supplied signal and does not perform any logical processing, so that the buffer circuit does not affect other circuit portion. The buffer circuit is provided just for compensating for attenuation of a signal and may be placed in the interconnection-dedicated region similarly to decoupling capacitor DCP.

In other words, no circuit which processes a supplied signal to affect an operation of any other circuit as a result of the process is provided in the interconnection-dedicated region. In addition, no bonding pad for an external electrical connection is placed in the interconnection-dedicated region 210. If the DRAM is employed as a DRAM macro, the DRAM is integrated formed with other functional blocks (macro) on a semiconductor chip. A bonding pad is appropriately arranged in a suitable region of the semiconductor chip as a substrate, according to a scale of a circuit device implemented by the semiconductor chip.

Figure 44A:
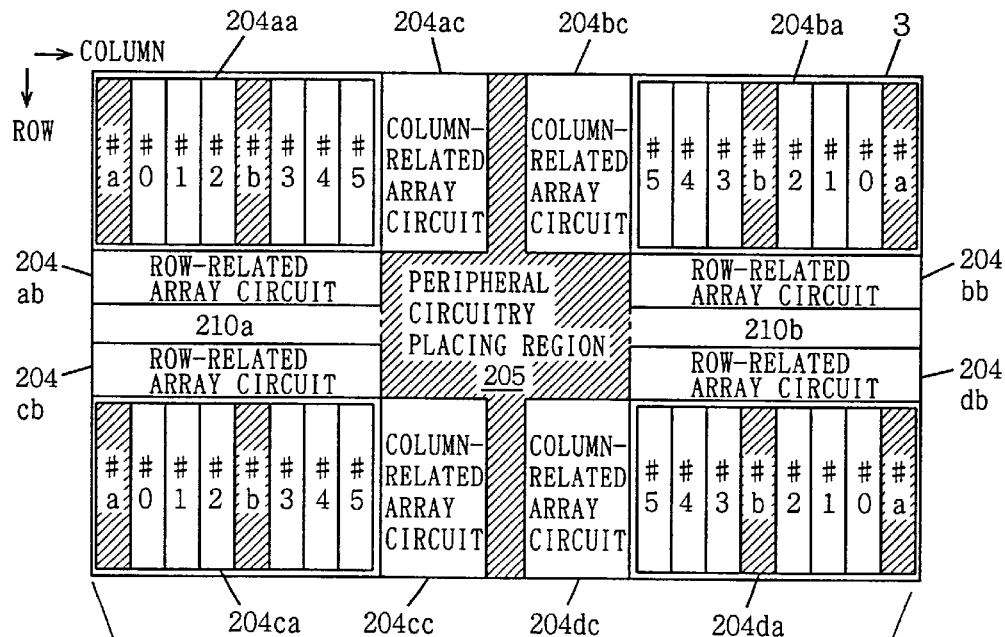
FIG. 44A schematically shows an entire configuration of a semiconductor memory device according to the twelfth embodiment of the invention, and FIG. 44B schematically shows a configuration of the semiconductor integrated circuit device illustrated in FIG. 44A where storage capacity thereof is decreased.
Figure 44B:
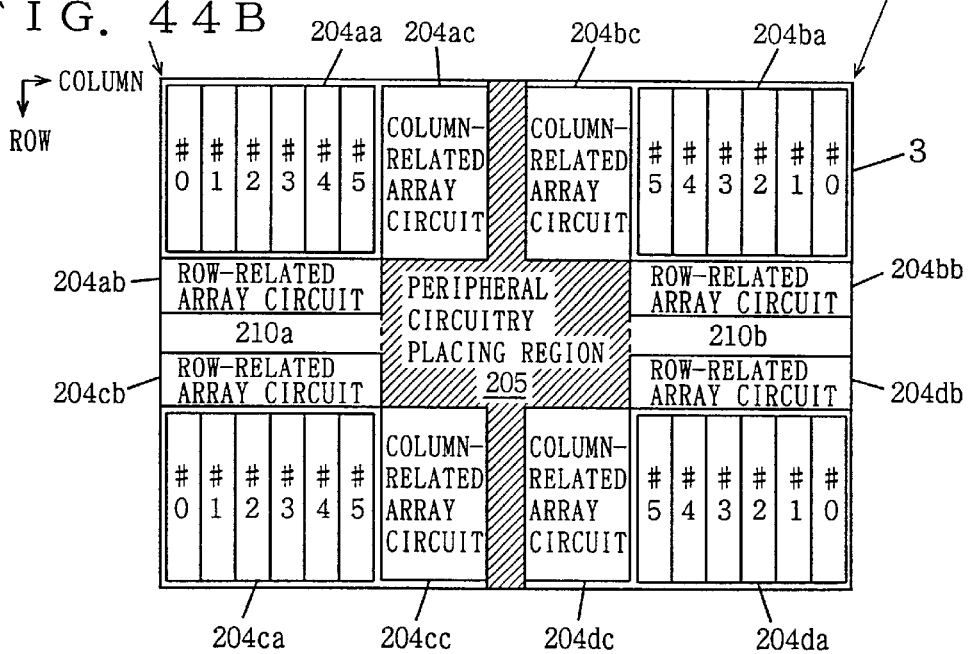

FIGS. 44A and 44B illustrate one example of the way in which storage capacity of a semiconductor memory device is changed. In FIG. 44A, four memory arrays 204aa–204da are arranged in semiconductor integrated circuit device (DRAM macro) 3. Each of memory arrays 204aa–204da is divided into eight array blocks #0–#5, #a and #b. Suppose that the storage capacity is decreased by removing two array blocks #a and #b in each of memory arrays 204aa–204da.

Column-related array circuits 204ac–204dc are respectively provided commonly to array blocks of corresponding memory arrays 204aa–204da. Row-related array circuits 204ab–204db each has circuit portions provided corresponding to respective array blocks as illustrated in FIGS. 41 and 42. Interconnection-dedicated region 210a is arranged between row-related array circuits 204ab and 204cb, and interconnection-dedicated region 210b is arranged between row-related array circuits 204bb and 204db. Peripheral circuitry placing region 205 is arranged in a central region of integrated circuit device 3. If array blocks #a and #b are just removed from each of memory arrays 204aa–204da, circuit portions provided corresponding to these array blocks #a and #b are removed from each of row-related array circuits 204ab–204db. Only the interconnection lines and the decoupling capacitor are arranged in each of interconnection-dedicated regions 210a and 210b, and there is no need to change a circuit arrangement according to elimination of array blocks #a and #b. In this case, the length of interconnection lines is just decreased.

If memory arrays 204aa–204da each includes array blocks #0–#5 as shown in FIG. 44B, the layouts of column-related array circuits 204ac–204dc are not changed. Further, peripheral circuitry arranged in peripheral circuitry placing region 205 is not required to change its arrangement. In this case, just the area of interconnection-dedicated regions 210a and 210b is reduced according to reduction of memory arrays 204aa–204da in the column direction. In row-related array circuits 204ab–204db, circuit portions having the same circuit pattern are removed and there is no need to change the arrangement of an internal circuit portion provided corresponding to each array block. If the storage capacity is to be decreased as shown in FIG. 44A and FIG. 44B, only these circuit portions having a periodic circuit pattern of row-related array circuits 204ab–204db, each of which is a repeated pattern circuit where a circuit pattern is repeatedly arranged in the column direction, are eliminated, in order to decrease the storage capacity, or reduce the number of array blocks.

On the contrary, if the storage capacity is to be increased by changing the semiconductor integrated circuit device shown in FIG. 44B to the one shown in FIG. 44A, just some array blocks and basic circuit blocks each having a repeated pattern in the row-related array circuit are added. In other words, the same circuit pattern is again repeatedly arranged to easily achieve increase in the storage capacity.

As heretofore described, an interconnection-dedicated region is arranged in a region between row-related array circuits placed facing to each other, and the interconnection lines and the decoupling capacitor are exclusively arranged in the interconnection-dedicated region. Consequently, there is no circuit portion having its position changed according to increase/decrease of a capacity of a memory array in the interconnection-dedicated region, so that the storage capacity can be easily increased/decreased. In addition, peripheral circuitry having various circuit patterns is arranged in peripheral circuitry placing region 205. Consequently, the position at which the peripheral circuitry is arranged in peripheral circuitry placing region 205 is not required to be changed according to increase/decrease in the capacity of the memory array. Accordingly, a highly universal DRAM macro can be provided in which increase/decrease in the storage capacity is easily achieved by implementing an optimum arrangement of peripheral circuitry in peripheral circuitry placing region 205.

Where the storage capacity is increased/decreased by increasing/decreasing the size of the memory array in the row direction, an additional configuration is required for selecting an internal read/write circuit in order to fix the number of data bits selected by the column-related array circuit if the number of input/output data bits is fixed. As a result, change of arrangement of circuits is necessary in the peripheral circuitry placing region. The number of data bits selected by the column-related array circuit can be made unchanged by increasing/decreasing the size of the memory array in the column direction (suppose that the number of array blocks simultaneously driven into the selected state is the same). Accordingly, any configuration for modifying the number of input/output data bits is unnecessary in the peripheral circuitry replacing region, so that increase/decrease in the storage capacity can be easily achieved.

Figure 45:
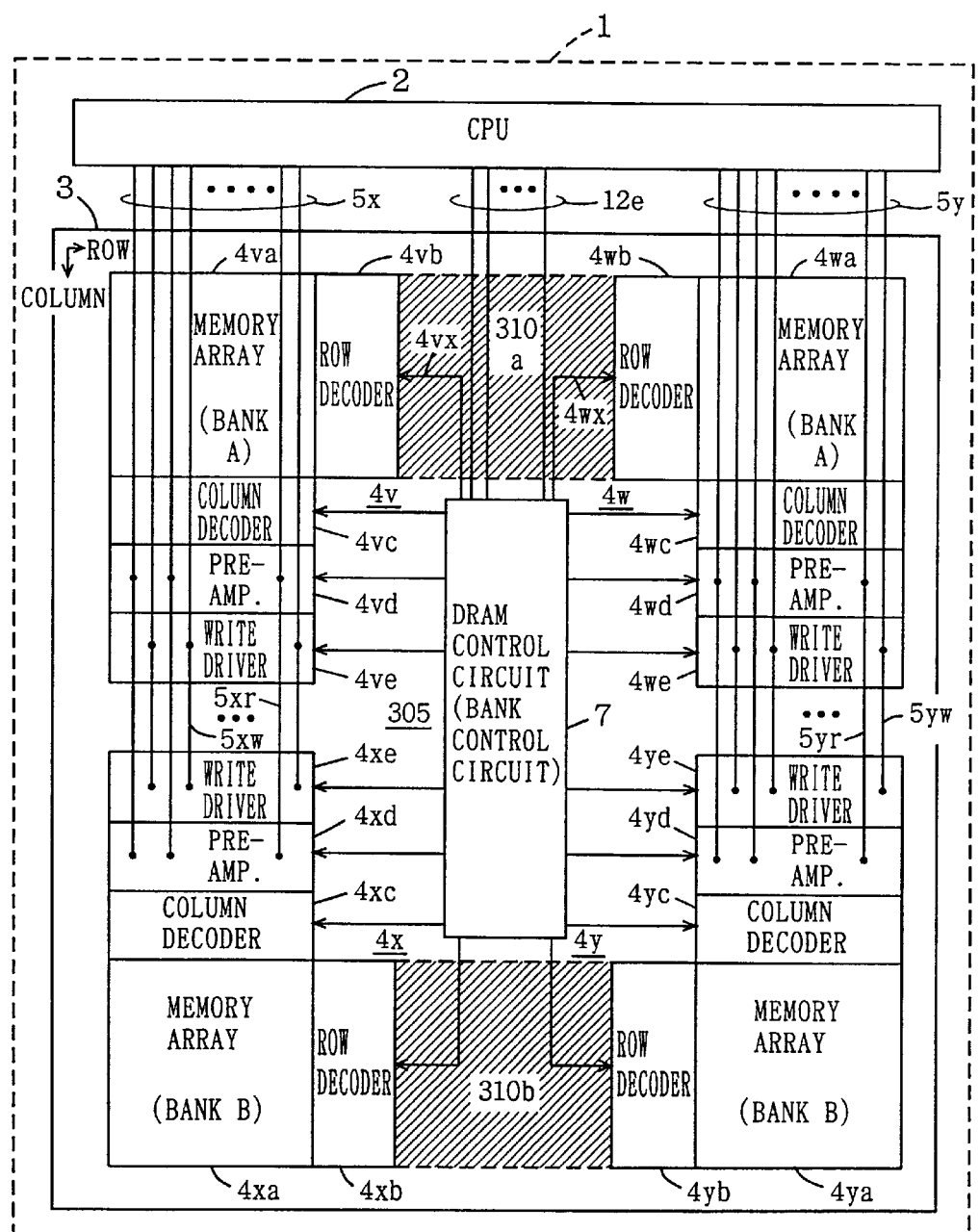
FIG. 45 shows an application of the twelfth embodiment of the invention.

FIG. 45 schematically shows a configuration of the DRAM macro according to the twelfth embodiment of the invention, wherein the DRAM macro is applied to the semiconductor integrated circuit device (DRAM mixed with logic) shown in FIG. 31. In FIG. 45, components corresponding to those configuration of FIG. 31 have the same reference characters and detailed description of those components is not repeated here. According to the configuration illustrated in FIG. 45, an interconnection-dedicated region 310a is arranged between row decoders 4vb and 4wb provided for banks 4v and 4w, and an interconnection-dedicated region 310b is arranged between row decoders 4xb and 4yb for banks 4x and 4y. In a peripheral circuitry replacing region 305, a DRAM control circuit (bank control circuit) 7 is placed in the central region between banks 4v, 4w, 4x and 4y. A circuit which generates an internal high voltage, a negative voltage and the like is also arranged in peripheral circuitry placing region 305.

A bus 12e including an address signal line and a control signal line from a CPU 2 is arranged extending over interconnection-dedicated region 310a, and connected to DRAM control circuit (bank control circuit) 7. Each signal line of address/control signal bus 12e is formed at, for example, a third level aluminum interconnection layer higher than the layer where signal interconnection lines 4vx and 4wx placed between DRAM control circuit (bank control circuit) 7 and row decoders 4vb and 4wb are formed. Consequently, signal interconnection lines for CPU 2 and internal signal interconnection lines for row decoders 4vb and 4wb and the like are never made complicated in interconnection-dedicated region 310a, and signal lines can be easily arranged.

If the storage capacity of semiconductor integrated circuit device 3 which is a DRAM macro is to be increased in the DRAM mixed with logic as shown in FIG. 45, the size of semiconductor integrated circuit device 3 is increased or decreased only in the column direction and the arrangement of the peripheral circuitry including DRAM control circuit (bank control circuit) 7 placed in peripheral circuitry placing region 305 is not changed. Accordingly, a DRAM mixed with logic having an optimum storage capacity can be easily implemented using a DRAM macro registered as a library.

In FIG. 45, row decoders 4vb, 4wb, 4xb and 4yb are shown as row-related array circuits. Memory arrays 4va, 4wa, 4xa and 4ya are each divided into a plurality of array blocks as shown in FIG. 44. A sense amplifier control circuit, a bit line isolation control circuit and the like are arranged corresponding to each array block in a region where the row decoders are placed.

Figure 46:
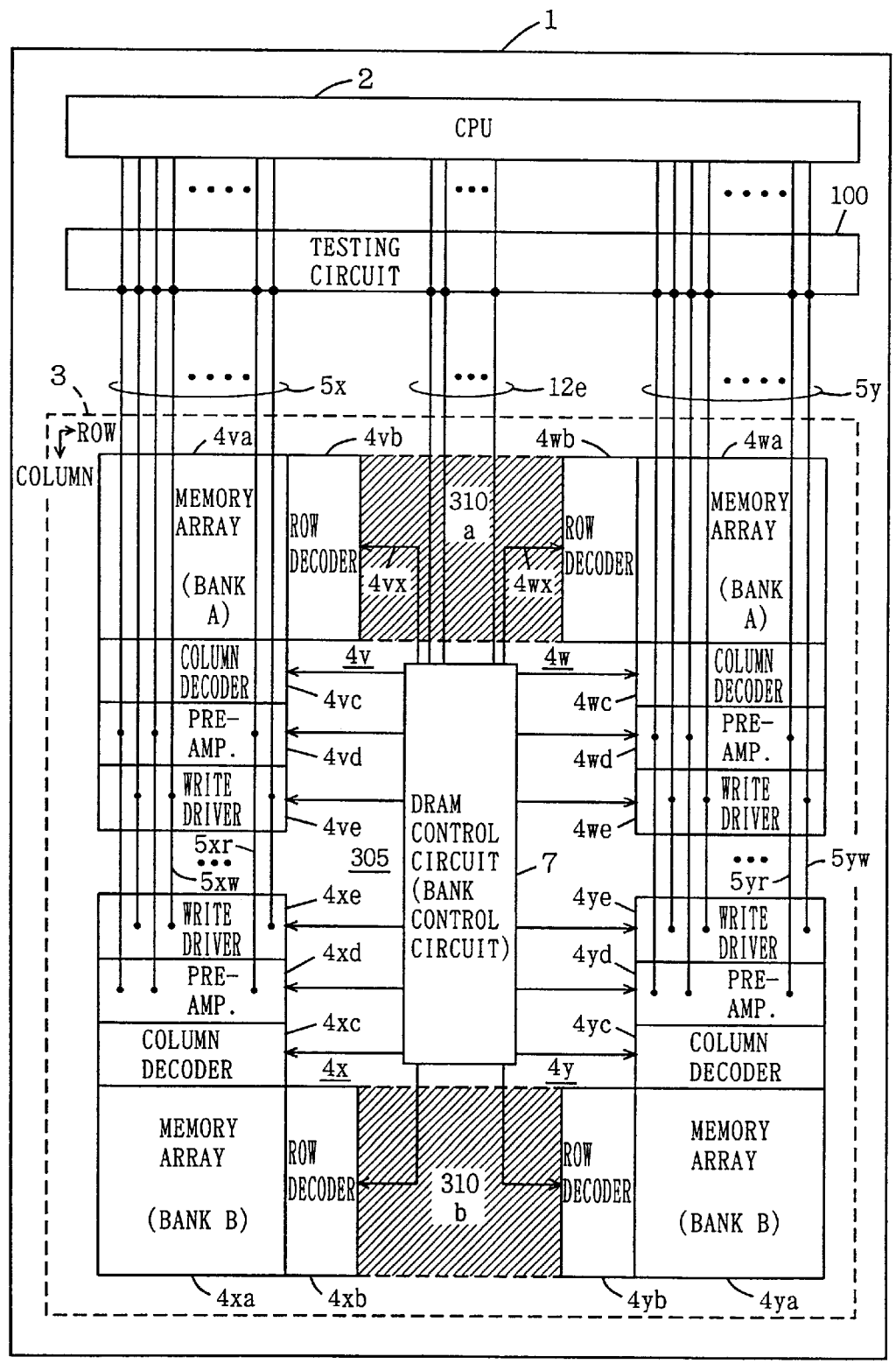
FIG. 46 shows another application of the twelfth embodiment of the invention.

FIG. 46 schematically shows a configuration of the semiconductor integrated circuit device shown in FIG. 33 with the twelfth embodiment of the invention applied thereto. In a semiconductor integrated circuit device 1 illustrated in FIG. 46, a testing circuit 100 is placed between CPU 2 and DRAM macro 3. The configuration of DRAM macro 3 is identical to that shown in FIG. 45. In semiconductor integrated circuit device (DRAM macro) 3 shown in FIG. 46, interconnection-dedicated regions 310a and 310b are arranged between row decoders of respective banks, and DRAM control circuit (bank control circuit) 7 is arranged in remaining peripheral circuitry placing region 305.

If such a testing circuit 100 is contained, bus 12e from CPU 2 is connected to testing circuit 100 and thereafter connected to DRAM control circuit (bank control circuit) 7 via interconnection-dedicated region 310a. Therefore, in semiconductor integrated circuit device 1 containing such a testing circuit 100, the storage capacity of DRAM macro 3 can be increased or decreased by increasing or decreasing the size of the memory array in the column direction utilizing DRAM macro 3 according to the twelfth embodiment of the invention.

Modification

Figure 47:
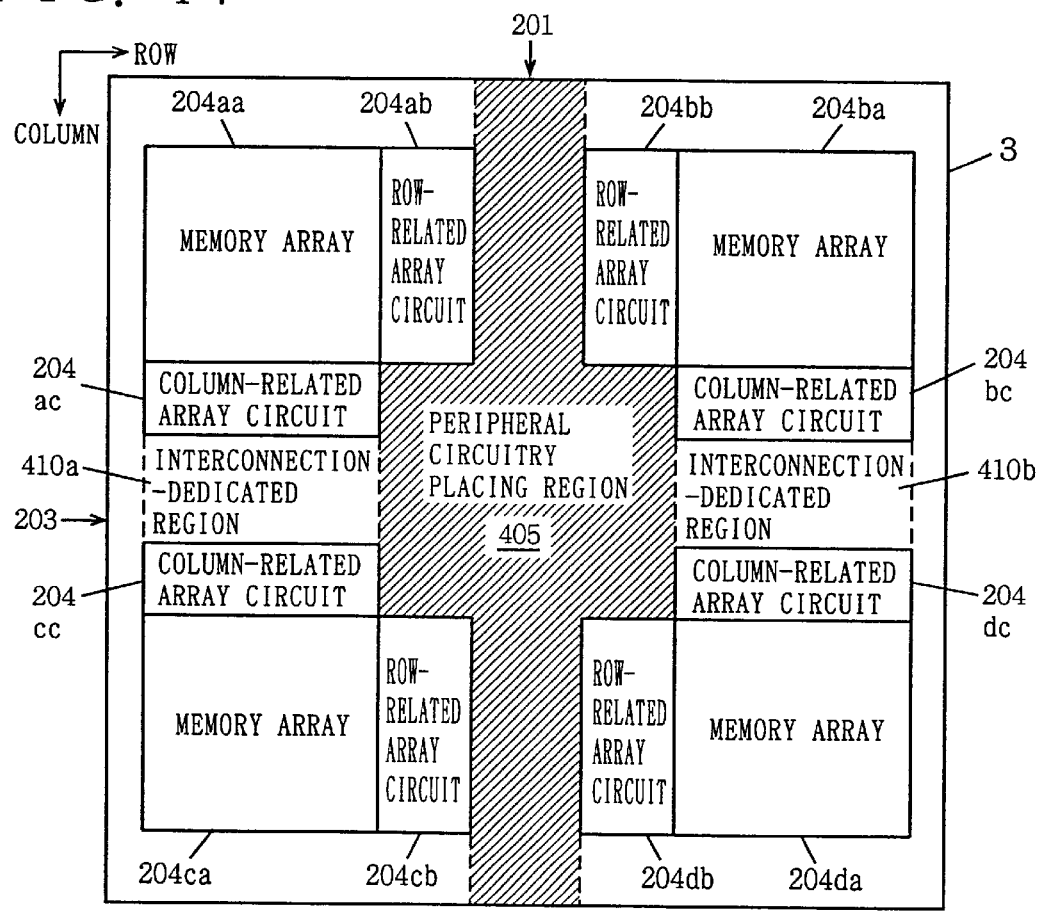
FIG. 47 schematically illustrates a configuration of a modification of the twelfth embodiment of the invention.

FIG. 47 schematically shows a configuration of a modification of the twelfth embodiment of the invention. In FIG. 47, a difference between a shown semiconductor integrated circuit device 3 and the semiconductor integrated circuit device shown in FIG. 39 is as follows.

Specifically, an interconnection-dedicated region 410a is arranged between column-related array circuits 204ac and 204cc placed opposite to each other with respect to the second central region 203, and an interconnection-dedicated region 410b is arranged between column-related array circuits 204bc and 204dc. A peripheral circuitry replacing region is provided in the first central region 201. Interconnection lines and a decoupling capacitor are formed in interconnection-dedicated regions 410a and 410b each as described above, and no circuit for performing a logical processing operation is placed therein.

Figure 48:
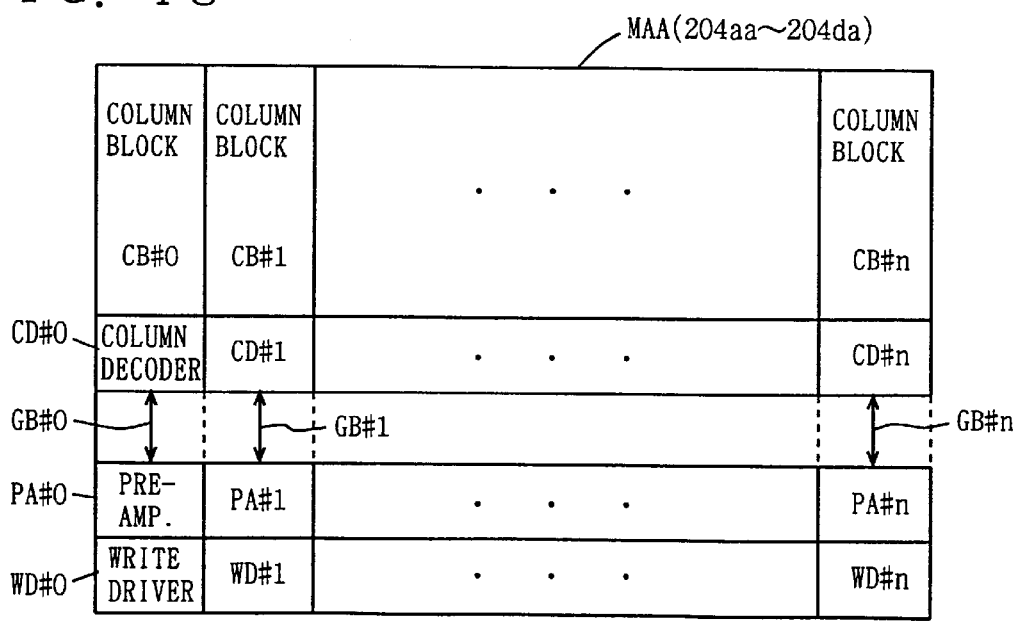
FIG. 48 schematically shows configurations of a memory array and a row-related array circuit illustrated in FIG. 47.

FIG. 48 schematically shows a configuration of column-related array circuits 204ac–204dc. FIG. 48 representatively illustrates a configuration of one column-related array circuit 204. In FIG. 48, a memory array MAA (204aa–204da) is divided into a plurality of column blocks CB#0–CB#n. Each of column blocks CB#0–CB#n share a row. Column decoder blocks CD#0–CD#n, preamplifier blocks PA#0–PA#n, and write driver blocks WD#0–WD#n are provided corresponding to respective column blocks CB#0–CB#n. Preamplifier blocks PA#0–PA#n and write driver blocks WD#0–WD#n are respectively connected to selected columns of corresponding column blocks CB#0–CB#n via internal data buses (global data buses) GB#0–GB#n. Each of preamplifier blocks PA#0–PA#n includes preamplifier circuits of the same number as that of memory cells selected simultaneously in a corresponding column block. Each of write driver blocks WD#0–WD#n also has write drive circuits of the same number as that of memory cells simultaneously selected in a corresponding column block.

Column decoder blocks CD#0–CD#n include the same components, and select a prescribed number of columns in corresponding column blocks CB#0–CB#n.

Figure 49:
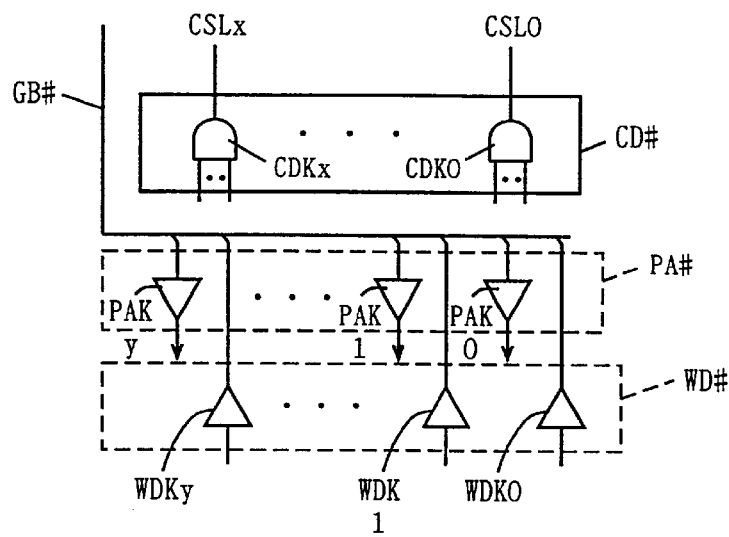
FIG. 49 schematically shows configurations of respective blocks of a column decoder, a preamplifier, and a write driver corresponding to one column block shown in FIG. 48.

FIG. 49 schematically shows a configuration of a column-related array circuit corresponding to one column block. In FIG. 49, a column decoder block CD# (CD#0–CD#n) includes column decode circuits CDK0–CDKx which decode address signals (not shown) and drive corresponding column selection signal lines CSL0–CSLx into a selected state. Column selection signal lines CSL0–CSLx are arranged extending in the column direction in a corresponding column block. In column decoder block CD#, AND type decode circuits are just arranged corresponding to respective column selection signal lines, and the same circuit pattern is repeatedly placed in the row direction.

A preamplifier block PA# includes preamplifier circuits PAK0–PAKy provided corresponding to respective bus lines of a global data bus GB# (GB#0–GB#n). Preamplifier circuits PAK0–PAKy are activated in response to activation of preamplifier activation signal PAE (not shown), and amplify data read on global data bus GB#. Preamplifier circuits PAK0–PAKy also have the same circuit configuration and the same circuit pattern is arranged in the row direction.

A write driver block WD# includes write drive circuits WDK0–WDKy placed corresponding to respective bus lines of global data bus GB# and transmitting internal write data onto corresponding global data bus lines. Write drive circuits WDK0–WDKy are each activated in response to activation of a write drive activation signal (not shown) to execute a data writing operation. These write drive circuits WDK0–WDKy in write driver block WD# have the same circuit configuration, and the same circuit pattern is repeatedly arranged in the row direction.

Accordingly, in the column-related array circuit, the same circuit pattern is repeatedly arranged in the row direction.

Figure 50A:
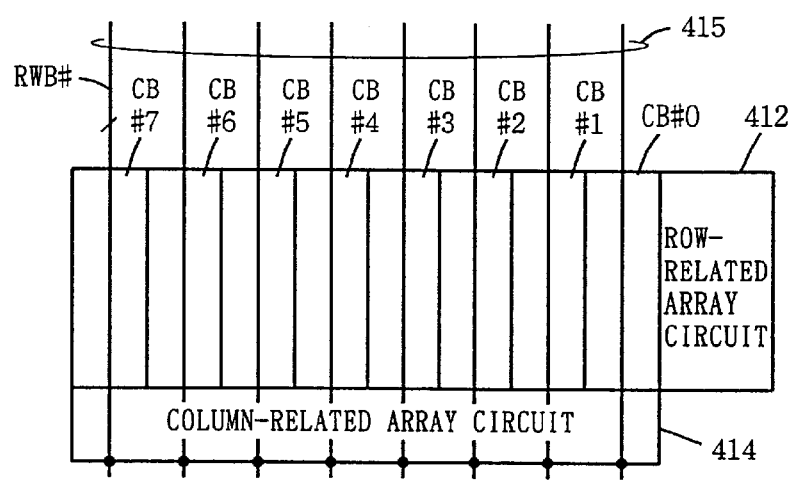
FIGS. 50A and 50B illustrates a manner in which an array size is changed according to the modification of the twelfth embodiment of the invention.

FIG. 50A schematically shows a configuration of one memory array portion. The memory array shown in FIG. 50A corresponds, for example, to memory array 4va or 4wa shown in FIG. 45. The memory array is divided into eight column blocks CB#0–CB#7. A row-related array circuit 412 is commonly provided to column blocks CB#0–CB#7. A column-related array circuit 414 having circuit blocks respectively corresponding to column blocks CB#0–CB#7 is provided to column blocks CB#0–CB#7. A read/write data bus 415 which externally supplies and receives data is arranged in the column direction over the memory array as shown in the configuration of FIG. 31. Regarding read/write data bus 415, a read data bus transferring read data and a write data bus transferring write data may be placed separately. Read/write data bus 415 includes a read/write bus RWB# provided to each of column blocks CB#0–CB#7. Suppose that read/write bus RWB# has a 16-bit width. In this case, 128-bit data is simultaneously transferred in a single memory array.

Figure 50B:
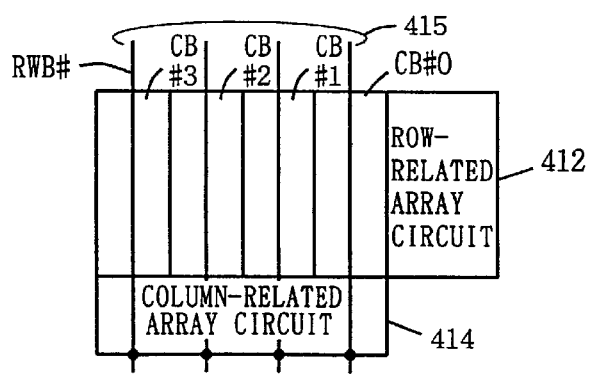

Suppose that the bit width of read/write data bus 415 is reduced from 128 bits to 64 bits. In this case, the number of column blocks is reduced by half as shown in FIG. 50B. Specifically, column blocks CB#4–CB#7 are removed, leaving column blocks CB#0–CB#3 only. In column-related array circuit 414, circuit blocks corresponding to removed column blocks CB#4–CB#7 are also removed. The configuration of row-related array circuit 412 is not changed. In this case, the region adjacent to column-related array circuit 414 is the interconnection-dedicated region as shown in FIG. 47, and any peripheral circuitry having an irregular circuit pattern is not arranged in that region. Therefore, elimination of column blocks and reduction of column-related array circuit 414 can be easily achieved to change the data bus width.

Figure 51:
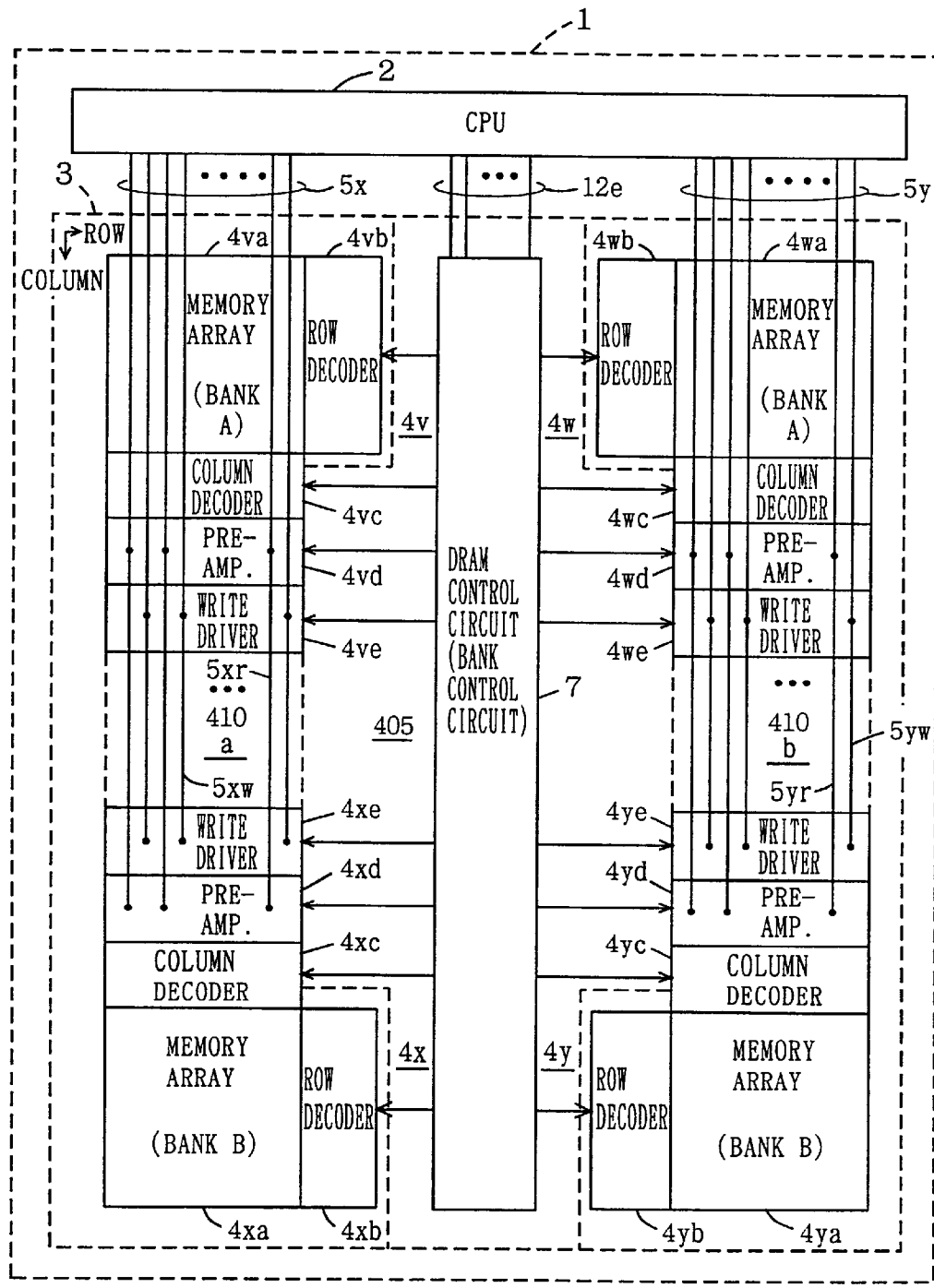
FIG. 51 shows an application of the modification of the twelfth embodiment of the invention.
Figure 52:
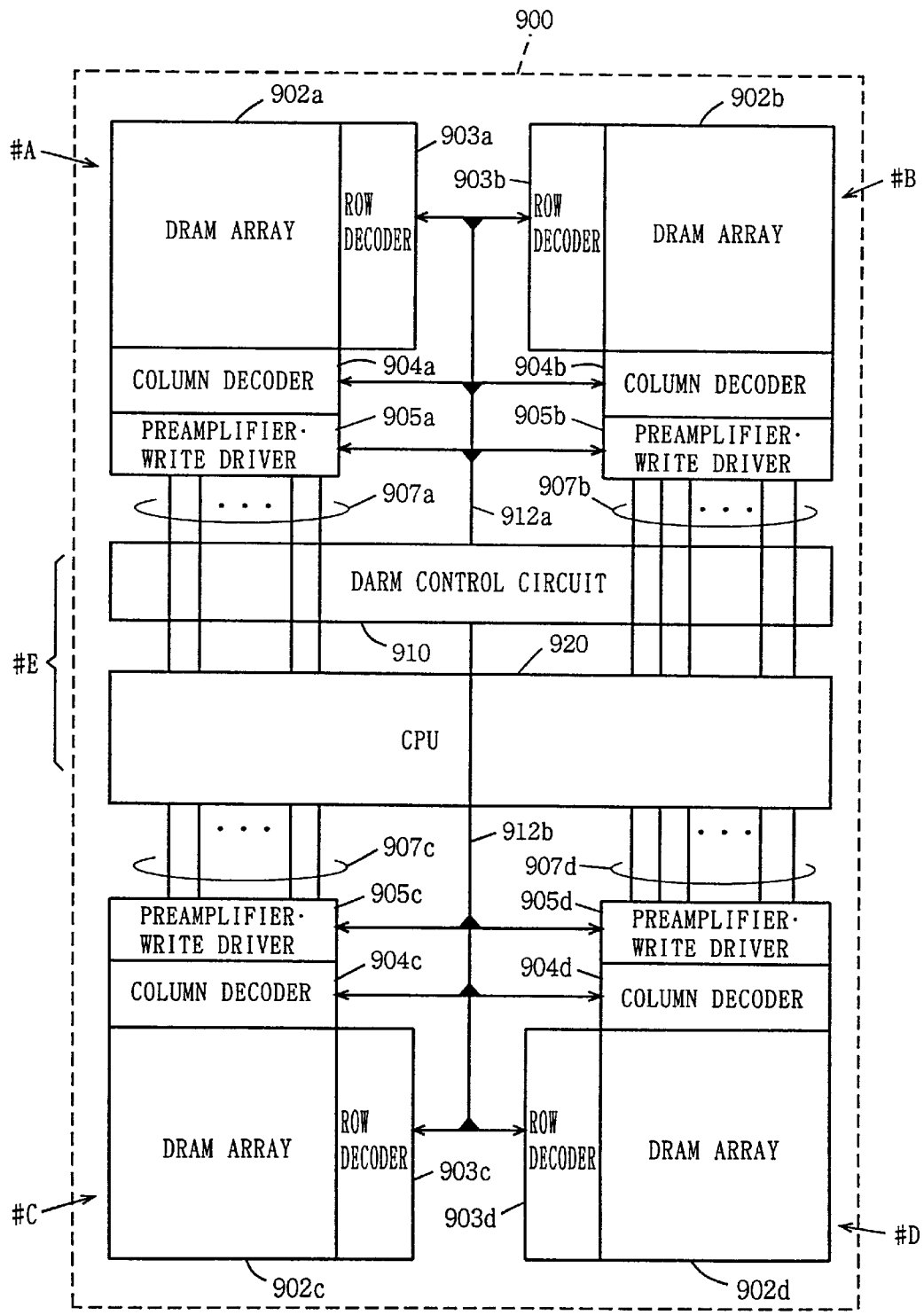
FIG. 52 schematically shows an entire configuration of a conventional semiconductor integrated circuit device.

FIG. 51 shows a configuration of the semiconductor integrated circuit device shown in FIG. 31 with the modification of the twelfth embodiment of the invention applied thereto. In FIG. 51, interconnection-dedicated region 410a is arranged in a region between write drivers 4ve and 4xe included in column-related array circuits of banks 4v and 4x arranged facing to each other in the column direction. Further, interconnection-dedicated region 410b is placed in a region between write driver 4we and 4ye of banks 4w and 4y placed facing to each other.

DRAM control circuit (bank control circuit) 7 is arranged in peripheral circuitry replacing region 405 arranged extending in the column direction.

In the case of the DRAM mixed with logic shown in FIG. 51, data buses 5x and 5y from CPU 2 is arranged extending over memory arrays 4va and 4wa of banks 4v and 4w. When the bus widths of data buses 5x and 5y are changed, the column-related array circuit including the column decoder, the preamplifier and the write driver can be reduced/extended in the row direction to achieve change of the bus widths of data buses 5x and 5y easily.

In the configuration of FIG. 51, signal lines that transmit control signals for DRAM control circuit (bank control circuit) 7 are placed in interconnection-dedicated regions 410a and 410b. Data buses 5x and 5y are formed at the uppermost layer, for example, at the third level aluminum interconnection layer. An internal interconnection layer in interconnection-dedicated regions 410a and 410b is a lower interconnection layer. Therefore, a column-related control signal from DRAM control circuit (bank control circuit) 7 can be transmitted to each bank via interconnection-dedicated region 410a or 410b regardless of the data buses.

In the case of the configuration shown in FIG. 51, DRAM control circuit (bank control circuit) 7 can be arranged extending in the column direction. As a result, there is a sufficient area to allow an internal circuit arrangement therein to be optimized and allow peripheral circuitry to be optimally arranged therein.

Other Applications

The bank described above is constituted of the DRAM. However, the present invention is applicable to a configuration in which data access is made alternatively to two memory arrays coupled commonly to a data bus, and a flash memory or the like can be employed for example. The bank herein described is intended to include a configuration in which activation/inactivation of the array is independently carried out, and a configuration in which data access is made alternatively.

According to the present invention, a control circuit is provided in a prescribed region among a plurality of memory arrays, and an internal data bus commonly connected to a prescribed number of memory arrays of the plurality of memory arrays is arranged in a region different from the region where the control circuit is placed. As a result, there is no crossing of the control circuit and the internal data bus so that an efficient layout of the control circuit is possible and a semiconductor integrated circuit device with reduced occupation area of a chip can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a plurality of banks arranged in a rectangular region and having data access made alternatively thereto;
   bank control circuitry provided in a prescribed region between regions where said plurality of banks are arranged, for controlling at least data access to said plurality of banks, said banks control circuitry including a plurality of bank control circuits provided corresponding to said plurality of banks; and
   an internal access data transmission bus arranged in a region different from the prescribed region where said bank control circuitry is provided, and coupled to each of the banks, for supplying and receiving data.

2. The semiconductor integrated circuit device according to claim 1, wherein
   each of said plurality of banks includes
   a memory array having a plurality of memory cells arranged in rows and columns,
   a plurality of sense amplifiers arranged corresponding to said columns respectively for sensing and amplifying potential of a signal on a corresponding column,
   a sense amplifier power supply line arranged over said memory array, for transmitting an operation power supply voltage to said plurality of sense amplifiers,
   a plurality of main power supply lines arranged on both opposing sides opposite to each other of said memory array respectively and each coupled to receive a power supply voltage, for transmitting said power supply voltage to supply the power supply voltage at least to a peripheral circuit for making data access to a corresponding bank, and
   a plurality of sub power supply lines arranged in a layer higher than said sense amplifier power supply line over said memory array and coupled to said plurality of main power supply lines.

3. The semiconductor integrated circuit device according to claim 1, wherein
   said plurality of banks include a plurality of memory arrays arranged on both sides of a first region extending in a first direction on said rectangular region,
   said bank control circuitry is arranged in said first region, and
   said internal access data transmission bus is arranged extending in said first direction in a region between said bank control circuitry and said plurality of memory arrays.

4. The semiconductor integrated circuit device according to claim 3, wherein
   memory arrays belonging to different banks out of the memory arrays are arranged on each of both sides of said first region, and memory arrays belonging to a same common bank are arranged opposite to each other with respect to said first region.

5. The semiconductor integrated circuit device according to claim 3, further comprising a processor arranged in a second region extending between said memory arrays in a second direction perpendicular to said first direction for supplying and receiving data to and from said plurality of banks via said internal access data transmission bus, wherein
   said bank control circuitry includes bank control circuits arranged on both sides of said second region respectively.

6. A semiconductor integrated circuit device comprising:
   a plurality of banks arranged in a rectangular region and having data access made alternatively thereto;
   bank control circuitry provided in a prescribed region between regions where said plurality of banks are arranged, for controlling at least data access to said plurality of banks; and
   an internal access data transmission bus arranged in a region different from the prescribed region where said bank control circuitry is provided and coupled to each of the banks, for supplying and receiving data, wherein
   said plurality of banks include a plurality of memory arrays arranged on both sides of a first region extending in a first direction in said rectangular region,
   said bank control circuitry includes bank control circuits arranged between the memory arrays on each of both sides of said first region, and
   said internal access data transmission bus is arranged extending in said first direction in said first region.

7. The semiconductor integrated circuit device according to claim 6, further comprising a logical processing circuit arranged between said bank control circuits in said first region and connected to said internal access data transmission bus.

8. The semiconductor integrated circuit device according to claim 6, wherein
   memory arrays belonging to a same common bank out of the memory arrays are arranged on each of the both sides of said first region respectively.

9. The semiconductor integrated circuit device according to claim 6, wherein
   opposing memory arrays opposite with respect to said first region out of the memory arrays belong to different banks, and
   said memory arrays opposite with respect to said first region are provided commonly with internal read/write circuitry for supplying and receiving data between a selected memory cell of said opposing memory arrays and said internal access data transmission bus.

10. The semiconductor integrated circuit device according to claim 9, wherein
    memory arrays belonging to a same common bank out of the memory arrays are arranged on each of the both sides of said first region, said internal read/write circuitry includes a plurality of internal read/write circuits provided commonly for each of the opposing memory arrays, and said bank control circuitry includes read/write control circuitry arranged between the internal read/write circuits in said first region, for controlling operation of each of said internal read/write circuits.

11. A semiconductor integrated circuit device comprising:

a plurality of banks arranged in a rectangular region and having data access made alternatively thereto;

bank control circuitry provided in a prescribed reion between regions where said plurality of banks are arranged, for controlling at least data access to said plurality of banks;

an internal access data transmission bus, extending in a first direction to reach two opposite sides of said rectangular region, arranged in a region different from the prescribed region where said bank control circuitry is provided and coupled to each of the banks, for supplying and receiving data, said two opposite sides extending in a second direction perpendicular to said first direction;

a first logical processing circuit arranged on one side of said two opposite sides and connected to said internal access data transmission bus; and a second logical processing circuit arranged opposite to said first logical processing circuit on another side of said two opposite sides and connected to said internal access data transmission bus.

12. A semiconductor integrated circuit device comprising:

a plurality of banks arranged in a rectangular region and having data access made alternatively thereto;

bank control circuitry provided in a prescribed region between regions where said plurality of banks are arranged for controlling at least data access to said plurality of banks;

an internal access data transmission bus extending in a first direction to reach two opposite sides of said rectangular region, arranged in a region different from the prescribed region where said bank control circuitry is provided and coupled to each of the banks, for supplying and receiving, data, said two opposite sides extending in a second direction perpendicular to said first direction;

a logical processing circuit arranged on one side of said two opposite sides and connected to said internal access data transmission bus; and a testing circuit arranged on another side of said two opposite sides and connected to said internal access data transmission bus, for conducting a test for at least said plurality of banks.

13. A semiconductor integrated circuit device comprising:

a plurality of banks arranged in a rectangular region and having data access made alternatively thereto;

bank control circuitry provided in a prescribed region between regions where said plurality of banks are arranged for controlling at least data access to said plurality of banks; and an internal access data transmission bus arranged in a region different from the prescribed region where said bank control circuitry is provided and coupled to each of the banks, for supplying and receiving data, wherein said plurality of banks include a plurality of subbanks that are aligned with each other in a first direction on each of both sides of a first region extending in the first direction, each of said plurality of subbanks includes:

a memory array having a plurality of memory cells arranged in rows and columns, column selection circuitry arranged on one side of said memory array in a direction of extension of the columns for selecting an addressed column, a write circuit arranged adjacent to said column selection circuitry for writing data into a selected memory cell of said memory array, and a read circuit arranged on another side opposite to said one side of said memory array, for reading data from said selected memory cell, and wherein said internal access data transmission bus includes a write data bus commonly coupled to write circuits of the subbanks arranged in alignment with each other in the first direction, and a read data bus commonly coupled to read circuits of the subbanks arranged in alignment with each other in the first direction.

14. A semiconductor integrated circuit device comprising:

a plurality of banks arranged in a rectangular region and having data access made alternatively thereto;

bank control circuitry provided in a prescribed region between regions where said plurality of banks are arranged, for controlling at least data access to said plurality of banks; and an internal access data transmission bus arranged in a region different from the prescribed region where said bank control circuitry is provided and coupled to each of the banks, for supplying and receiving data, wherein each of said plurality of banks includes a memory array having a plurality of memory cells arranged in rows and columns and a write/read circuit for writing and reading of data to and from said memory array, and said internal access data transmission bus is arranged extending over and above said memory array and coupled to said write/read circuit.

15. The semiconductor integrated circuit device according to claim 14, wherein said write/read circuit includes a write circuit for writing internal data and a read circuit for reading internal data, and said internal access data transmission bus includes a write data bus coupled to said write circuit and a read data bus provided separately from said write data bus and coupled to said read circuit.

16. The semiconductor integrated circuit device according to claim 14, wherein said plurality of banks include memory arrays aligned in a direction of extension of said rows and included in a same bank, and said bank control circuitry is arranged in a region extending in a column extending direction between the memory arrays aligned in said direction of extension of said rows.

17. The semiconductor integrated circuit device according to claim 14, wherein said internal access data transmission bus extends in a first direction, the write/read circuits arranged corresponding to the memory arrays arranged aligned along the first direction are all arranged between the corresponding memory arrays, and said internal access data transmission bus is coupled to said write/read circuits in common.

18. A semiconductor integrated circuit device comprising:

a plurality of banks arranged in a rectangular region and having data access made alternatively thereto:

bank control circuitry provided in a prescribed region between regions where said plurality of banks are arranged, for controlling at least data access to said plurality of banks; and an internal access data transmission bus arranged in a region different from the prescribed region where said bank control circuitry is provided and coupled to each of the banks, for supplying and receiving data, a logical processing circuit provided on an outside of said rectangular region and having an output for outputting a signal including data for access to said plurality of banks through said internal access data transmission bus, and a testing circuit provided adjacent to said logical processing circuit on the outside of said rectangular region and coupled to said internal access data transmission bus and outputting a signal for conducting at least a function test for said plurality of banks via an output thereof in accordance with a supplied signal.

19. The semiconductor circuit device according to claim 18, further comprising:

selection circuitry for selecting one of the output of said logical processing circuit and the output of said testing circuit responsive to a test instruction signal; and drive circuitry for transmitting a signal selected by said selection circuitry onto said internal access data transmission bus, wherein said internal access data transmission bus includes a bus for transferring data and a bus for transferring a control signal for making an access to the banks.

20. A semiconductor integrated circuit device comprising:

a plurality of banks arranged in a rectangular region and having data access made alternatively thereto:

bank control circuitry provided in a prescribed region between regions where said plurality of banks are arranged for controlling at least data access to said plurality of banks; and an internal access data transmission bus arranged in a region different from the prescribed region where said bank control circuitry is provided, and coupled to each of the banks for supplying and receiving data, wherein said plurality of banks include four subbanks respectively arranged in four regions divided by a first region extending in a first direction and a second region extending in a second direction perpendicular to said first direction and crossing said first region;

each of said plurality of subbanks includes:

a memory array having a plurality of memory cells arranged in rows and columns; and an array circuit for performing an operation related to memory cell selection of said memory array under control by said bank control circuitry and, including components of the same circuit pattern repeatedly arranged in said second direction and arranged facing to said second region, said bank control circuitry is arranged in said first region, said second region includes an interconnection-dedicated region placed between array circuits of subbanks arranged opposite to each other with respect to said second region, and having at least an interconnection line for transmitting a signal and voltage for said bank control circuitry dedicatedly placed, and a circuit portion performing a prescribed processing in response to a supplied signal is formed in a region other than said interconnection-dedicated region.

21. A semiconductor device comprising:

a plurality of banks each including:

a memory array having a plurality of memory cells arranged in rows and columns, a plurality of sense amplifiers arranged corresponding to said columns respectively, each for sensing and amplifying a signal on a corresponding column, a sense amplifier power supply line arranged over said memory array, for transmitting an operation power supply voltage to said plurality of sense amplifiers, a plurality of main power supply lines arranged on both opposing sides opposite to each other of said memory array respectively and each coupled to receive a power supply voltage, for transmitting said power supply voltage to supply the power supply voltage at least to a peripheral circuit for making data access to a corresponding bank, and a plurality of sub power supply lines arranged in a layer higher than said sense amplifier power supply line over said memory array and coupled to said plurality of main power supply lines.

22. The semiconductor device according to claim 21, wherein each of said plurality of banks further includes another main power supply line coupled to the main power supply lines arranged on said opposing sides, and constituting a main power supply line having, a U shape in association therewith.

23. A semiconductor integrated circuit device comprising:

a plurality of memory arrays arranged facing a first region placed extending in a first direction and a second region placed extending in a second direction perpendicular to said first direction, each of the memory arrays including a plurality of memoir cells arranged in rows and columns;

an array circuit arranged corresponding to each of said memory arrays and arranged facing said first region, performing an operation related to memory cell selection of a corresponding memory array, and having components of a same pattern repeatedly arranged in said first direction;

a peripheral circuitry region placed in said second region for arranging peripheral circuitry including at least a control circuit for controlling an operation of said array circuit; and an interconnection-dedicated region arranged in said first region between array circuits of memory arrays placed opposite to each other with respect to said first region, and having at least an interconnection line for transmitting a signal and voltage for said control circuit arranged exclusively.

* * * * *

UNITED STATES PATENT AND TRADEMARK OFFICE
CERTIFICATE OF CORRECTION

PATENT NO. : 6,310,815 B1
DATED : October 30, 2001
INVENTOR(S) : Tadato Yamagata et al.

It is certified that error appears in the above-identified patent and that said Letters Patent is hereby corrected as shown below:

<u>Title page,</u>
Item [*], Notice, replace "This patent issued on a continued prosecution application filed under 37 CFR 1.53(d), and is subject to the twenty year patent term provision of 35 U.S.C. 154(a)(2)." with
-- This patent issued on a request for continued examination application filed under 37 CFR 1.114, and is subject to the twenty year patent term provision of 35 U.S.C. 154(a)(2). --

Signed and Sealed this

Thirtieth Day of April, 2002

Attest:

*Attesting Officer*

JAMES E. ROGAN
*Director of the United States Patent and Trademark Office*